United States Patent
Yamaguchi et al.

(10) Patent No.: US 7,515,656 B2
(45) Date of Patent: Apr. 7, 2009

(54) CLOCK RECOVERY CIRCUIT AND DATA RECEIVING CIRCUIT

(75) Inventors: Hisakatsu Yamaguchi, Kawasaki (JP); Hirotaka Tamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 641 days.

(21) Appl. No.: 10/405,370

(22) Filed: Apr. 3, 2003

(65) Prior Publication Data
US 2003/0198105 A1 Oct. 23, 2003

(30) Foreign Application Priority Data
Apr. 15, 2002 (JP) .............................. 2002-112347
Dec. 26, 2002 (JP) .............................. 2002-377931

(51) Int. Cl.
*H04L 27/00* (2006.01)

(52) U.S. Cl. ................. 375/326; 375/371; 375/373; 375/375; 375/376; 375/355; 327/147; 327/156

(58) Field of Classification Search ................. 375/326, 375/371, 373, 375, 376, 355; 327/147, 156
See application file for complete search history.

(56) References Cited

U.S. PATENT DOCUMENTS

| | | | |
|---|---|---|---|
| 5,699,387 A | 12/1997 | Seto et al. | |
| 5,745,530 A * | 4/1998 | Baek et al. | 375/342 |
| 5,926,053 A * | 7/1999 | McDermott et al. | 327/298 |
| 6,169,436 B1 * | 1/2001 | Marbot | 327/270 |
| 6,259,278 B1 | 7/2001 | Huang | |
| 7,611,744 | 10/2006 | Saze et al. | |

FOREIGN PATENT DOCUMENTS

| EP | 1 063 809 A2 | 12/2000 |
|---|---|---|
| JP | 2002-300142 | 10/2002 |
| JP | 2002-314516 | 10/2002 |

* cited by examiner

*Primary Examiner*—David C Payne
*Assistant Examiner*—Nader Bolourchi
(74) *Attorney, Agent, or Firm*—Arent Fox LLP

(57) ABSTRACT

A clock recovery circuit has a boundary detection circuit detecting a boundary in an input signal in accordance with a first signal, and performs recovery of a clock by controlling the timing of the first signal in accordance with the detected boundary. The clock recovery circuit has a boundary detection timing varying circuit and a variation reducing circuit. The boundary detection timing varying circuit dynamically varies boundary detection timing in the boundary detection circuit by applying a variation to the first signal, and the variation reducing circuit reduces a phase variation occurring in the recovered clock in accordance with the dynamic variation of the boundary detection timing performed by the boundary detection timing varying circuit.

22 Claims, 54 Drawing Sheets

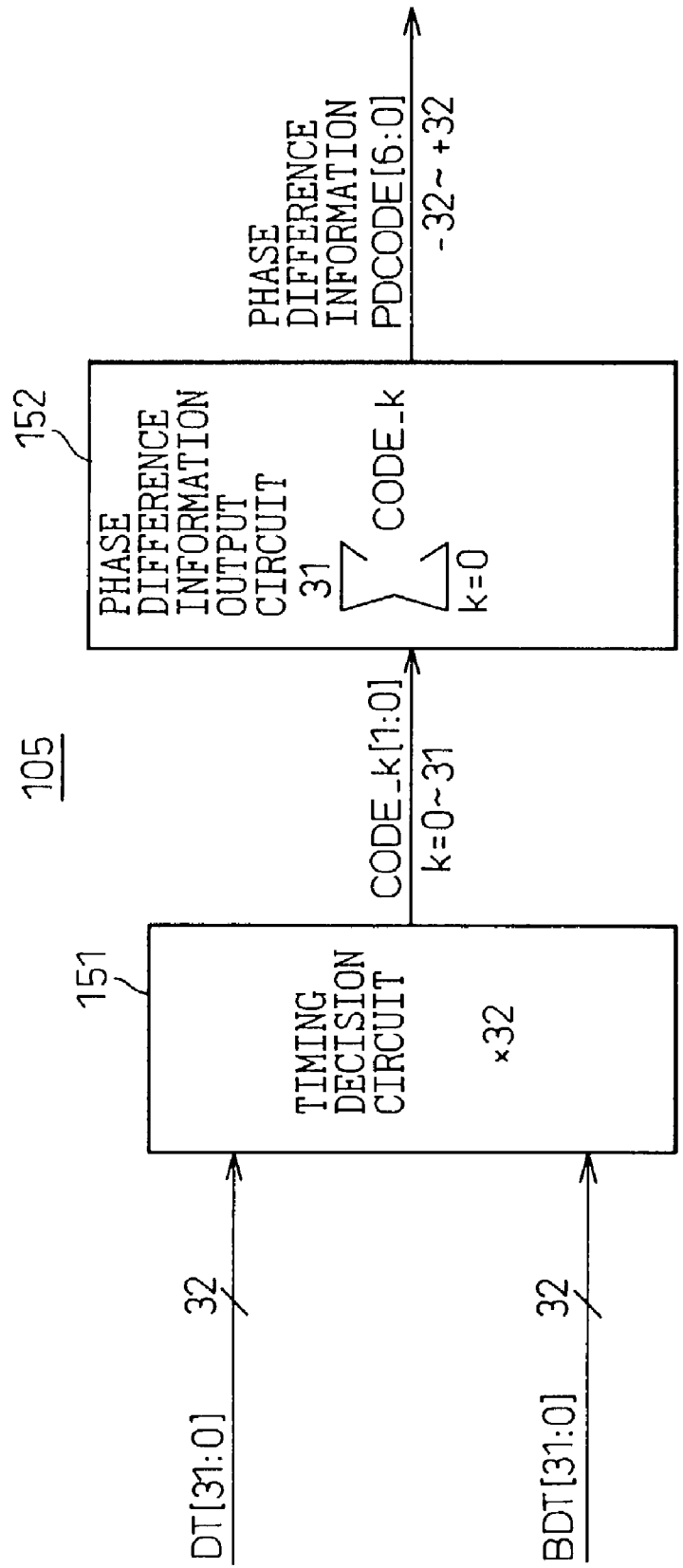

[EARLY]

[LATE]

[NO TRANSITION]

Fig.9

| DATA[i-1] | DATA[i] | BDATA[i] | CODE[i] | |
|---|---|---|---|---|
| 0 | 0 | 0 | 0 | 0 |
| 0 | 0 | 1 | 0 | 0 |
| 0 | 1 | 0 | 1 | 1 |
| 0 | 1 | 1 | 0 | 1 |
| 1 | 0 | 0 | 0 | 1 |
| 1 | 0 | 1 | 1 | 1 |
| 1 | 1 | 0 | 0 | 0 |
| 1 | 1 | 1 | 0 | 0 |

NONLINEAR INPUT/OUTPUT CHARACTERISTIC

STAIRCASE-LIKE INPUT/OUTPUT CHARACTERISTIC

[39.1MHz]

[156.25MHz]

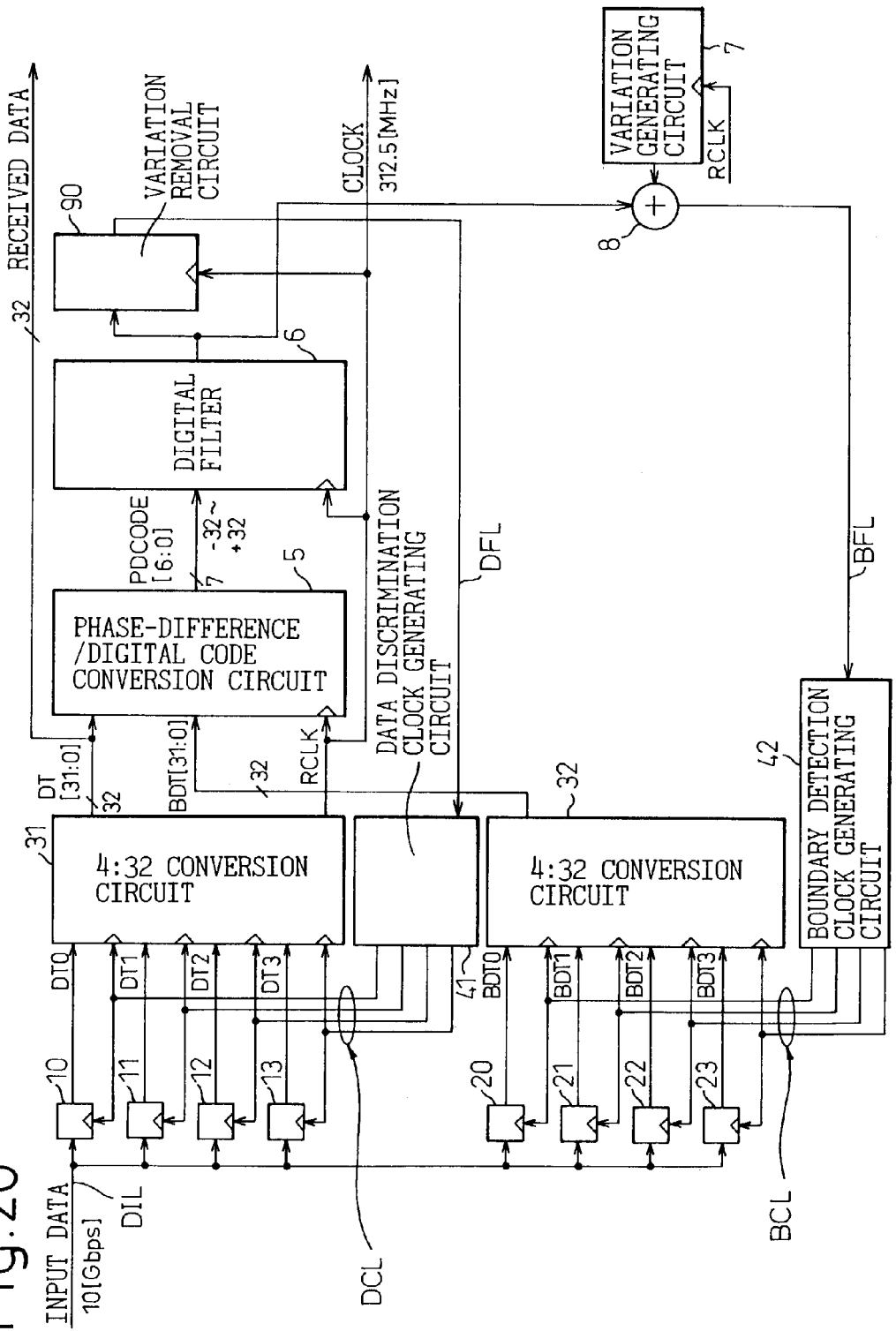

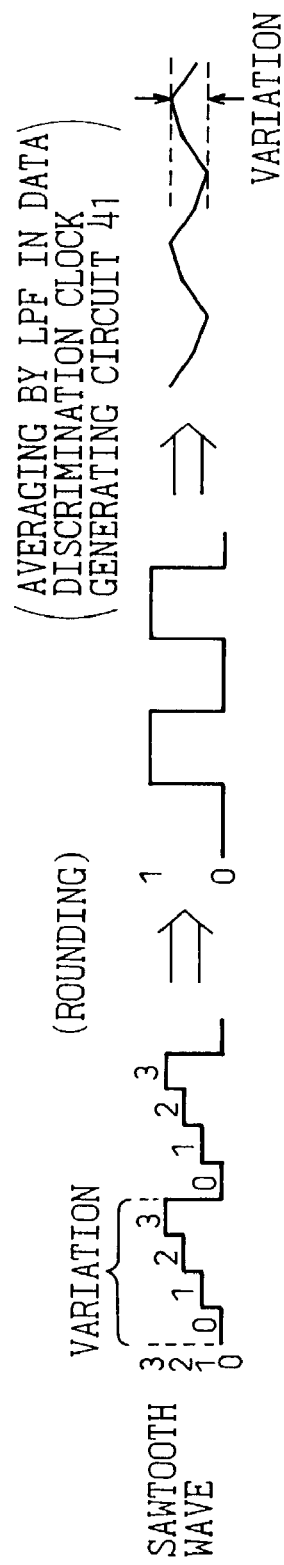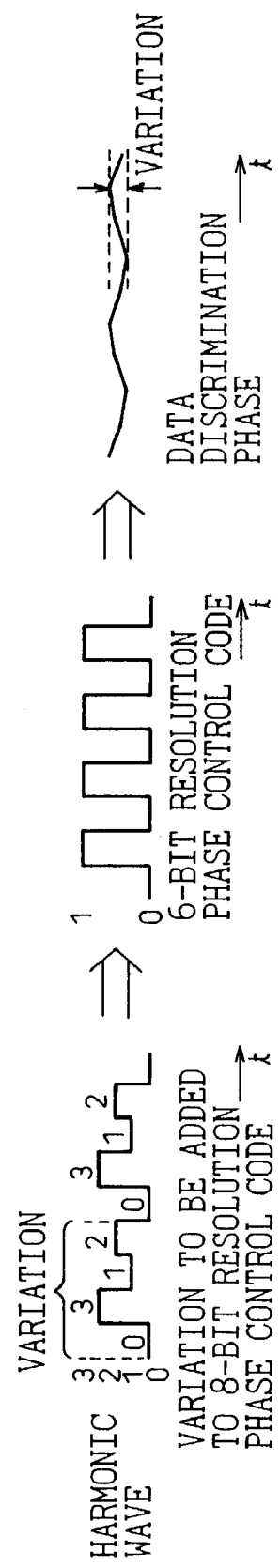

Fig.33

| DT[i-1] | DT[i] | BDT[i] | CMP-CODE[i] | |
|---------|-------|--------|-------------|---|
| 0 | 0 | 0 | 0 | 0 |
| 0 | 0 | 1 | 0 | 0 |
| 0 | 1 | 0 | 1 | 1 |
| 0 | 1 | 1 | 0 | 1 |
| 1 | 0 | 0 | 0 | 1 |
| 1 | 0 | 1 | 1 | 1 |
| 1 | 1 | 0 | 0 | 0 |
| 1 | 1 | 1 | 0 | 0 |

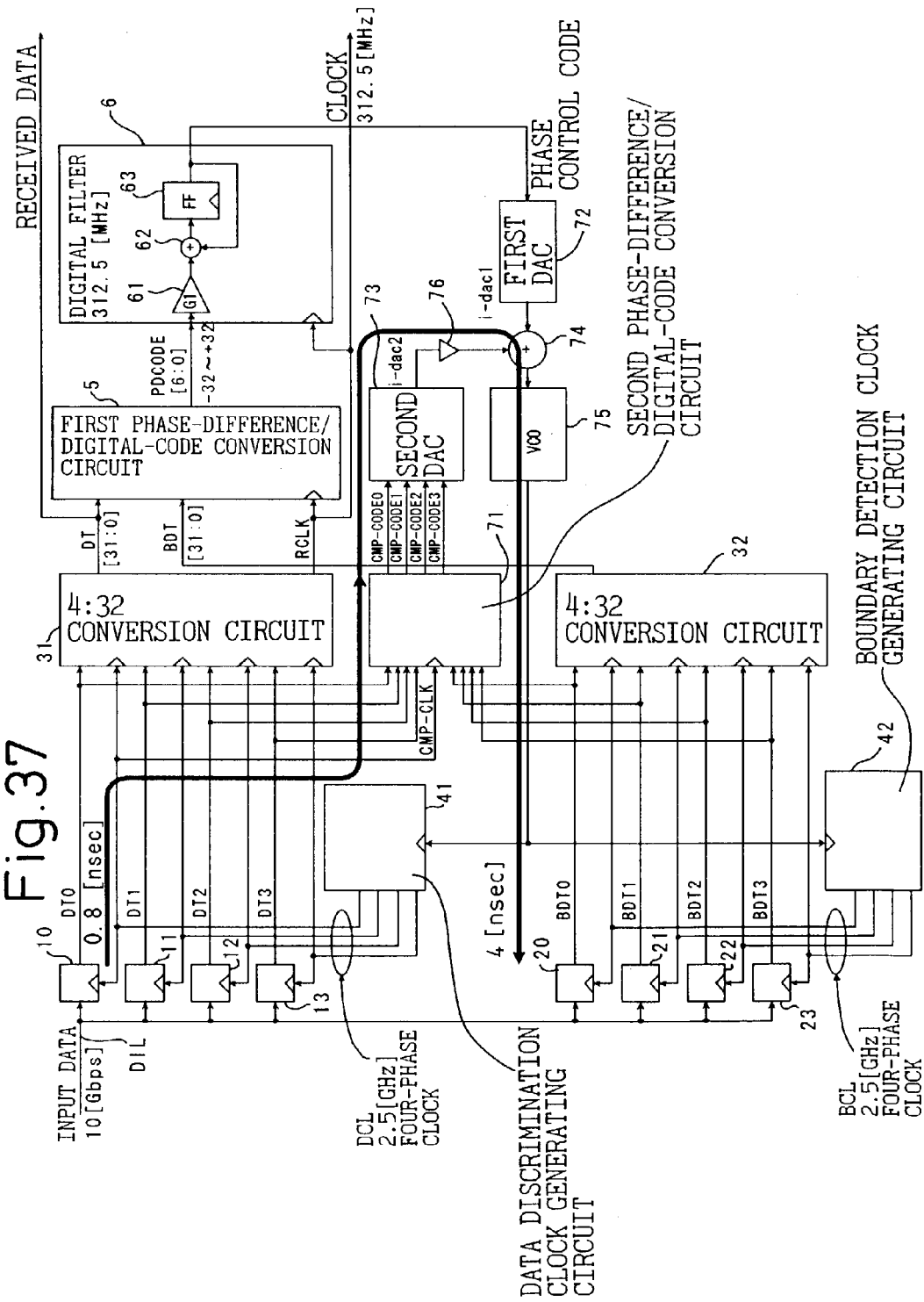

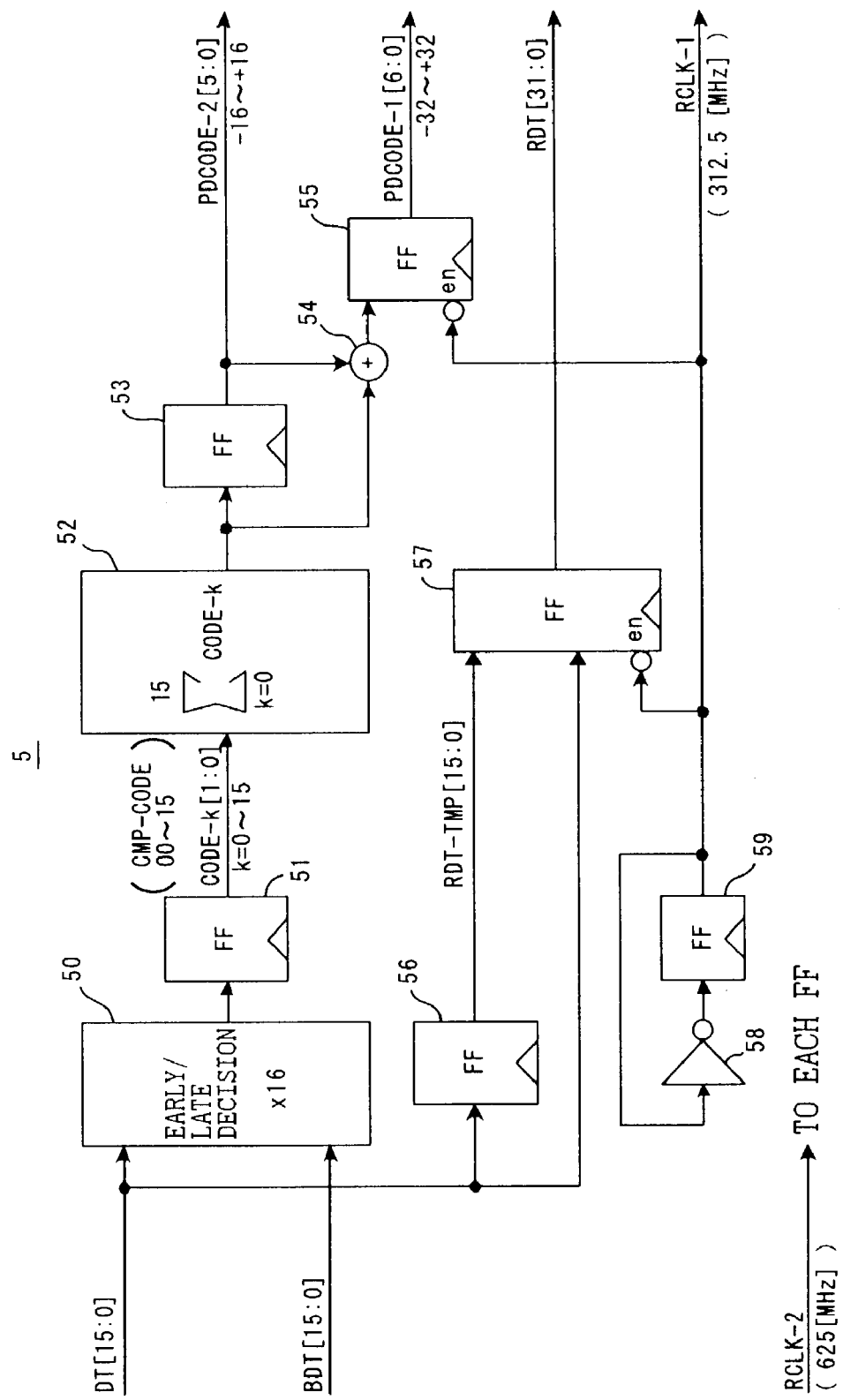

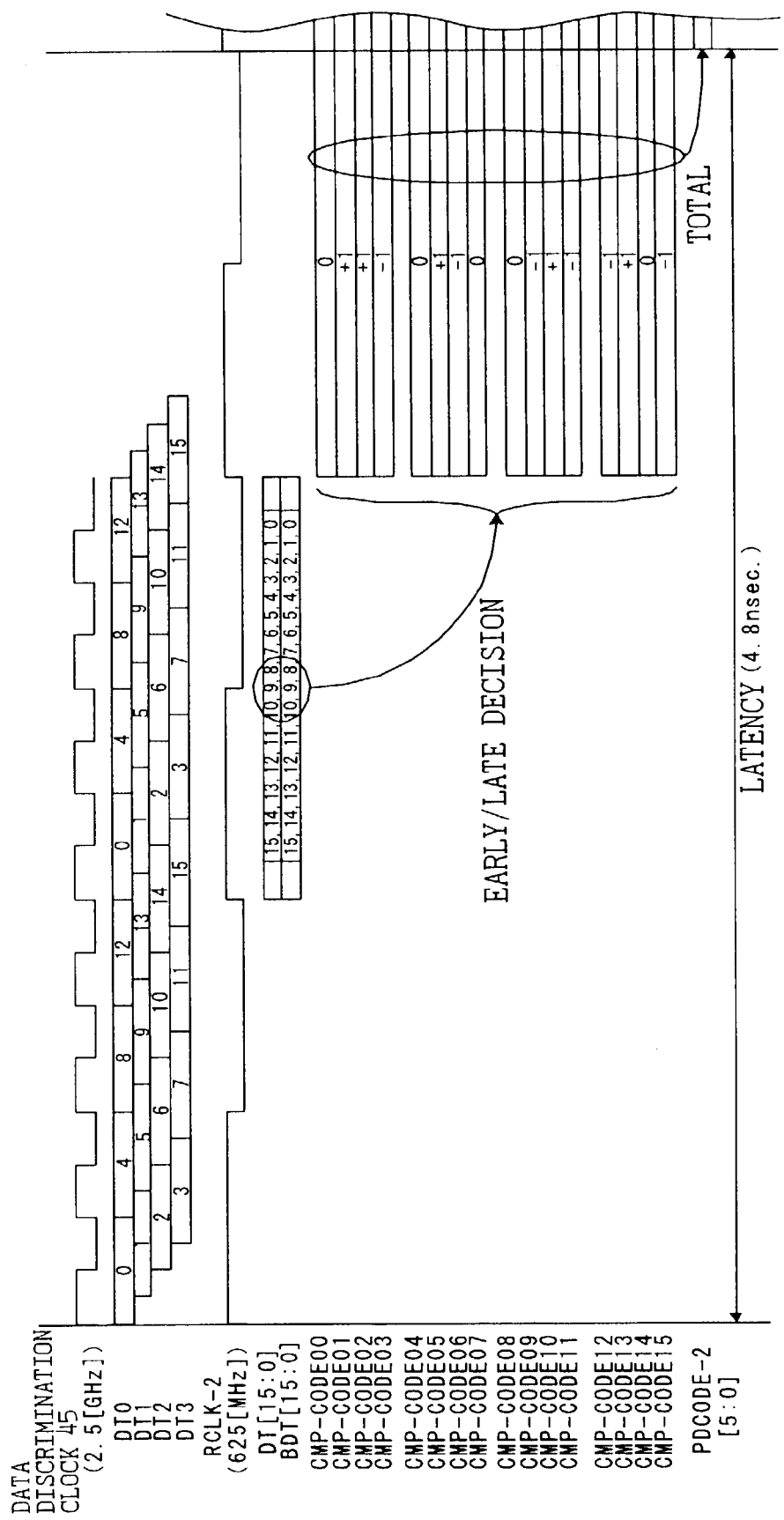

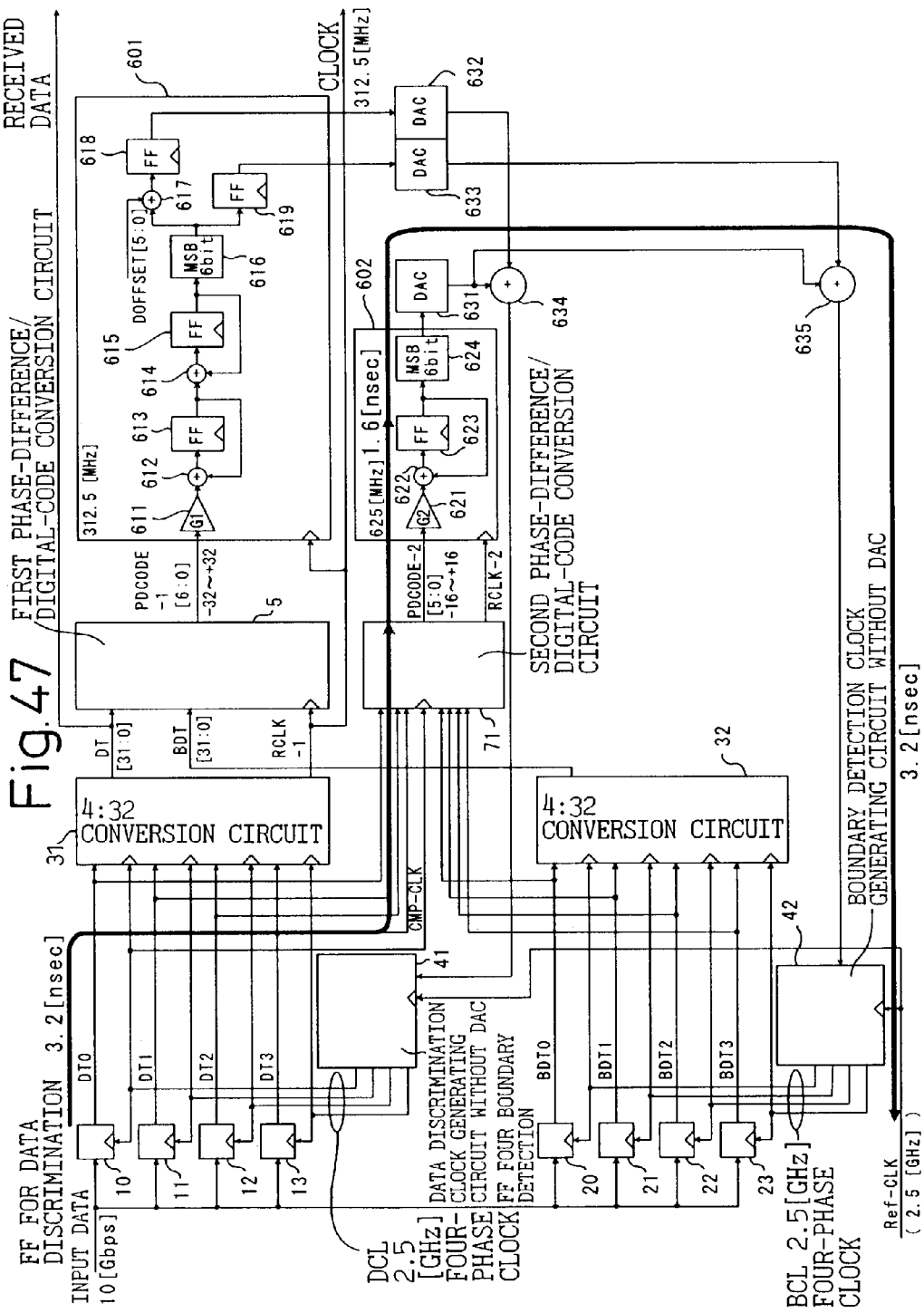

CLOCK RECOVERY CIRCUIT AND DATA RECEIVING CIRCUIT

CROSS REFERENCE TO RELATED APPLICATIONS

This application is based upon and claims the benefit of priority from the prior Japanese Patent Application Nos. 2002-112347 filed on Apr. 15, 2002 and 2002-377931 filed on Dec. 26, 2002, the entire contents of which are incorporated herein by reference.

BACKGROUND OF THE INVENTION

1. Field of the Invention

The present invention relates to a technology for enabling high-speed transmission of signals between a plurality of LSI chips or a plurality of devices or circuit blocks within a single chip, or between a plurality of boards or a plurality of cabinets and, more particularly, to a data receiving circuit and a clock recovery circuit that uses a feedback-loop-type clock signal generating circuit.

2. Description of the Related Art

Recently, the performance of components used in computers and other information processing apparatuses has been greatly improved. In particular, dramatic improvements have been made, for example, in the performance of processors and semiconductor memory devices such as SRAMs (Static Random Access Memories) and DRAMs (Dynamic Random Access Memories). The improvements in the performance of semiconductor memory devices, processors, and the like have come to the point where system performance cannot be improved further unless the speed of signal transmission between components or elements is increased.

Specifically, the speed gap between a storage device such as a SRAM or DRAM (memory) and a processor (i.e., between LSIs), for example, has been widening year by year, and in recent years, this speed gap has been becoming a bottleneck impeding performance improvement for a computer as a whole. Furthermore, with increasing integration and increasing size of semiconductor chips, the speed of signal transmission between elements or circuit blocks within a chip is becoming a major factor limiting the performance of the chip. Moreover, the speed of signal transmission between a peripheral device and the processor/chipset is also becoming a factor limiting the overall performance of the system.

Generally, in high-speed signal transmission between circuit blocks or chips or between cabinets, a clock used to discriminate between data "0" and data "1", is generated (recovered) at the receiving circuit. The recovered clock is adjusted by a feedback circuit in the receiving circuit so that the clock is maintained within a certain phase range with respect to the received signal in order to ensure correct signal reception at all times. The process of recovering the clock and discriminating the data using the thus recovered clock is called the CDR (Clock and Data Recovery). The CDR is the most important function for high-speed data reception, and various schemes are being studied. There is thus a strong need to provide a data receiving circuit (clock recovery circuit) capable of handling high-speed and accurate signal transmission using CDR.

To address the recent increase in the amount of data transmission between LSIs or between boards or cabinets, signal transmission speed per pin must be increased. This is also necessary to avoid an increase in package cost, etc. due to an increased pin count. As a result, inter-LSI signal transmission speeds exceeding 2.5 Gbps have been achieved in recent years, and it is now desired to achieve extremely high speeds (high-speed signal transmission) reaching or even exceeding 10 Gbps.

To speed up the signal transmission between LSIs, for example, it is required that the receiving circuit operates with adequately accurate timing for each incoming signal (for data detection and discrimination). It is known in the prior art to provide in a signal receiver circuit a clock recovery circuit (CDR) that uses a feedback loop type clock signal generating circuit in order to generate a clock (internal clock) with such accurate timing.

Before proceeding to the detailed description of the preferred embodiments of the data receiving circuit (clock recovery circuit) according to the present invention, data receiving circuits according to the prior art and the related art and their associated problems will be described with reference to drawings.

FIG. 1 is a block diagram showing one example of the prior art data receiving circuit, wherein the circuit is configured as a 4-way.times.2 type interleaving circuit using CDR. FIG. 2 is a diagram showing the timing of each signal in the data receiving circuit of FIG. 1.

In FIG. 1, reference numerals 110 to 113 are data discrimination units (flip-flops for data discrimination), 120 to 123 are boundary detection units (flip-flops for boundary detection), and 131 and 132 are data and boundary conversion circuits, respectively. Further, reference numeral 141 is a data discrimination clock generating circuit, 142 is a boundary detection clock generating circuit, 105 is a phase-difference/digital-code conversion circuit (PDC: Phase to Digital Converter), and 106 is a digital filter. On the other hand, reference character DIL is a data input line, DCL is a data discrimination clock line, BCL is a boundary detection clock line, and DFL and BFL are data and boundary feedback lines, respectively.

As shown in FIG. 1, in the prior art data receiving circuit, the data input line DIL which carries, for example, 10-Gbps data is connected to the inputs of the four data discrimination units 110 to 113 and four boundary detection units 120 to 123, which respectively latch the data by their corresponding 2.5-Hz clocks.

More specifically, as shown in FIGS. 1 and 2, the data discrimination units 110 to 113 are supplied with four phase clocks CLKd0 to CLKd3, respectively, from the data discrimination clock generating circuit 141. the clocks being 2.5 GHz in frequency and differing in phase by 90.degree. (for example, the phases are 45.degree., 135.degree., 225.degree., and 315.degree., respectively). The input data are latched with the phase timings of 45.degree., 135.degree., 225.degree., and 315.degree., respectively, and the received data DT0 to DT3 are supplied to the conversion circuit 131. The conversion circuit 131 converts the received data DT0 to DT3, each being one-bit data synchronized to the 2.5-Hz clock, into 32-bit data (DT [31:0]) synchronized to a 312.5 MHz clock, and supplies this received data (DT [31:0]) to the circuit (an internal circuit) at the next stage, as well as to the phase-difference/digital-code conversion circuit 105.

On the other hand, the boundary detection units 120 to 123 are supplied with four phase clocks CLKb0 to CLKb3, respectively, from the boundary detection clock generating circuit 142, the clocks being 2.5 GHz in frequency and differing in phase by 90.degree. (for example, the phases are 0.degree., 90.degree., 180.degree., and 270.degree., respectively). Boundaries of the input data are detected with the chase timings of 0.degree., 90.degree., 180.degree., and 270.degree., respectively, and the boundary detection data BT0 to BT3 are supplied to the conversion circuit 132. The conversion circuit 132 converts the boundary detection data BT0 to BT3, each being one-bit data synchronized to the 2.5-GHz clock, into 32-bit data (BT [31:0]) synchronized to a 312.5 MHz clock, and supplies the thus converted data to the phase-difference/digital-code conversion circuit 105. Here, the four phase clocks CLKd0 to CLKd3 output from the data discrimination clock generating circuit 141 have a chase difference of 45.degree. with respect to the four phase clocks CLKb0 to CLKb3 output from the boundary detection clock generating circuit 142.

The phase-difference/digital-code conversion circuit 105 compares the thus input received-data DT [31:0] and boundary detection data BT[31:0], and outputs 7-bit phase difference information (PDCODE [6:0, −32 to +32]) to the digital filter 106. The digital filter 106 feeds back a 6-bit resolution data discrimination phase control code to the data discrimination clock generating circuit 141 via the feedback line DFL, and also feeds back a 6-bit resolution boundary detection phase control code to the boundary detection clock generating circuit 142 via the feedback line BFL. In FIG. 2, the data latch timings (rise timings) of the boundary detection clocks CLKb0 to CLKb3 are at the boundary positions of the input data; here, the diagram is developed by assuming that the boundary detection data BT0 to BT3 latched by the boundary detection units 120 to 123 are 1, 1, 0, 1, and so on.

FIG. 3 is a block diagram showing the data discrimination clock generating circuit 141 (boundary detection clock generating circuit 142) in the data receiving circuit of FIG. 1.

As shown in FIG. 3, the data discrimination clock generating circuit 141 comprises a mixer circuit 1411 and a digital-to-analog converter (DAC) 1413. The mixer circuit 1411 receives a clock signal (four-phase clock) and an output of the DAC 1413 and, from the four-phase clock, generates a pair of signals differing in phase by 90 degrees and creates a chase intermediate between them. It then generates a clock by adding a phase shift defined by a weight (the output of the DAC 1413) to the signal having the intermediate phase, thus generating the data detection clock CLKd (CLKd0, CLKd1, CLKd2, CLKd3). In like manner, the boundary detection clock generating circuit 142 generates the boundary detection clock CLKb (CLKb0, CLKb1, CLKb2, CLKb3).

The mixer circuit 1411 controls the phase based on an electric current value representing the weight; here, the weight for the phase adjustment is created in the phase-difference/digital-code conversion circuit 105 by digitally comparing the chases of the external input data (or input clock) and internal clock (the data discrimination clock CLKd and boundary detection clock CLKb) based on the outputs of the data discrimination units 110 to 113 and boundary detection units 120 to 123, and is supplied as the phase control code (data discrimination phase control code) to the DAC 1413 through the digital filter 106.

The DAC 1413 receives a constant current as well as the chase control code, converts the phase adjusting weight into an electric current, and supplies the electric current to the mixer circuit 1411. The phase of the clock CLKd (CLKb) is adjusted based on the amount of change of the electric current.

Here, the term "clock recovery circuit (CDR)" is used to focus attention on the fact that the data discrimination clock is recovered from the input signal, while the term "data receiving circuit"-0 is used to focus attention on the fact that the data discrimination circuit, using the recovered clock, discriminates the data carried in the input signal, and outputs the data as the received data.

In the data receiving circuit (clock recovery circuit) shown in FIGS. 1 and 2, if the boundary detection units 120 to 123 used for phase comparison (clock recovery) are constructed from the same circuits as those used to construct the data discrimination units 110 to 113, systematic phase shifting does not occur, so that not only can the clock recovery be achieved with high accuracy, but the sensitivity of the phase comparison can also be enhanced.

FIG. 4 is a diagram showing an example of latch timing for input signal data and boundaries.

In FIG. 4, reference characters DATA [i−2], DATA [i−1], DATA [i], and DATA [i+1], for example, indicate the ideal timings for latching (discriminating) the data by the data discrimination units 110, 111, 112, and 113. while BDATA [i−2], BDATA [i−1], BDATA [i], and BDATA [i+1], for example, indicate the ideal timings for latching (detecting) the boundaries by the boundary detection units 120, 121, 122, and 123.

The prior art and the related art and their associated problems will be described in detail later with reference to the accompanying drawings.

SUMMARY OF THE INVENTION

An object of the present invention is to reduce the amplitude of the limit cycle signal and also reduce the jitter dependence of feedback loop characteristics to improve the predictability of the characteristics, while at the same time, minimizing the phase noise that is caused by the phase modulation for linearization affecting the internal clock. Another object of the present invention is to reduce the quantization noise of the clock by increasing the resolution of the phase control code generating circuit.

According to the present invention, there is provided a clock recovery circuit which includes a boundary detection circuit detecting a boundary in an input signal in accordance with a first signal, and which performs recovery of a clock by controlling the timing of the first signal in accordance with the detected boundary, comprising a boundary detection timing varying circuit dynamically varying boundary detection timing in the boundary detection circuit by applying a variation to the first signal; and a variation reducing circuit reducing a phase variation occurring in the recovered clock in accordance with the dynamic variation of the boundary detection timing performed by the boundary detection timing varying circuit.

The boundary detection timing varying circuit may comprise a variation generating circuit generating the variation; and an adder circuit adding the variation generated by the variation generating circuit to the first signal. The variation generating circuit may generate a triangular wave-like variation changing by increasing or decreasing in staircase fashion over one period of the variation.

The variation generating circuit generates a zigzag wave-like variation changing by increasing and decreasing a plurality of times within one period of the variation. The variation generating circuit may generate a variation over a wide phase range when in an unstable state, and generates a variation over a narrow phase range when in a stable state. The variation generating circuit may generate a variation of large gain when in an unstable state, and may generate a variation of small gain when in a stable state.

The variation generating circuit may generate a variation with increased per-step unit time when in an unstable state, and may generate a variation with reduced per-step unit time when in a stable state. The variation reducing circuit may average signals relevant to the recovered clock over one period or a plurality of periods of the variation being output from the variation generating circuit. The variation reducing circuit may be a notch filter, an FIR filter, or a moving average circuit. The boundary detection circuit may comprise a plurality of boundary detection units, and each of the boundary detection units may detect a boundary in accordance with each boundary detection clock.

Further, according to the present invention, there is provided a clock recovery circuit which includes an internal clock generating circuit generating an internal clock by receiving a first phase control code of a first bit count, comprising a phase control code generating circuit generating a second phase control code of a second bit count which is larger than the first bit count; and an addition processing circuit adding a temporally varying prescribed variation pattern to the second phase control code, and thereby outputting the first phase control code corresponding to the first bit count, wherein the internal clock generating circuit generates the internal clock whose phase is controlled with a resolution equivalent in effect to the second bit count.

The addition processing circuit may add a periodic variation pattern of "0→1→2→3→0→ . . . " to an 8-bit resolution phase control code supplied from the phase control code generating circuit. The addition processing circuit may add a periodic variation pattern of "0→3→1→2→0→ . . . " to an 8-bit resolution phase control code supplied from the phase control code generating circuit. The internal clock generating circuit may comprise a plurality of data discrimination units, and each of the data discrimination units may discriminate data in accordance with each data discrimination clock.

Further, according to the present invention, there is also provided a data receiving circuit comprising a data discrimination circuit discriminating data in an input signal in accordance with a data discrimination clock; a boundary detection circuit detecting a boundary in the input signal in accordance with a boundary detection clock; a phase control code generating circuit generating a phase control code by receiving outputs from the data discrimination circuit and the boundary detection circuit; a boundary detection timing varying circuit dynamically varying boundary detection timing in the boundary detection circuit by applying a variation to the boundary detection phase control code; and a variation reducing circuit reducing a phase variation occurring in the data discrimination clock in accordance with the dynamic variation of the boundary detection timing performed by the boundary detection timing varying circuit.

The boundary detection timing varying circuit may comprise a variation generating circuit generating the variation; and an adder circuit adding the variation generated by the variation generating circuit to the boundary detection phase control code. The phase difference between the input signal data and the data discrimination clock and the gain of a feedback loop may maintain a predefined proportional relationship relative to each other, regardless of the amplitude of the variation generated by the variation generating circuit. The variation generating circuit may be capable of varying the frequency of an output pattern between an initial state and a steady state. The variation generating circuit may generate a triangular wave-like variation changing by increasing or decreasing in staircase fashion over one period of the variation.

The variation generating circuit may generate a zigzag wave-like variation changing by increasing and decreasing a plurality of times within one period of the variation. The variation generating circuit may generate a variation over a wide phase range when in an unstable state, and may generate a variation over a narrow phase range when in a stable state. The variation generating circuit may generate a variation of large gain when in an unstable state, and may generate a variation of small gain when in a stable state. The variation generating circuit may generate a variation with increased per-step unit time when in an unstable state, and may generate a variation with reduced per-step unit time when in a stable state.

The variation reducing circuit may average signals relevant to the recovered clock over one period or a plurality of periods of the variation being output from the variation generating circuit. The variation reducing circuit may be a notch filter, an FIR filter, or a moving average circuit.

In addition, according to the present invention, there is provided a data receiving circuit comprising a data discrimination clock generating circuit generating a data discrimination clock by receiving a first phase control code of a first bit count; a data discrimination circuit discriminating data in an input signal in accordance with the data discrimination clock; a boundary detection circuit detecting a boundary in the input signal in accordance with a boundary detection clock; a phase control code generating circuit generating a second phase control code of a second bit count which is larger than the first bit count, by receiving outputs from the data discrimination circuit and the boundary detection circuit; and an addition processing circuit adding a prescribed variation pattern varying to the second phase control code, and thereby outputting the first phase control code corresponding to the first bit count, wherein the data discrimination clock generating circuit generates the data discrimination clock whose phase is controlled with a resolution equivalent in effect to the second bit count.

The addition processing circuit may add a periodic variation pattern of "0→1→2→3→0→ . . . " to an 8-bit resolution phase control code supplied from the phase control code generating circuit. The addition processing circuit may add a periodic variation pattern of "0→3→1→2→0→ . . . " to an 8-bit resolution phase control code supplied from the phase control code generating circuit. The boundary detection circuit may comprise a plurality of boundary detection units, and each of the boundary detection units may detect a boundary in accordance with each boundary detection clock, and wherein the data discrimination circuit may comprise a plurality of data discrimination units, and each of the data discrimination units may discriminate data in accordance with each data discrimination clock.

According to the present invention, there is provided a clock recovery circuit which includes a boundary detection circuit detecting a boundary in an input signal in accordance with a first signal, and which performs recovery of a clock by controlling the timing of the first signal in accordance with the detected boundary, wherein the clock is recovered by using a plurality of feedback loops having different signal delays.

The plurality of feedback loops may comprise a first feedback loop having a first signal delay; and a second feedback loop having a second signal delay smaller than the first signal delay, and wherein the clock may be recovered by making a phase adjustment based on the sum of outputs of the first and second feedback loops. The clock may be a data discrimination clock to be supplied to a data discrimination circuit for discriminating data in the input signal. A circuit that generates the first signal and a circuit that generates the data discrimination clock may be phase interpolators. The first feedback loop may comprise a conversion circuit which converts an output of the data discrimination circuit from serial format into parallel format for output as received data, and the second feedback loop may bypass the conversion circuit and thereby provides a shorter signal delay than the first feedback loop.

The first signal delay may be larger than the second signal delay, and the second feedback loop may have a higher cutoff frequency than the first feedback loop. The first feedback loop may include a first buffer which provides a first gain coefficient, and the second feedback loop may include a second buffer which provides a second gain coefficient that is different from the first gain coefficient. The first signal delay may be larger than the second signal delay, and the first gain coefficient may be smaller than the second gain coefficient.

The sum of the outputs of the first and second feedback loops may be obtained by adding digital codes. The sum of the outputs of the first and second feedback loops may be obtained by adding analog signals. The addition of the analog signals may be the addition of electric currents.

Further, according to the present invention, there is provided a clock recovery circuit which includes a boundary detection circuit detecting a boundary in an input signal in accordance with a first signal, and which performs recovery of a clock by controlling the timing of the first signal in accordance with the detected boundary, wherein a fixed clock derived from a system reference clock is supplied to a feedback loop for recovering the clock.

The fixed clock may be supplied to a circuit that generates a control signal for adjusting the clock to be recovered. The fixed clock may be derived by dividing the reference clock.

According to the present invention, there is also provided a data receiving circuit comprising a data discrimination circuit discriminating data in an input signal in accordance with a data discrimination clock; a boundary detection circuit detecting a boundary in the input signal in accordance with a boundary detection clock; a phase control code outputting means for outputting a phase control signal by receiving outputs from the data discrimination circuit and the boundary detection circuit; and a clock generating circuit generating the data discrimination clock and the boundary detection clock by receiving the phase control signal, wherein the clock generating circuit generates the data discrimination clock and the boundary detection clock by using a plurality of feedback loops having different signal delays.

The plurality of feedback loops may comprise a first feedback loop having a first signal delay; and a second feedback loop having a second signal delay smaller than the first signal delay, and wherein the clock generating circuit may make phase adjustments to the data discrimination clock and the boundary detection clock, based on the sum of outputs of the first and second feedback loops. The data discrimination circuit may comprise a plurality of data discrimination units; the boundary detection circuit may comprise a plurality of boundary detection units, and the clock generating circuit may comprise a data discrimination clock generating circuit which generates the data discrimination clock to be supplied to the data discrimination units, and a boundary detection clock generating circuit which generates the boundary detection clock to be supplied to the boundary detection units. The data discrimination clock generating circuit and the boundary detection clock generating circuit may be phase interpolators. The first feedback loop may comprise a conversion circuit which converts an output of the data discrimination clock generating circuit from serial format into parallel format for output as received data, and the second feedback loop may bypass the conversion circuit and thereby provides a shorter signal delay than the first feedback loop. The first signal delay may be larger than the second signal delay, and the second feedback loop may have a higher cutoff frequency than the first feedback loop.

The first feedback loop may include a first buffer which provides a first gain coefficient, and the second feedback loop may include a second buffer which provides a second gain coefficient that is different from the first gain coefficient. The first signal delay may be larger than the second signal delay, and the first gain coefficient may be smaller than the second gain coefficient. The sum of the outputs of the first and second feedback loops may be obtained by adding digital codes.

The sum of the outputs of the first and second feedback loops may be obtained by adding analog signals. The addition of the analog signals may be the addition of electric currents.

In addition, according to the present invention, there is provided a data receiving circuit comprising a data discrimination circuit discriminating data in an input signal in accordance with a data discrimination clock; a boundary detection circuit detecting a boundary in the input signal in accordance with a boundary detection clock; a phase control code outputting means for outputting a phase control signal by receiving outputs from the data discrimination circuit and the boundary detection circuit; and a clock generating circuit generating the data discrimination clock and the boundary detection clock by receiving the phase control signal, and wherein a fixed clock derived from a system reference clock is supplied to a feedback loop for generating the data discrimination clock and the boundary detection clock.

The fixed clock may be supplied to the phase control code outputting means. The fixed clock may be derived by dividing the reference clock.

BRIEF DESCRIPTION OF THE DRAWINGS

The present invention will be more clearly understood from the description of the preferred embodiments as set forth below with reference to the accompanying drawings, wherein:

FIG. 7 is a block diagram showing one example of a phase-difference/digital-code conversion circuit in the data receiving circuit of FIG. 5;

FIG. 9 is a diagram for explaining phase difference information that the phase-difference/digital-code conversion circuit shown in FIG. 7 outputs;

FIG. 20 is a block diagram showing another embodiment of the data receiving circuit according to the present invention;

FIGS. 23A and 23B are diagrams each showing an example of a variation added to a data discrimination phase control code in the data receiving circuit of FIG. 21;

FIG. 33 is a diagram for explaining phase difference information that the phase-difference/digital-code conversion circuit shown in FIG. 31 outputs;

FIG. 37 is a diagram for explaining latency in the data receiving circuit of FIGS. 30A and 30B;

FIG. 39 is a block diagram showing one example of the phase-difference/digital-code conversion circuit in the data receiving circuit of FIGS. 38A and 38B;

FIG. 40 is a diagram (part 1) for explaining latency in the data receiving circuit of FIGS. 38A and 38B;

FIG. 47 is a diagram for explaining latency in the data receiving circuit of FIGS. 46A and 46B.

DESCRIPTION OF THE PREFERRED EMBODIMENTS

Figure 5:
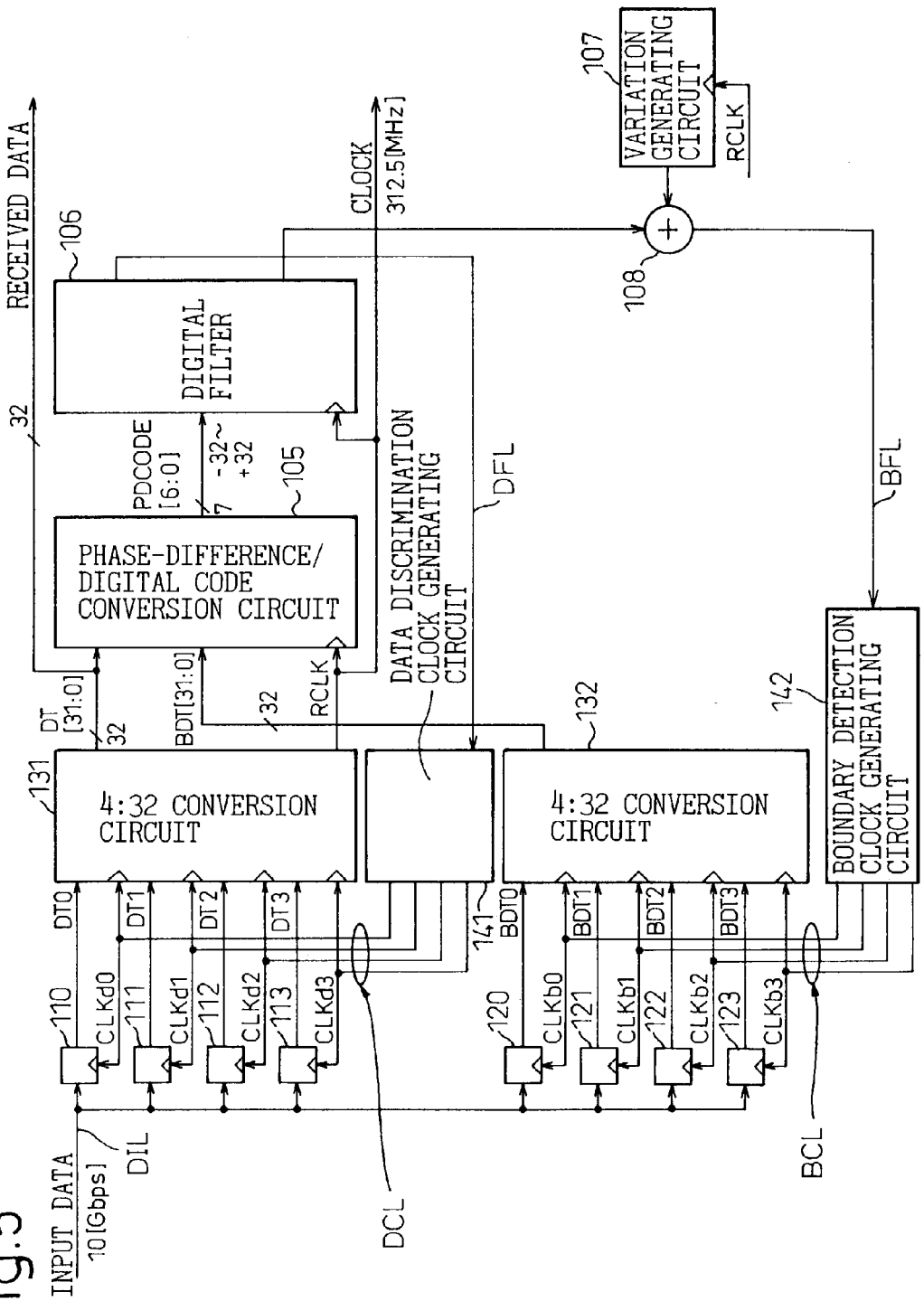
FIG. 5 is a block diagram showing one example of a data receiving circuit according to the related art.
Figure 6:
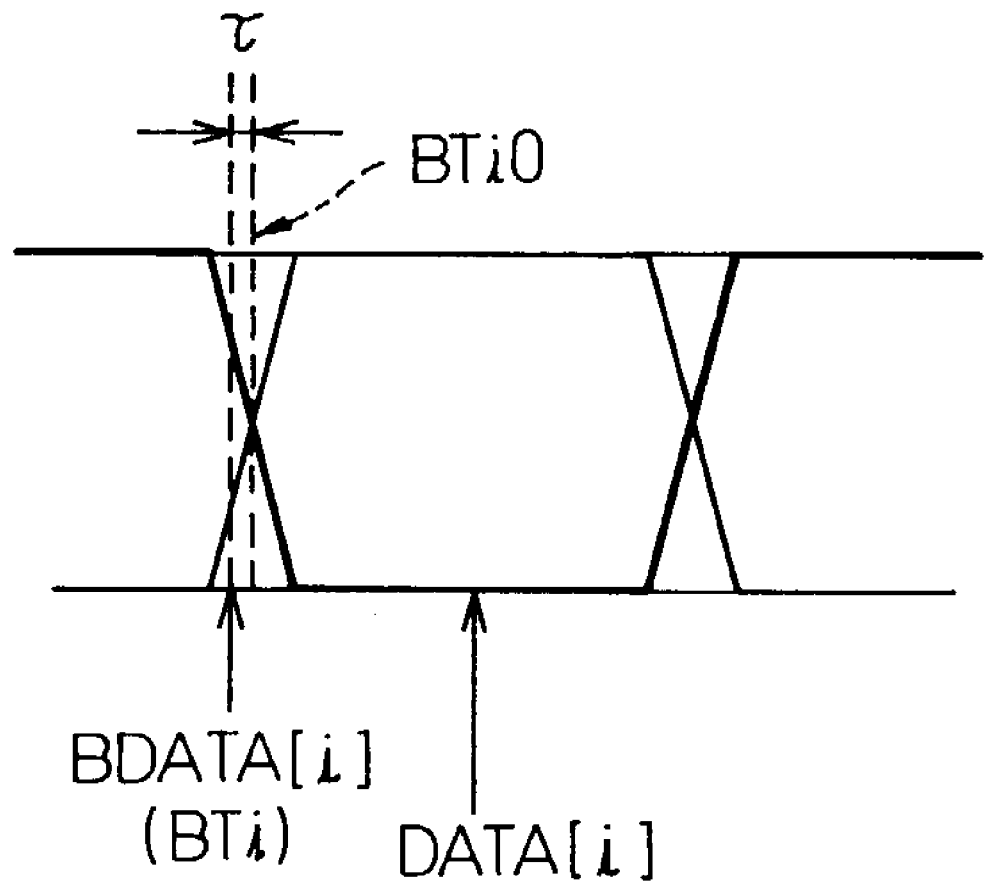
FIG. 6 is a diagram for explaining the operation of the data receiving circuit shown in FIG. 5.

FIG. 5 is a block diagram showing one example of a data receiving circuit according to the related art, and FIG. 6 is a diagram for explaining the operation of the data receiving circuit shown in FIG. 5.

Figure 1:
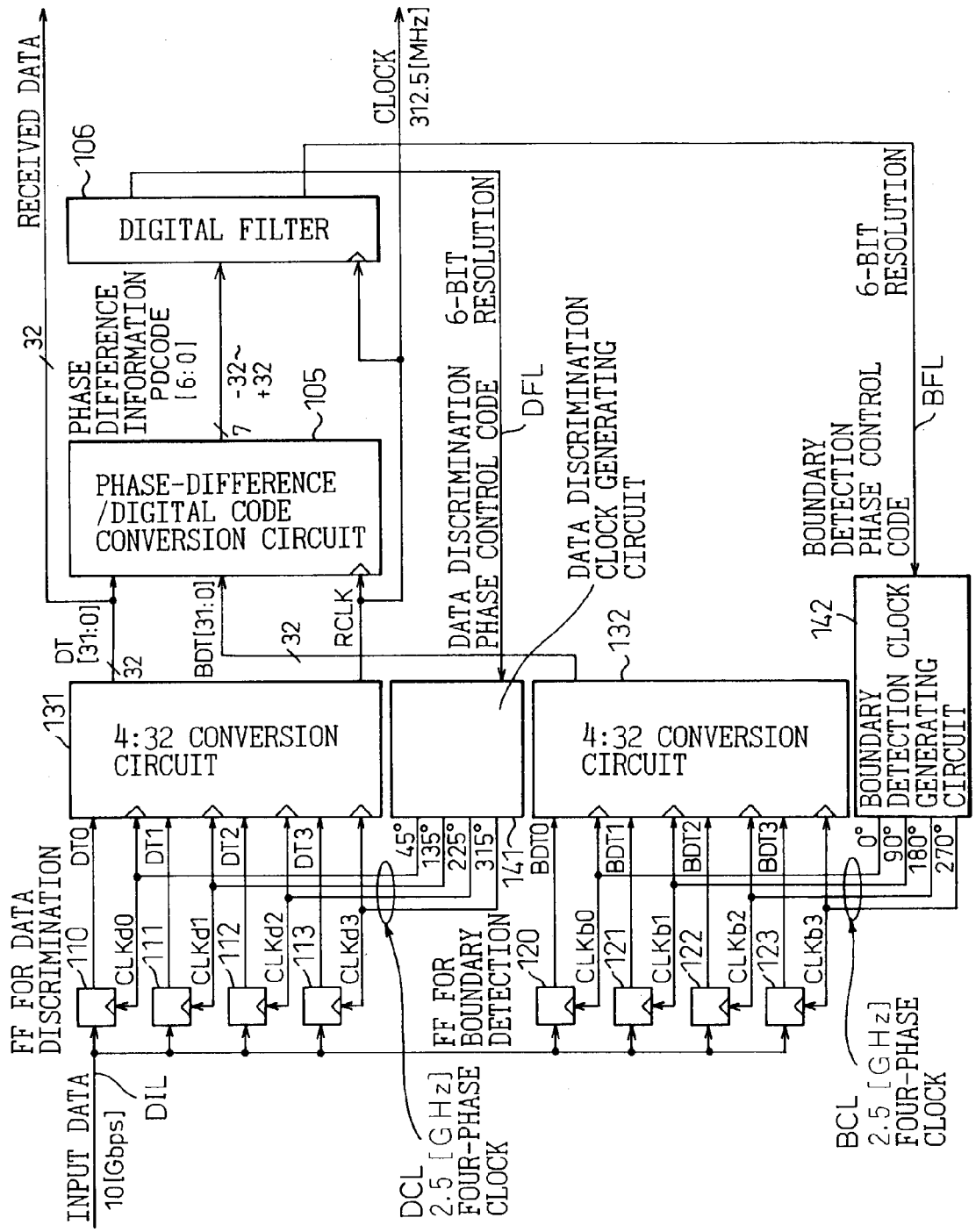
FIG. 1 is a block diagram showing one example of a data receiving circuit according to the prior art.
Figure 2:
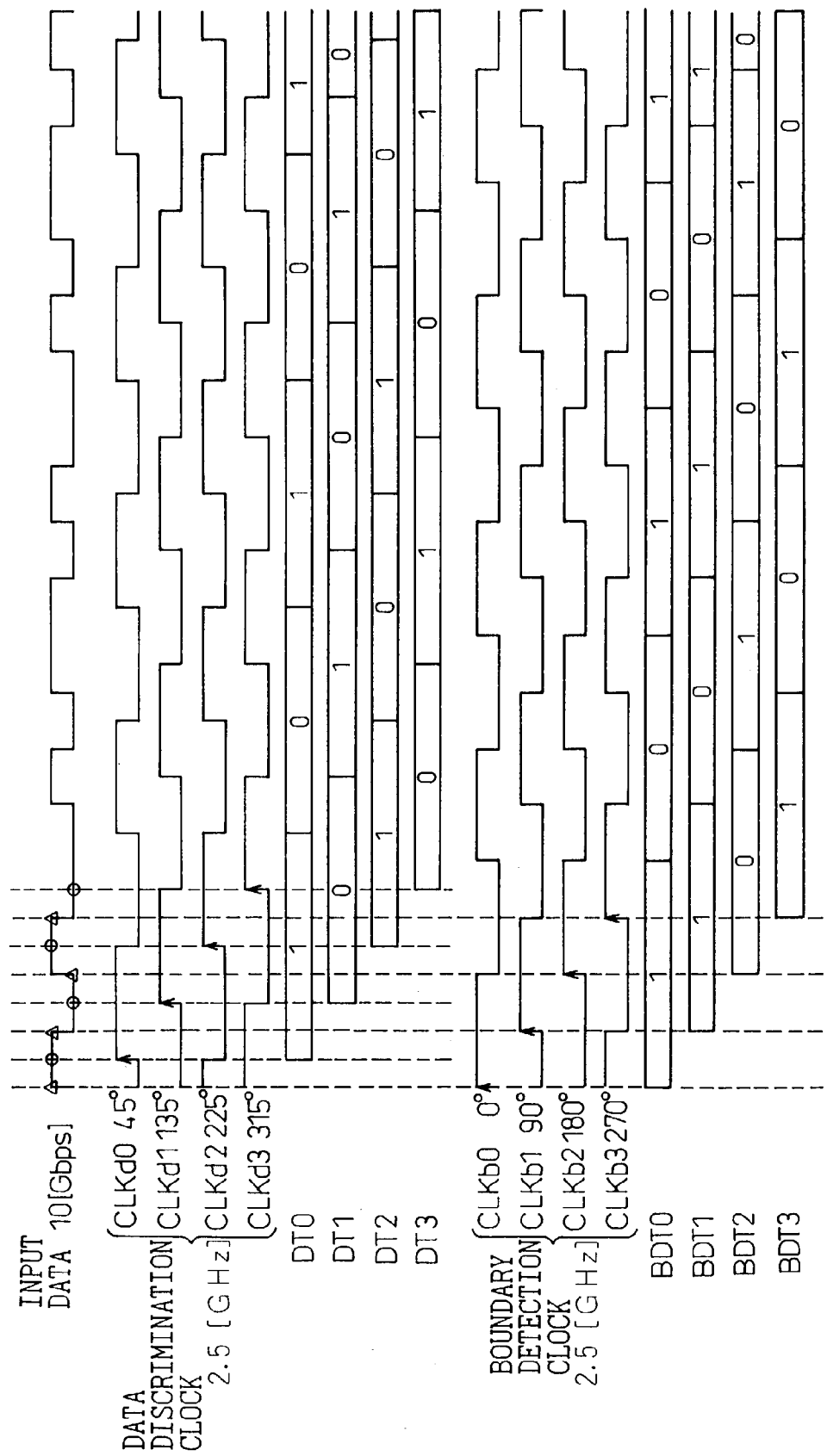
FIG. 2 is a diagram showing the timing of each signal in the data receiving circuit of FIG. 1.
Figure 3:
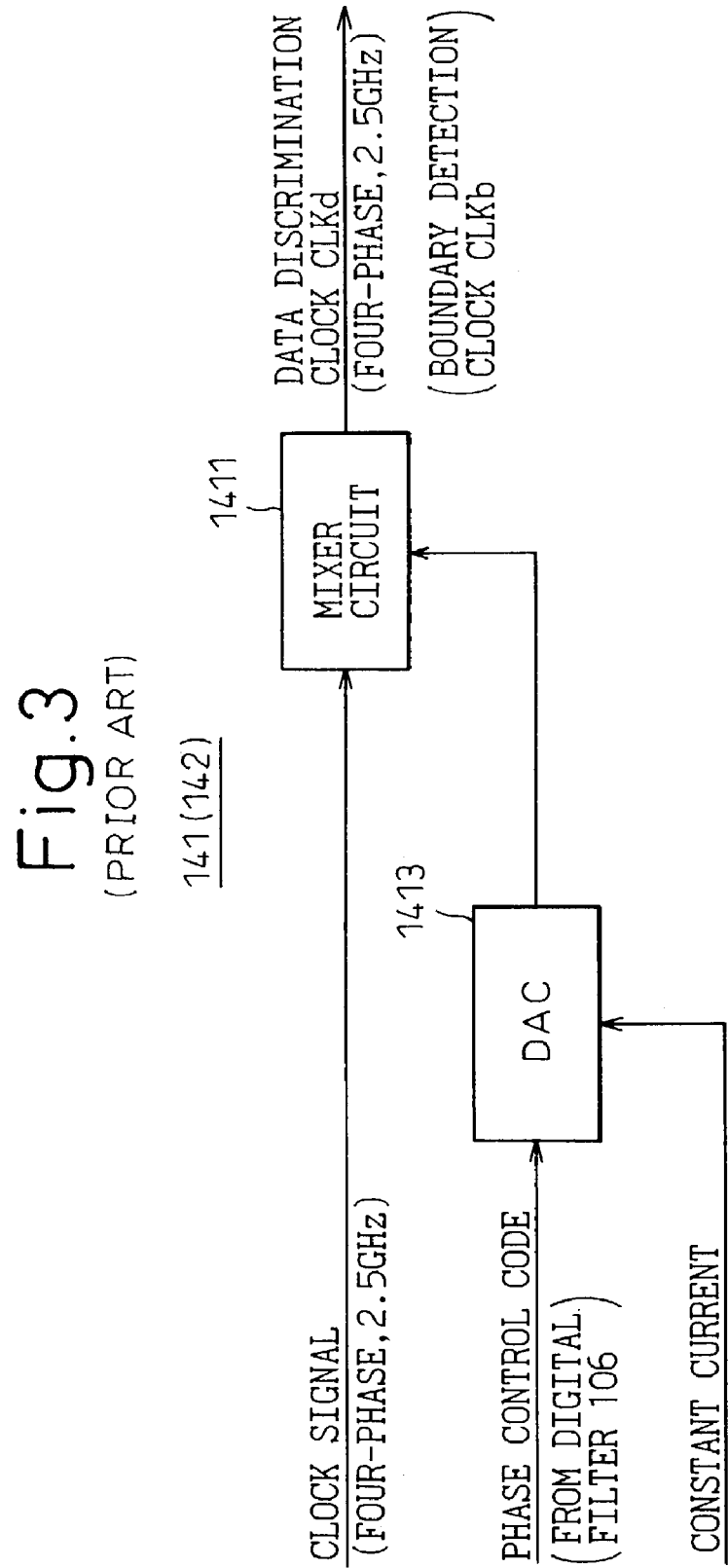
FIG. 3 is a block diagram showing a data discrimination clock generating circuit in the data receiving circuit of FIG. 1.
Figure 4:
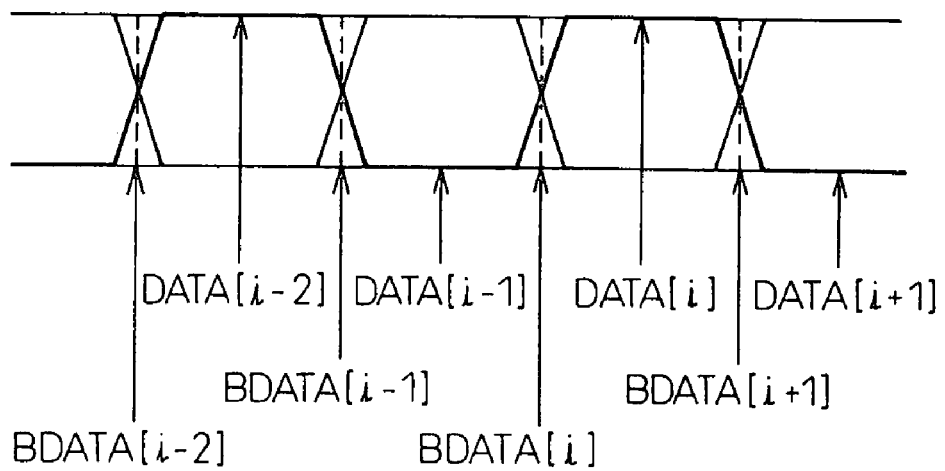
FIG. 4 is a diagram showing an example of latch timing for input signal data and boundaries.

As is apparent from a comparison between FIG. 5 and FIG. 1, the data receiving circuit of the related art shown in FIG. 5 differs from the prior art data receiving circuit of FIG. 1 by the inclusion of a variation generating circuit 107 and an adder circuit 108.

As shown in FIG. 5, in the data receiving circuit of the related art, the adder circuit 108 is inserted in the feedback line BFL via which the phase control code (boundary detection chase control code) from the digital filter 106 is fed back to the boundary detection clock generating circuit 142, and an output of the variation generating circuit 107 is applied to the boundary detection clock generating circuit 142 via this adder circuit 108. That is, the phase control code output from the digital filter 106 is supplied to the boundary detection clock generating circuit 142 by including therein the output of the variation generating circuit 107. thereby effectively shifting the boundary detection timing BTi by time .tau. forward or backward relative to the original boundary detection timing BTi0, as shown in FIG. 6. Here, the variation generating circuit 107 is supplied, for example, with a 312.5-MHz internal reference clock RCLK.

The phase-difference/digital-code conversion circuit 105 makes decisions to determine a phase lead/lag over a number of consecutive bit cells, and the sum is produced as the output of the phase-difference/digital-code conversion circuit 105. In these decision operations, a different time (skew) .tau. is deliberately given to the decision timing for each decision operation, and the timing position is determined which is shifted by the skew .tau. from the original boundary decision timing.

FIG. 7 is a block diagram showing one example of the phase-difference/digital-code conversion circuit in the data receiving circuit of FIG. 5.

As shown in FIG. 7, the phase-difference/digital-code conversion circuit 105 comprises a timing decision circuit 151 and a phase difference information output circuit 152. The timing decision circuit 151 makes timing decisions by receiving the 32-bit received data DT [31:0], and 32-bit boundary detection data BT [31:0] output from the respective conversion circuits 131 and 132. More specifically, data is discriminated by using, for example, the received data DATA [i−1] and DATA [i] and the boundary detection data BDATA [i]. The phase difference information output circuit 152 groups together the timing decision results of the respective bits, and sums the decision results of the 32 bits for output as the phase difference information.

Figure 8A:
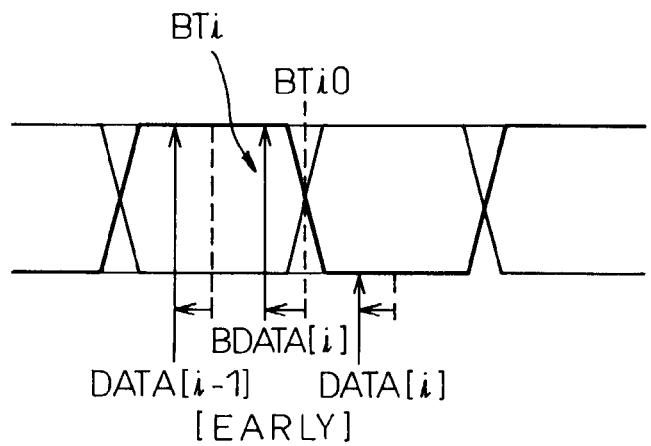
FIGS. 8A, 8B, and 8C are diagrams for explaining the operation of the phase-difference/digital-code conversion circuit shown in FIG. 7.
Figure 8B:
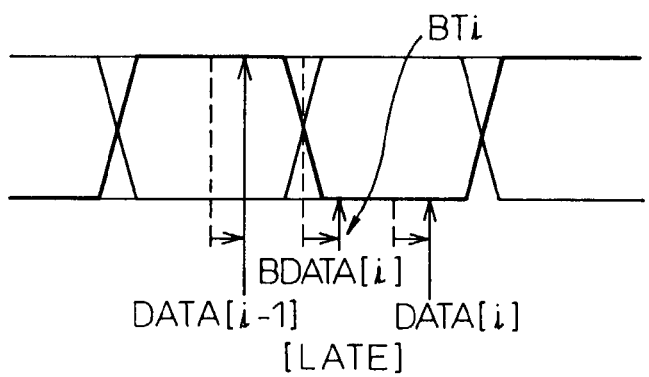
Figure 8C:
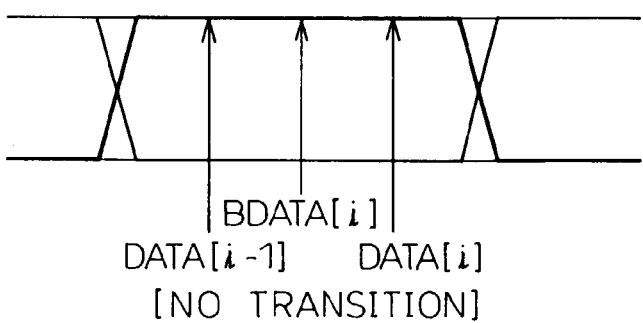

FIGS. 8A, 8B, and 8C are diagrams for explaining the operation of the phase-difference/digital-code conversion circuit shown in FIG. 7, and FIG. 9 is a diagram for explaining the phase difference information that the phase-difference/digital-code conversion circuit shown in FIG. 7 outputs.

FIG. 8A shows the case [EARLY] where the latch timing (Bti) by the internal clock (for example, the boundary detection lock CLKb) is early compared with the ideal latch timing (Bti0), and FIG. 8B shows the case [LATE] where the latch timing by the internal clock is late compared with the ideal latch timing, while FIG. 8C shows the case [NO TRANSITION] where a no transition (from a "0" to a "1" or from a "1" to a "0") appears between data (DATA [i−1]) at a given point in time and the next data (DATA [i]), that is, the same data appears in succession.

As shown in FIGS. 8A to 8C and FIG. 9, when the received data DATA [i−1] and DATA [i] and the boundary detection data BDATA [i] are [1, 0, 1] or [0, 1, 0] (FIG. 8A shows the case of [1, 0, 1]), the timing decision circuit 151 decides that the latch timing by the internal clock is early compared with the ideal latch timing, and outputs "1, 1" (that is, "−1": Delay the phase of the data discrimination clock) as the code CODEi [1:0] to the phase difference information output circuit 152. On the other hand, when the received data DATA [i−1] and DATA [i] and the boundary detection data BDATA [i] are [1, 0, 0] or [0, 1, 1] (FIG. 8B shows the case of [1, 0, 0]), the timing decision circuit 151 decides that the latch timing by the internal clock is late compared with the ideal latch timing, and outputs "0, 1" (that is, "+1": Advance the phase of the data discrimination clock) as the code CODEi [1:0] to the phase difference information output circuit 152.

In other cases, that is. when the received data DATA [i−1] and DATA [i] and the boundary detection data BDATA [i] are [0, 0, 0] or [1, 1, 1] (FIG. 8C shows the case of [1, 1, 1]), or when the boundary detection timing is at a boundary position, and the received data DATA [i−1] and DATA [i] and the boundary detection data BDATA [i] are [0, 0, 1] or [1, 1, 0], then the timing decision circuit 151 outputs "0, 0" (that is, "0") as the code CODEi [1:0] to the phase difference information output circuit 152.

The timing decision circuit 151 performs the above processing on all the bits (DT [31:0] and BT [31:0]), and supplies the code CODEk [1:0] for each bit k (where, k=0 to 31) to the phase difference information output circuit 152. The phase difference information output circuit 152 adds the codes CODEk [1:0] for all the bits k, and supplies the phase difference information PCODE [6:0] to the digital filter at the next stage. Accordingly, the phase difference information PCODE [6:0] takes a value within a range of −32 to 30 32. Here, the phase difference information PCODE [6:0] takes a value of −32 when the code is "−1" for all the 32 bits, and takes a value of +32 when the code is "+1" for all the 32 bits.

Figure 10A:
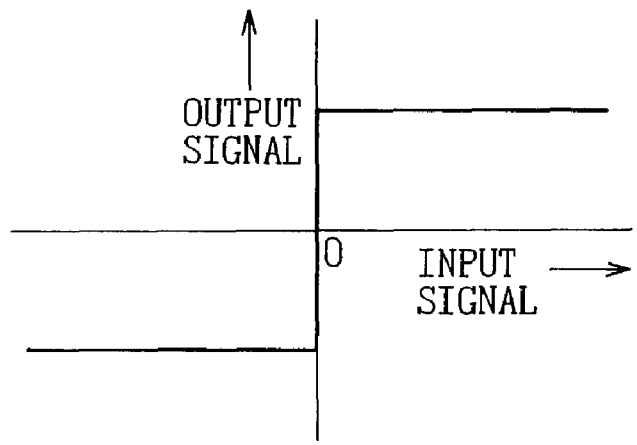
FIGS. 10A and 10B are diagrams for explaining one example of the operation of the data receiving circuit shown in FIG. 5.
Figure 10B:
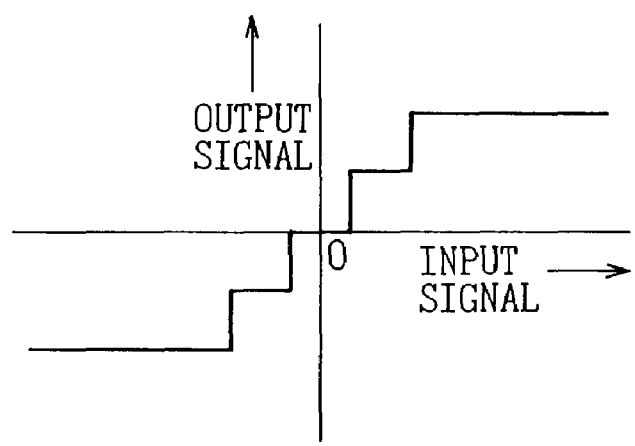

FIGS. 10A and 10B are diagrams for explaining one example of the operation of the data receiving circuit shown in FIG. 5: FIG. 10A shows a nonlinear input/output characteristic, and FIG. 10B shows a staircase-like input/output characteristic.

As described above, the data receiving circuit of the related art shown in FIG. 5 differs from the prior art data receiving circuit due to the inclusion of the variation generating circuit 107 and the adder circuit 108, thereby making provisions to shift the boundary detection timing forward or backward relative to the original timing. The phase-difference/digital-code conversion circuit 105 makes decisions to determine a phase lead/lag over a number of consecutive bit cells, and outputs the sum as the phase difference information (phase comparison output); in these decision operations, the data receiving circuit of the related art deliberately applies a different skew to the decision timing for each decision operation.

In a specific example, skews of −(3/2.tau), −(1/2.tau.), (1/2.tau.), and (3/2.tau.), relative to the original boundary timing, are created. In this case, the input/output characteristic exhibits a staircase pattern consisting of four steps as shown in FIG. 10B. This can be interpreted as providing linearity to the input/output characteristic compared with the prior art nonlinear input/output characteristic consisting of a single step (see FIG. 10A). In the illustrated example, a characteristic substantially linear over a time duration of 4.tau. can be obtained. If the value of 4.tau. is set approximately equal to the maximum value of the utter input to the system, the phase-difference/digital-code conversion circuit 105 can always be operated within a linear range.

Thus, in the data receiving circuit of the related art shown in FIG. 5, by modulating the boundary detection timing forward or backward relative to its original position and thereby giving differing skews to the phase lead/lag decision timings of the phase-difference/digital-code conversion circuit, linearity is provided to the input/output characteristic, that is, the input/output relationship of the boundary detection units 120 to 123 (phase-difference/digital-code conversion circuit 105) is made substantially linear, thereby reducing not only the amplitude of the limit cycle signal inherent in a nonlinear system but also the utter dependence of the feedback loop characteristic, and thus improving the predictability of the characteristics of the data receiving circuit (clock recovery circuit).

However, in the data receiving circuit of the related art described with reference to FIGS. 5 to 10B, if the boundary detection timing is modulated forward or backward relative to its original position, a component varying with the same frequency as that used for the modulation appears in the output of the phase-difference/digital-code conversion circuit 105. This means that the same varying component is also contained in the phase of the data discrimination clocks CLKd0 to CLKd3 (CLKd) supplied to the data discrimination units 110 to 113, and this varying component causes phase noise.

More specifically, in SONET (Synchronous Optical Network: North American standard for optical communications), for example, the utter that occurs in a circuit performing high-speed signal transmission at a rate of about 10 Gbps is specified to be not greater than 10 ps p-p. It is thus required that the phase noise caused by the phase modulation for linearization affecting the internal clock be held to a minimum.

Next, the basic functional configuration of the present invention will be described before describing in detail the embodiments of the data receiving circuit (clock recovery circuit) according to the invention.

Figure 11:
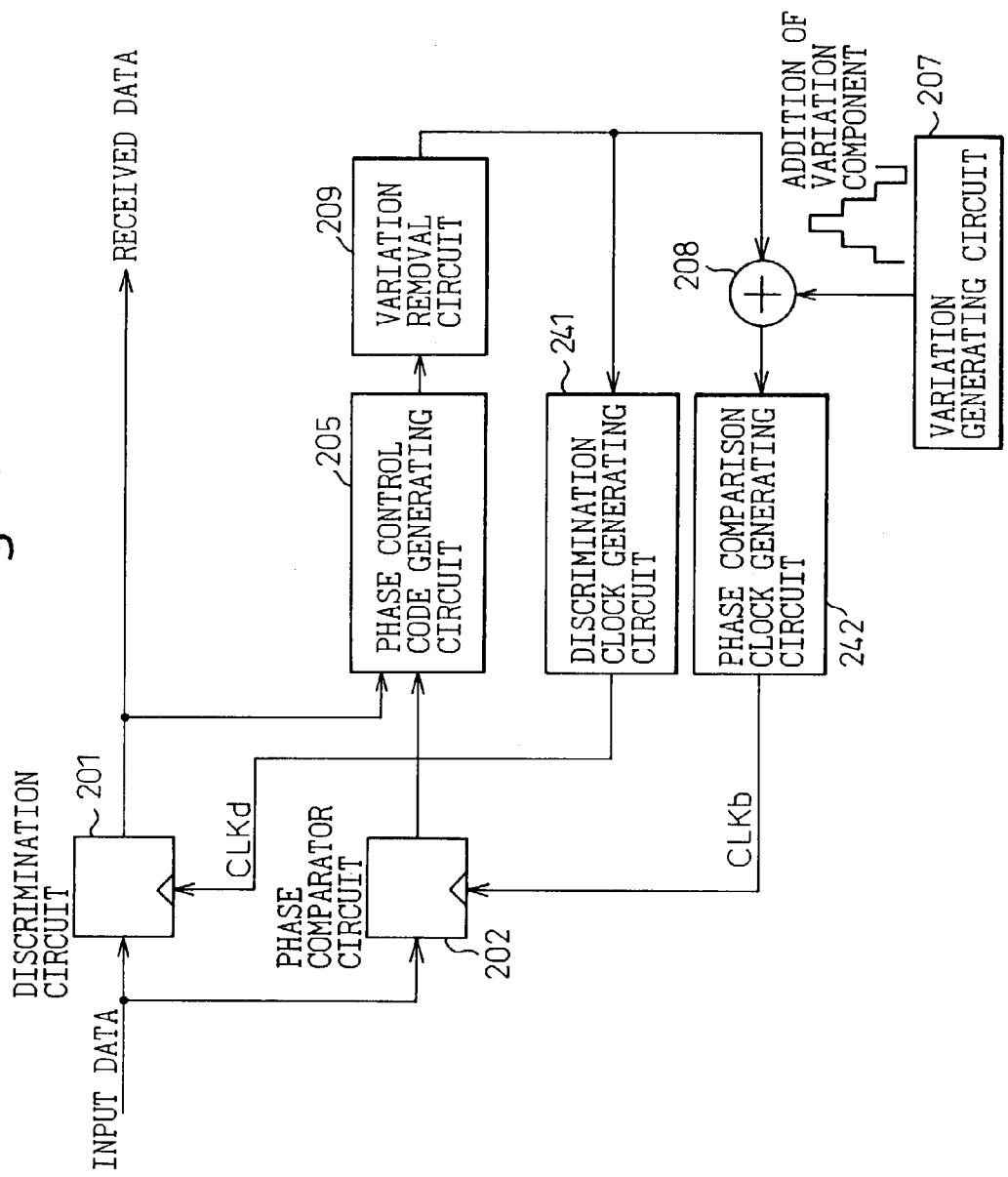
FIG. 11 is a block diagram showing the basic functional configuration of a data receiving circuit according to a first mode of the present invention.

FIG. 11 is a block diagram showing the basic functional configuration of a data receiving circuit (clock recovery circuit) according to a first mode of the present invention. In FIG. 11, reference numeral 201 is a discrimination circuit (data discrimination circuit), 202 is a phase comparator circuit (boundary detection circuit), 205 is a phase code generating circuit, 207 is a variation generating circuit, 208 is an adder circuit, 209 is an variation removal circuit, 241 is a discrimination clock generating circuit (data discrimination clock generating circuit), and 242 is a phase comparison clock generating circuit (boundary detection clock generating circuit).

As shown in FIG. 11, in the data receiving circuit (clock recovery circuit) according to the first mode of the present invention, an output of the phase code generating circuit 205 is supplied to the discrimination clock generating circuit 241 through the variation removal circuit 209. More specifically, the input data is supplied to the discrimination circuit 201 as well as to the phase comparator circuit 202, and the input data is compared in the discrimination circuit 201 with the discrimination clock CLKd, while the input data is compared in the phase comparator circuit 202 with the phase comparison clock CLKb. The outputs of the discrimination circuit 201 and the phase comparator circuit 202 are supplied to the phase control code generating circuit 205, and the phase control code output from the phase control code generating circuit 205 is supplied to the discrimination clock generating circuit 241 through the variation removal circuit 209, and also supplied to the phase comparison clock generating circuit 242 through the variation removal circuit 209 and the adder circuit 208.

The variation generating circuit 207 generates a variation for modulating the phase comparison timing in the phase comparator circuit 202 forward or backward relative to its original position. The variation generated by the variation generating circuit 207 is added in the adder circuit 208 to the phase control code to be supplied to the phase comparison clock generating circuit 242, thereby substantially linearizing the input/output relationship of the phase comparator circuit 202. The variation removal circuit 209 is provided to remove a periodic or non-periodic variation pattern appearing in the output of the phase control code generating circuit 205 on which the output (variation) of the variation generating circuit 207, added in the adder circuit 208, is superimposed, and the variation removal circuit 209 removes the variation pattern by utilizing the fact that the added value (variation: amplitude and frequency) is known.

Here, the variation removal circuit 209 can be constructed, for example, as a band-stop filter (notch filter) for removing the frequency component of the added variation. The notch filter may be implemented as an ordinary analog band-stop filter or a moving average filter with a span equal to the period of the added variation. Then, by integrating one period of the output of the phase comparator circuit 202, frequency components one, two, . . . , n times the frequency of the added variation can be completely removed. It is also possible to construct the variation removal circuit 209, for example, as part of a filter that processes the output of the phase control code generating circuit 205.

With the amount (variation) to be added in the adder circuit 208, the variation pattern represented by the amplitude and frequency of that amount can be controlled (dynamically controlled). The amount that needs to be added for linearization is also dependent on the magnitude of the phase variation of the data and, by varying the amount of addition according to the magnitude of the phase variation, the variation of the output phase caused by the addition can also be minimized.

Figure 12:
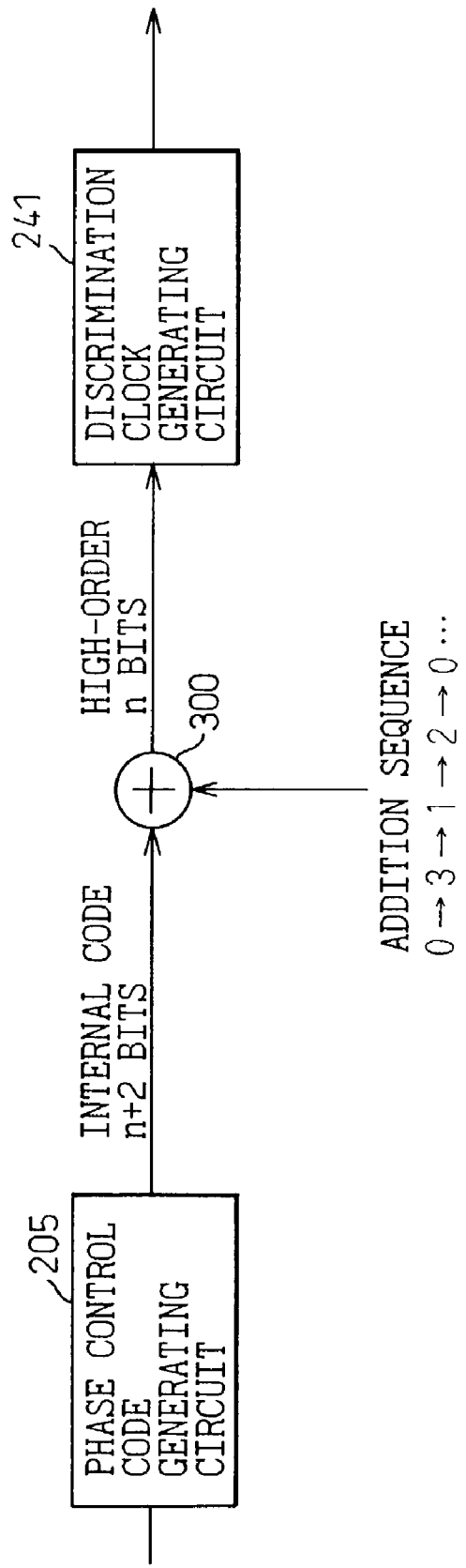
FIG. 12 is a block diagram showing the basic functional configuration of a data receiving circuit according to a second mode of the present invention.

FIG. 12 is a block diagram showing the basic functional configuration of a data receiving circuit (clock recovery circuit) according to a second mode of the present invention.

As shown in FIG. 12, in the data receiving circuit (clock recovery circuit) according to the second mode of the present invention, an adder circuit 300 is inserted between the phase control code generating circuit 205 and the discrimination clock generating circuit 241, and a prescribed addition sequence (for example, a variation pattern "0→3→1→2→0→ . . . " or "0→1→2→3→0→ . . . ") is added by the adder circuit 300.

That is, the linearization (improvement of the phase discrimination ability) achieved by adding a known variation pattern to the phase control code (the output of the phase control code generating circuit 205) is also possible for the output of the phase control code generating circuit 205. For example, when the phase control code generating circuit 205 is controlled by a digital code, the interval at which the phase value can be output is determined by the resolution of the phase control code generating circuit 205. However, in FIG. 12, a known variation pattern (for example, "0→3→1→2→0→ . . . " or "0→1→2→3→0→ . . . ") is added to the phase control code (code with a resolution higher than the resolution of the phase control code generating circuit 205: Internal code, (n+2)-bit code) and, of the bits constituting the resulting code, only the high order bits (high order n bits) that the discrimination clock generating circuit 241 can resolve are supplied to the discrimination clock generating circuit 241. By averaging the phase thus obtained (filtering the variation component for output), an output with a resolution equivalent to that of the internal code (phase control code) can be obtained.

As described above, according to the first mode of the present invention, the amplitude of the limit cycle signal and the jitter dependence of the feedback loop characteristic can be reduced, thereby improving the predictability of the characteristics while, at the same time, minimizing the phase noise that occurs with the internal clock being affected by the phase modulation applied for linearization. Further, according to the second mode of the present invention, as the resolution of the phase control code generating circuit can be increased, the quantization noise of the clock can also be reduced. This serves to increase the timing margin of the receiving circuit, and thus a data receiving circuit (clock recovery circuit) having higher stability and capable of high-speed operation can be achieved.

Embodiments of the data receiving circuit (clock recovery circuit) according to the present invention will now be described in detail below with reference to the accompanying drawings.

Figure 13:
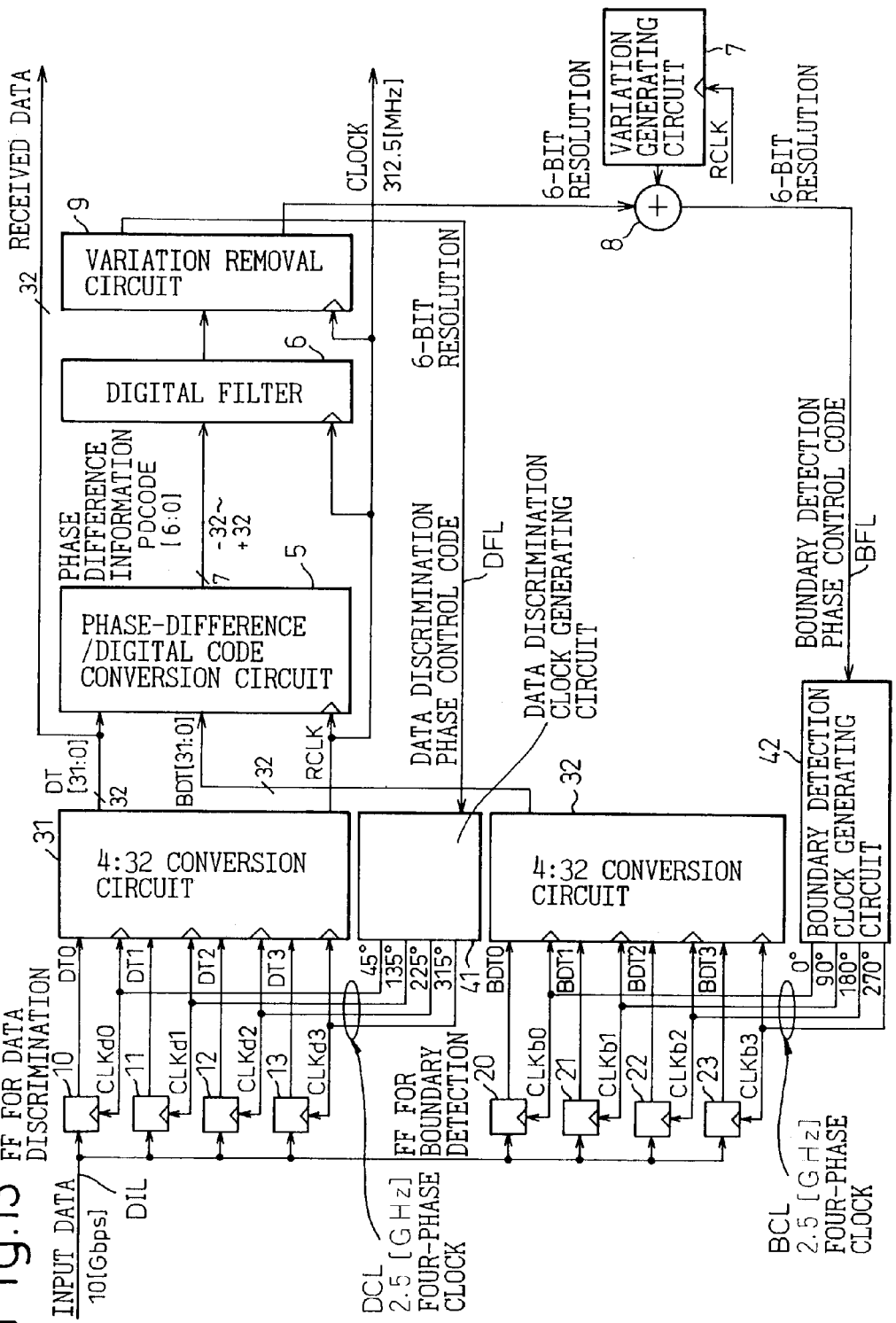
FIG. 13 is a block diagram showing one embodiment of the data receiving circuit according to the present invention.

FIG. 13 is a block diagram showing one embodiment of the data receiving circuit according to the present invention, wherein the circuit is configured as a 4-way×2 type interleaving circuit using CDR.

In FIG. 13, reference numerals 10 to 13 are data discrimination units (flip-flops for data discrimination), 20 to 23 are boundary detection units (flip-flops for boundary detection), and 31 and 32 are data and boundary conversion circuits, respectively. Further, reference numeral 41 is a data discrimination clock generating circuit, 42 is a boundary detection clock generating circuit, 5 is a phase-difference/digital-code conversion circuit, 6 is a digital filter, 7 is a variation generating circuit, 8 is an adder circuit, and 9 is a variation removal circuit. On the other hand, reference character DIL is a data input line, DCL is a data discrimination clock line, BCL is a boundary detection clock line, and DFL and BFL are data and boundary feedback lines, respectively.

As is apparent from a comparison between FIG. 13 and FIG. 5, the data receiving circuit of the embodiment shown in FIG. 13 differs from the data receiving circuit of the related art shown in FIG. 5 by the inclusion of the variation removal circuit 9, wherein the variation removal circuit 9 supplies the data discrimination phase control code to the data discrimination clock generating circuit 41 after removing the periodic or non-periodic variation pattern appearing in the output of the phase-difference/digital-code conversion circuit 5 on which the output (variation) of the variation generating circuit 7, added in the adder circuit 8, is superimposed. Here, the variation generating circuit 7 is supplied, for example, with a 312.5-MHz internal reference clock RCLK. In this embodiment, provisions are also made to supply the boundary detection phase control code to the boundary detection clock generating circuit 42 after removing the variation pattern by the variation removal circuit 9.

The variation removal circuit 9 is a digitally synthesized band-stop filter whose stop band frequency coincides with the frequency of the modulation signal. This band-stop filter can be implemented using known FIR filter technology. According to the data receiving circuit of this embodiment, the amplitude of the limit cycle signal and the jitter dependence of the feedback loop characteristic can be reduced, thereby improving the predictability of the characteristics, while at the same time, suppressing the phase noise that occurs with the internal clock being affected by the phase modulation applied for linearization.

Figure 14:
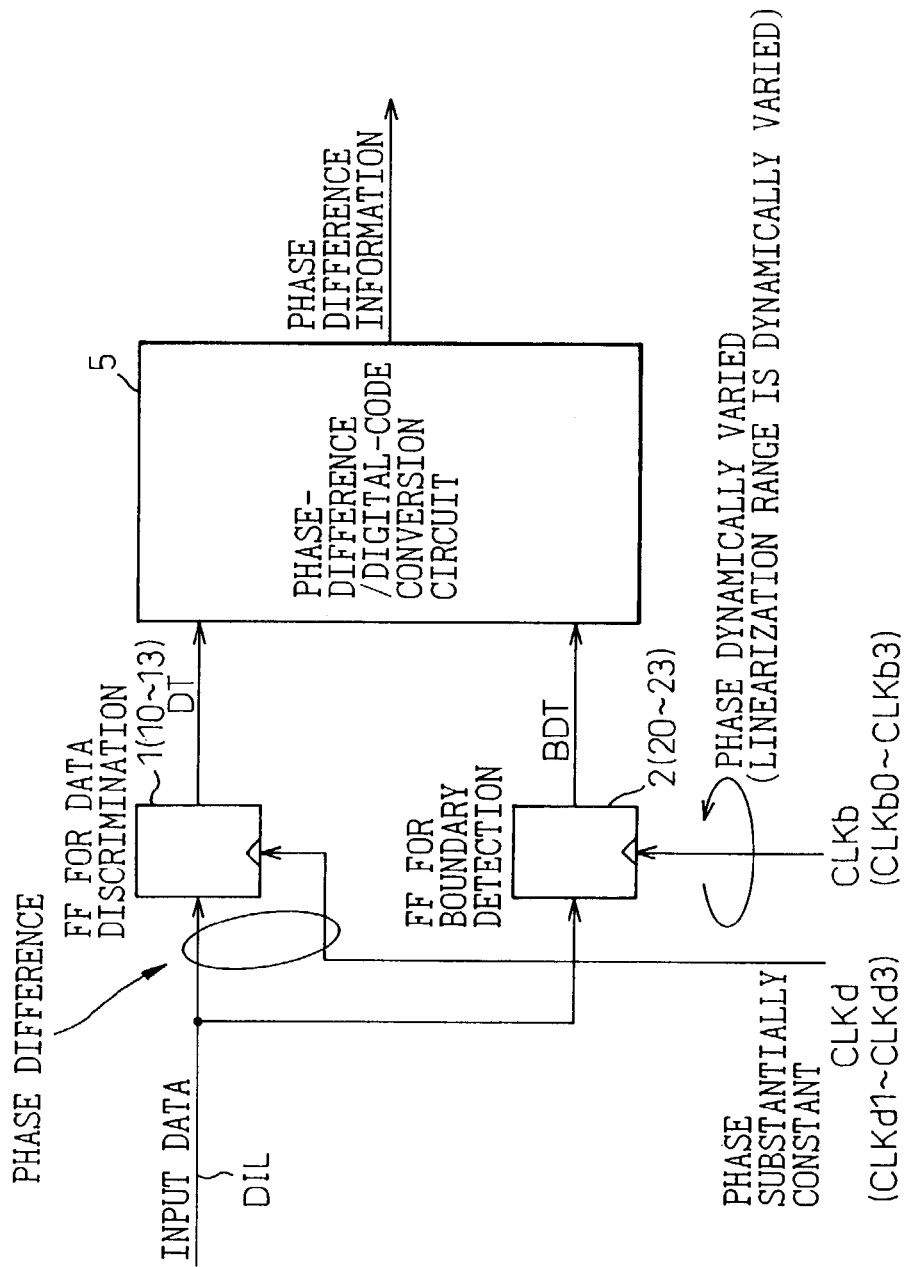
FIG. 14 is a diagram (part 1) for explaining how linearization is accomplished in the data receiving circuit of FIG. 13.
Figure 15:
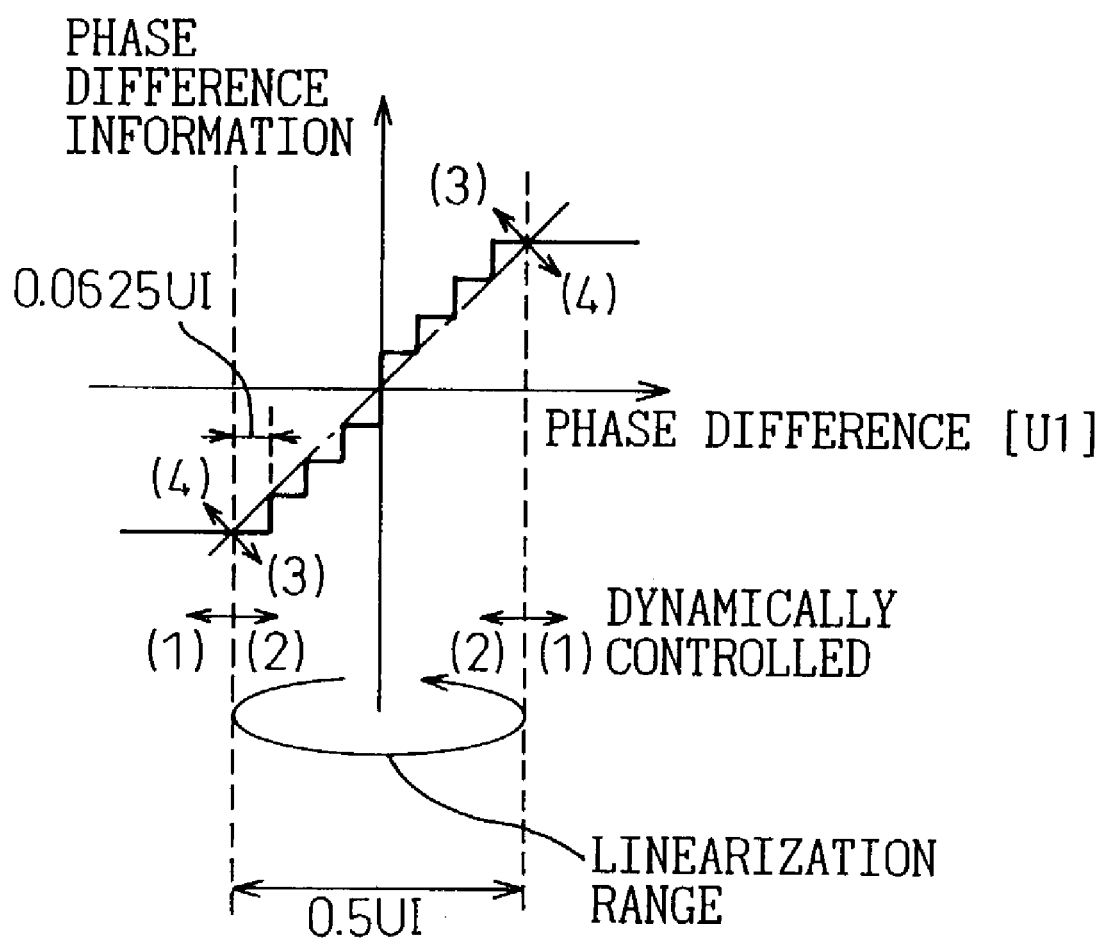
FIG. 15 is a diagram (part 1) for explaining how linearization is accomplished in the data receiving circuit of FIG. 13.

FIGS. 14 and 15 are diagrams for explaining how the linearization is accomplished in the data receiving circuit of FIG. 13. In FIG. 14, reference numeral 1 represents the data discrimination unit (flip-flop for data discrimination), and 2 the boundary unit (flip-flop for boundary detection).

As in the data receiving circuit of the related art described with reference to FIGS. 5 to 10B, in this embodiment also, the linearization is accomplished by varying the phase of the boundary detection clock CLKb (CLKb0 to CLKb3), to be supplied to the boundary detection unit 2, by using the variation generating circuit 7 and the adder circuit 8. In the data receiving circuit of the related art, however, the skew (phase shift) was varied as $-(3/2\tau)$, $-(1/2\tau)$, $(1/2\tau)$, and $(3/2\tau)$ in an analog fashion with respect to the original boundary timing; by contrast, in the present embodiment, the phase of the boundary detection clock CLKb is dynamically varied, for example, normally in eight steps over a range of 0.5 UI (Unit Internal: Data clock period), and the average value of the phase information over one clock period is obtained.

More specifically, the skew for one step is set, for example, to 0.0625 UI, and in the initial state, for example, at the time of power on of the system (data receiving circuit), since the phase difference between the input data and the data discrimination clock (CLKd) is large, the linearization range is expanded, for example, to 12 steps (in directions (1) in FIG. 15 to provide a linearization range of 0.75 UI) so as to be able to accommodate any large jitter appearing in the input data. Then, when the system stabilizes, and the phase difference between the input data and the data discrimination clock becomes small, the linearization range is narrowed, for example, to four steps (in directions (2) in FIG. 15 to provide a linearization range of 0.25 UI). In this way, the linearization range can be dynamically controlled according to the system state such as the initial state or the stable state (that is, according to the phase difference between the input data and the data discrimination clock). Here, the state, such as the initial state at power on, in which the phase difference between the input data and the data discrimination clock is large is referred to as the unstable state, and the state in which the system stabilizes and the phase difference between the input data and the data discrimination clock is small is referred to as the stable state.

Furthermore, the slope (gain) of the variation used for the linearization can also be controlled dynamically by making the slope steeper when in the unstable state (in direction (3) in FIG. 15) and less steep when in the stable state (in direction (4) in FIG. 15). Conversely, it is also possible to maintain the frequency characteristic of the loop constant by holding a proportional relationship constant between the phase difference (the phase difference between the input data and the data discrimination clock) and the gain regardless of the linearization range. When the slope (gain) of the variation is dynamically varied, the proportional relationship between the phase difference and the gain is disrupted. For example, in the stable state in which the phase difference between the input data and the data discrimination clock is small, if the gain is made larger than necessary (that is, the slope is made steeper), this may result in an excessive tracking characteristic, causing jitter in the data discrimination clock and leading to an undesirable situation. Conversely, if the gain is too small, phase tracking may be rendered impossible.

It is also possible to dynamically control the set value of the skew for one step (which is normally set, for example, to 0.0625 UI) by reducing the skew (for example, to 0.05 UI) when in the unstable state and increasing the skew (for example, to 0.075 UI) when in the stable state.

In the process of causing the internal clock (for example, the data discrimination clock) to lock with the input data, if the time constant of the CDR loop is set short in the initial state and, after reaching steady state, the time constant is set longer, the time required for the internal clock to lock with the input data can be reduced. This means varying the cutoff frequency of the loop between the initial state and the steady state. That is, when the time constant of the loop is short, the cutoff frequency is high, and when the time constant of the loop is long, the cutoff frequency is low. In this case, the period of the variation to be added to the boundary detection phase control code supplied to the boundary detection clock generating circuit 42 may be made variable so that the frequency of the variation to be added can be varied together with the cutoff frequency.

Further, the amplitude of the variation to be added to the boundary detection phase control code may be made variable so that control can be performed to reduce the amplitude of the variation when the phase difference between the input data and the data discrimination clock is small. In this case, the gain of the phase comparator varies with the amplitude of the variation added to the boundary detection phase control code, but control may be performed to maintain the frequency characteristic of the loop constant by automatically adjusting the parameter of the digital filter.

Here, the amplitude of the variation necessary to linearize the phase comparator is proportional to the magnitude of the input to the phase comparator (that is, the phase difference between the input data and the boundary detection clock) but, in the present embodiment, as it is only necessary to achieve linearization over the range that covers the input range of the phase detection, a variation just enough to achieve the necessary linearization can be applied so as to minimize the fluctuation in clock phase due to the variation.

Figure 16A:
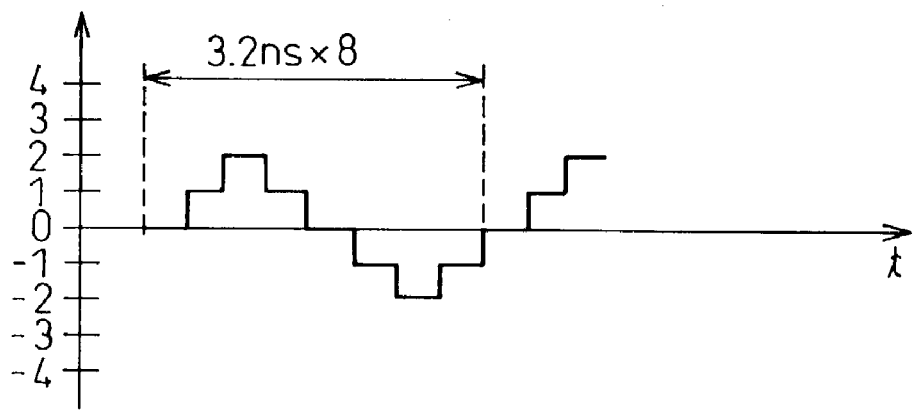
FIGS. 16A and 16B are diagrams each showing an example of the output pattern produced by a variation generating circuit in the data receiving circuit of FIG. 13.
Figure 16B:
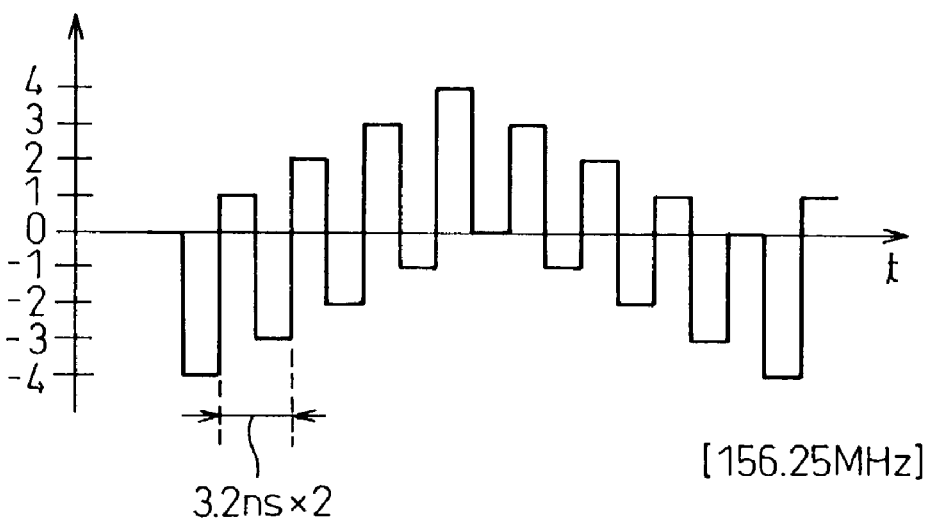

FIGS. 16A and 16B are diagrams each showing an example of the output pattern produced by the variation generating circuit in the data receiving circuit of FIG. 13: FIG. 16A shows the case of a triangular wave, and FIG. 16B shows the case of a zigzag wave.

In the triangular wave shown in FIG. 16A, eight steps, each of which is 1/(312.5 MHz)=3.2 ns long, constitute one period (3.2 ns×8=15.6 ns), and the frequency of the triangular wave is 312.5 MHz÷8≈39.1 MHz. On the other hand, in the zigzag wave shown in FIG. 16B, two steps, each of which is 3.2 ns long, constitute one period (3.2 ns×2=6.4 ns), and the frequency of the zigzag wave is 312.5 MHz÷2=156.25 MHz.

That is, the triangular wave shown in FIG. 16A provides a pattern, for example, 0→+1→+2→+1→0→−1→−2→−1→0→ . . . , for the code value within a range of −2 to +2, and the frequency of the variation is 39.1 MHz. On the other hand, the zigzag wave shown in FIG. 16B provides a pattern, for example, 0→−4→+1→−3→+2→−2→+3→−1→+4→0→+3→ . . . , for the code value within a range of −4 to +4, and the frequency of the variation is 156.25 MHz which is higher than the triangular wave; this has the advantage of reducing the variation appearing in the data discrimination clock (internal clock) because of the low-pass characteristic of the feedback loop.

Figure 17:
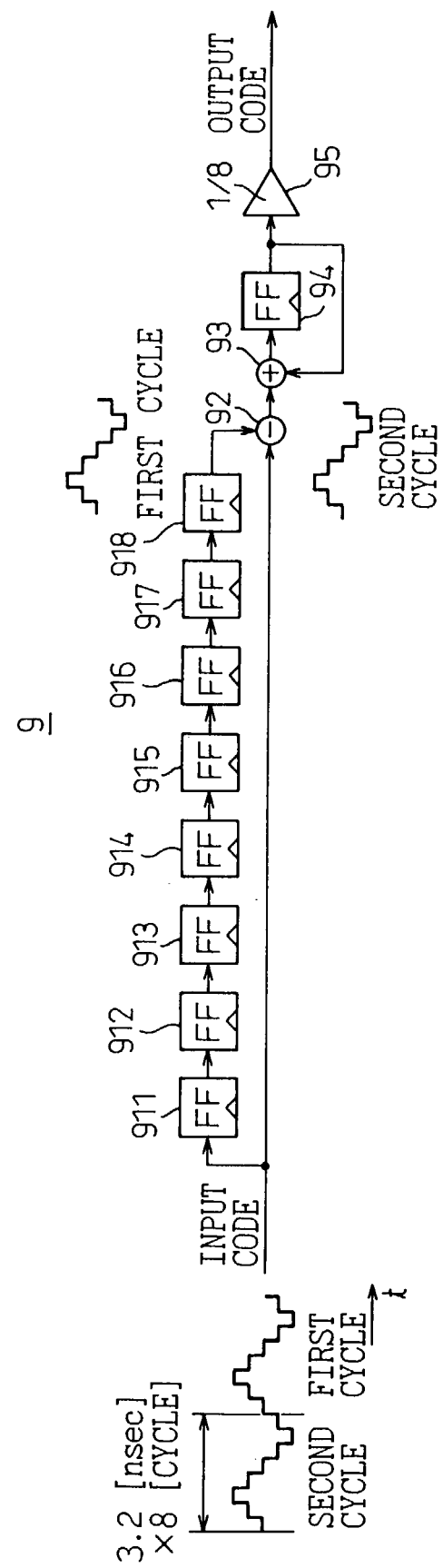
FIG. 17 is a block diagram showing one example of a variation removal circuit in the data receiving circuit of FIG. 13.

FIG. 17 is a block diagram showing one example of the variation removal circuit in the data receiving circuit of FIG. 13, that is, the configuration example of the variation removal circuit 9 that can be applied to the case where the variation is a triangular wave such as shown in FIG. 16A (and the case where the variation is a zigzag wave such as shown in FIG. 16B).

As shown in FIG. 17, the variation removal circuit 9 is constructed as a notch filter, and comprises eight stages of flip-flops 911 to 918 connected in series, a subtractor circuit 92, an adder circuit 93, a flip-flop 94, and a divider circuit 95. The flip-flops 911 to 918 sequentially latch data by a clock operating, for example, at 312.5 MHz, and the variation in the phase control code (data discrimination phase control code) corresponding to the triangular wave whose period consists of eight steps, each 3.2 ns (=1/(312.5 MHz)) long, is removed through the eight stages of flip-flops 911 to 918. Here, the adder circuit 93 and the flip-flop 94 together constitute an integrator circuit whose function is to output the low frequency component in the initial state or lock state, while the divider circuit 95 is a circuit that divides the output of the integrator circuit (flip-flop 94) by 8 which corresponds to the number of flip-flops 911 to 918, and produces an output representing the result.

Figure 18:
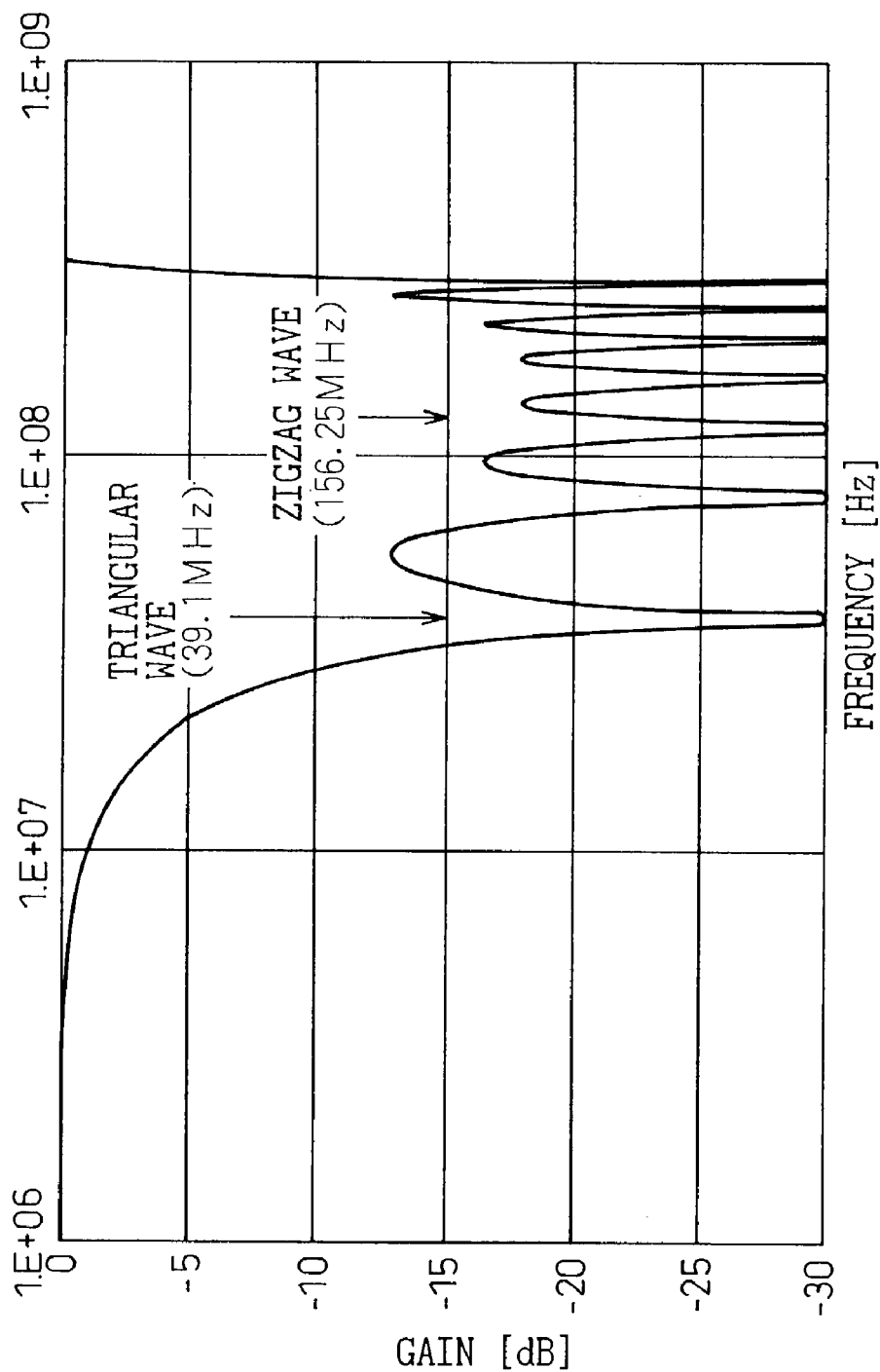
FIG. 18 is a diagram for explaining the operation of the variation removal circuit of FIG. 17.

FIG. 18 is a diagram for explaining the operation of the variation removal circuit of FIG. 17.

As is apparent from FIG. 18, the variation removal circuit (notch filter) 9 shown in FIG. 17 can remove the triangular wave such as shown in FIG. 16A whose frequency is 39.1 MHz. As can be seen, the variation removal circuit 9 can also remove the zigzag wave such as shown in FIG. 16B whose frequency is 156.25 MHz. It will also be recognized that the zigzag wave of 156.25 MHz can also be removed by only providing two stages (corresponding to one period of the zigzag wave) of flip-flops or 2h stages of flip-flops (h is a positive integer and corresponds to an h-th multiple of one period of the zigzag wave) instead of the eight stages of flip-flops 911 to 918.

Figure 19A:
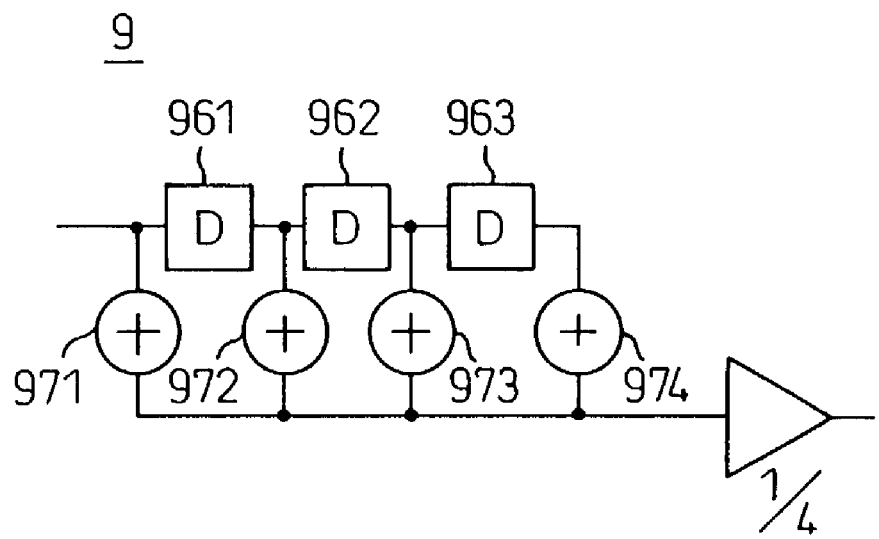
FIGS. 19A and 19B are block diagrams showing other examples of the variation removal circuit in the data receiving circuit of FIG. 13.
Figure 19B:
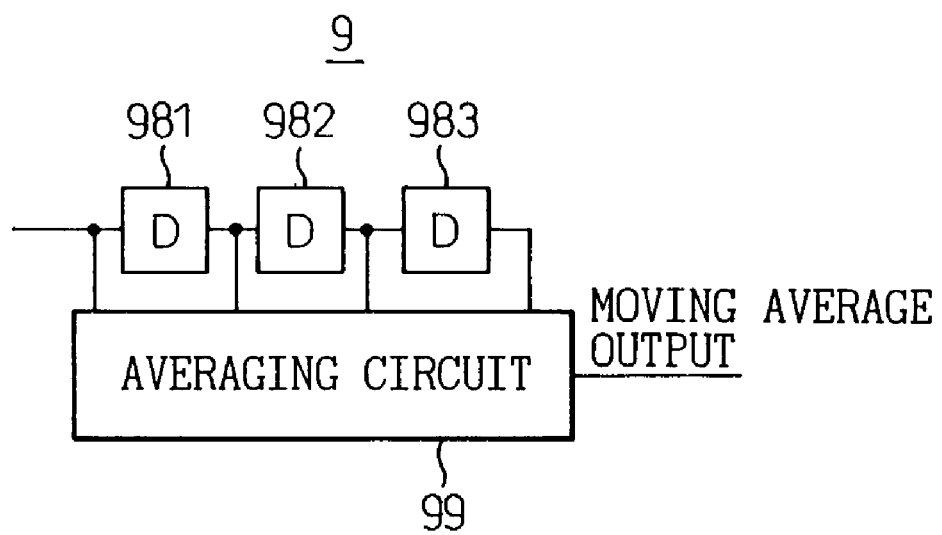

FIGS. 19A and 19B are block diagrams showing other examples of the variation removal circuit in the data receiving circuit of FIG. 13: FIG. 19A shows an example in which the variation removal circuit is constructed using a FIR (Finite-duration Impulse Response) filter, and FIG. 19B shows an example in which the variation removal circuit is constructed using a moving average circuit.

The variation removal circuit 9 can be constructed using a known FIR filter comprising, for example, delay elements 961 to 963 and adders 971 to 974, as shown in FIG. 19A, or using a known moving average circuit comprising, for example, delay elements (for example, flip-flops) 981 to 983 and an averaging circuit 99, as shown in FIG. 19B. Here, the number of delay elements 961 to 963 and the number of adders 971 to 974 in the FIR filter of FIG. 19A and the number of delay elements 981 to 983 in the moving average circuit of FIG. 19B are determined in accordance with the variation to be removed (the output of the variation generating circuit 7 supplied via the adder circuit 8), and the variation from the past one period to the present instant in time is removed here. Both the FIR filter of FIG. 19A and the moving average circuit of FIG. 19B can remove the variation applied in the form of a triangular wave whose period consists, for example, of four steps (as well as the variation applied in the form of a zigzag wave such as shown in FIG. 16B). The variation in the form of a zigzag wave can be removed by using, as the variation removal circuit 9, a FIR filter comprising, for example, one delay element (961) and two adders (971 and 972), or a moving average circuit comprising, for example, one delay element (981) and the averaging circuit (99).

FIG. 20 is a block diagram showing another embodiment of the data receiving circuit according to the present invention.

As is apparent from a comparison between FIG. 20 and FIG. 13, the data receiving circuit of this embodiment is configured so that the output of the digital filter 6 is directly supplied to the adder circuit 8, while the output (data discrimination phase control code) of the variation removal circuit 90 is supplied only to the data discrimination clock generating circuit 41. This is because the data discrimination phase control code needs to be supplied to the data discrimination clock generating circuit 41 after removing the variation pattern by the variation removal circuit 90, but the variation pattern need not necessarily be removed by the variation removal circuit 90 from the boundary detection phase control code to be supplied to the boundary detection clock generating circuit 42.

The reason is that the variation in the output of the digital filter 6 supplied to the adder circuit 8 is small compared with the amplitude of the output of the variation generating circuit 7. The data receiving circuit shown in FIG. 20 has the advantage of ensuring feedback stability because the delay through the variation removal circuit 90 is eliminated from the feedback loop on the boundary detection side.

Figure 21:
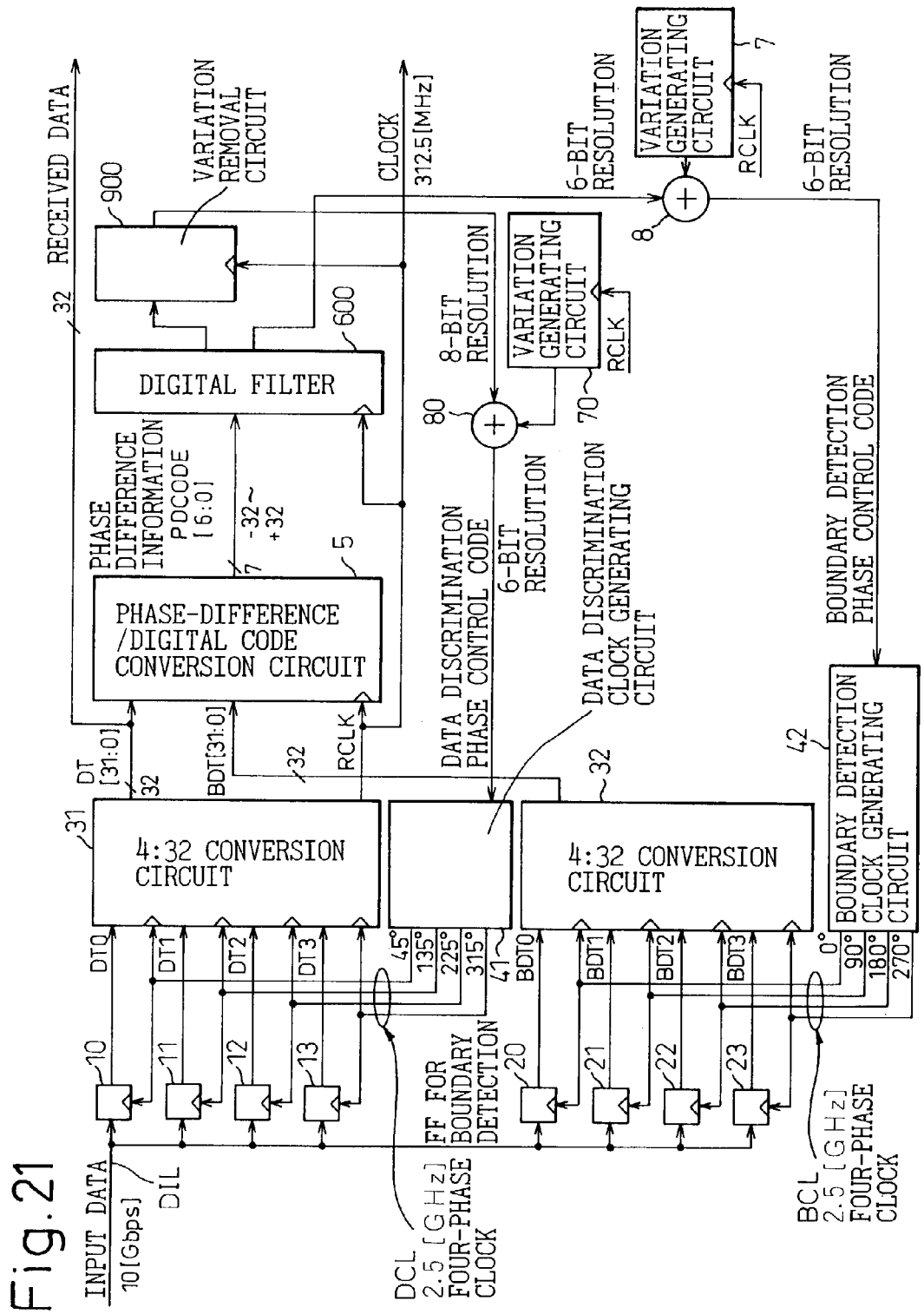
FIG. 21 is a block diagram showing still another embodiment of the data receiving circuit according to the present invention.
Figure 22A:
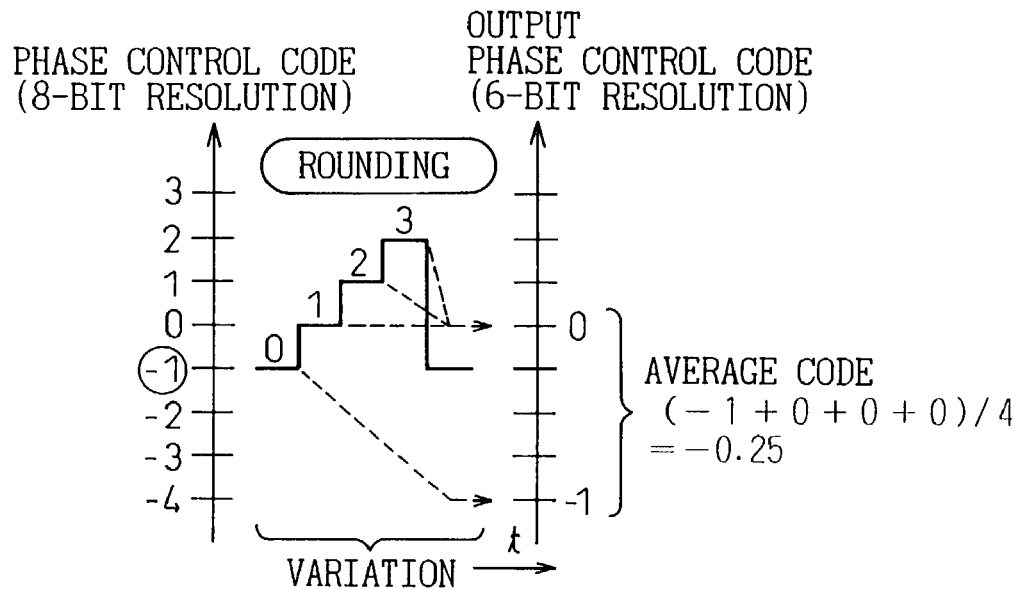
FIGS. 22A and 22B are diagrams for explaining the operation of the data receiving circuit of FIG. 21.
Figure 22B:
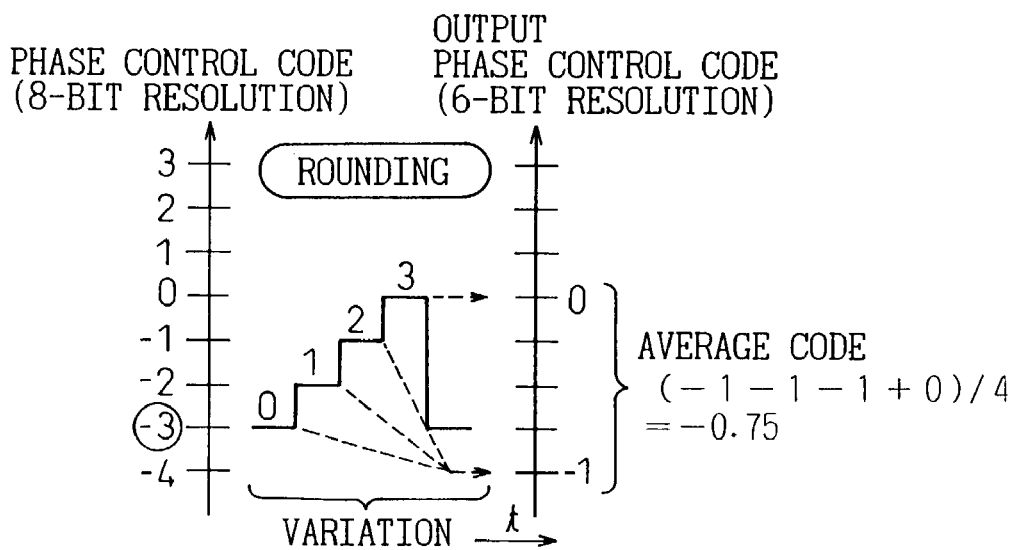

FIG. 21 is a block diagram showing still another embodiment of the data receiving circuit according to the present invention, and FIGS. 22A and 22B are diagrams for explaining the operation of the data receiving circuit of FIG. 21.

As shown in FIG. 21, in the data receiving circuit of this embodiment, the digital filter 600 generates a 6-bit resolution phase control code and supplies it to the adder circuit 8, while supplying an 8-bit resolution phase control code to an adder circuit 80 via the variation removal circuit 900. That is, the digital filter 600 supplies the phase control code, whose resolution (for example, 8 bits) is higher than the resolution (for example, 6 bits) of the data discrimination clock generating circuit 41, to the adder circuit 80 via the variation removal circuit 900, and the adder 80 adds the output (variation) of a variation generating circuit 70 and supplies to the data discrimination clock generating circuit 41 a data discrimination phase control code consisting of the high-order six bits (6-bit resolution) that matches the resolution of the data discrimination clock generating circuit 41. Further, the digital filter 600 supplies the 6-bit resolution phase control code to the adder circuit 8, and the adder circuit 8 adds the output of the variation generating circuit 7 and supplies the resulting boundary detection phase control code to the boundary detection clock generating circuit 42; here, the variation is produced using the triangular wave shown in FIG. 16A or the zigzag wave shown in FIG. 16B, as in the foregoing embodiments. Here, the variation generating circuit 7 is supplied, for example, with a 312.5-MHz internal reference clock RCLK.

In a specific example, if the 8-bit resolution phase control code output from the variation removal circuit 900 (digital filter 600) is "−1", as shown in FIG. 22A; then, when a periodic pattern "0→1→2→3→0→ . . . ", output from the variation generating circuit 70, is added in the adder circuit 80, the 6-bit resolution phase control code (data discrimination phase control code) output from the adder circuit 80 is (−1+0+0+0)/4=−0.25 (average code) as a result of rounding. It is thus shown that the 8-bit resolution phase control code "−1" is converted to the 6-bit resolution phase control code "−0.25".

Also, if the 8-bit resolution phase control code output from the variation removal circuit 900 (digital filter 600) is, for example, "−3", as shown in FIG. 22B; then, when a periodic pattern "0→1→2→3→0→ . . . ", output from the variation generating circuit 70, is added in the adder circuit 80, the 6-bit resolution phase control code output from the adder circuit 80 is (−1−1−1+0)/4=−0.75 (average code) as a result of rounding. It is thus shown that the 8-bit resolution phase control code "−3" is converted to the 6-bit resolution phase control code "−0.75".

In this way, the value of the data discrimination phase control code supplied to the data discrimination clock generating circuit 41, when its average value is taken, exhibits a variation pattern of the same value as the 8-bit resolution code output from the variation removal circuit 900 (digital filter 600).

FIGS. 23A and 23B are diagrams showing examples of the variation added to the data discrimination phase control code in the data receiving circuit of FIG. 21.

As described above, the variation (the output of the variation generating circuit 70) added to the data discrimination phase control code by the adder circuit 80 is a periodic variation pattern (sawtooth wave pattern), such as "0→1→2→3→0→ . . . ", as shown in FIG. 23A; however, this variation pattern may be generated, for example, as a periodic variation pattern (harmonic wave pattern), such as "0→3→1→2→0→ . . . ", as shown in FIG. 23B.

The variation pattern "0→3→1→2→0→ . . . " shown in FIG. 23B has higher frequency components than the variation pattern "0→1→2→3→0→ . . . " shown in FIG. 23A, which means that the 6-bit resolution phase control code obtained by rounding the 8-bit resolution phase control code to which each variation has been added (this is, the input signal to the data discrimination clock generating circuit 41) has higher frequency components in the case of the harmonic wave variation pattern shown in FIG. 23B than in the case of the sawtooth wave variation pattern shown in FIG. 23A. As a result, the variation in the signal averaged by an LPF (low-pass filter: an integrator circuit constructed from CR, shown in FIG. 24) in the data discrimination clock generating circuit 41 is smaller in the case of the harmonic wave variation pattern shown in FIG. 23B than in the case of the sawtooth wave variation pattern shown in FIG. 23A; therefore, the harmonic wave variation pattern shown in FIG. 23B is preferred. It will be appreciated here that the output of the variation generating circuit 70 can be modified in various ways by varying such parameters as the number of bits in the applied phase control code.

Figure 24:
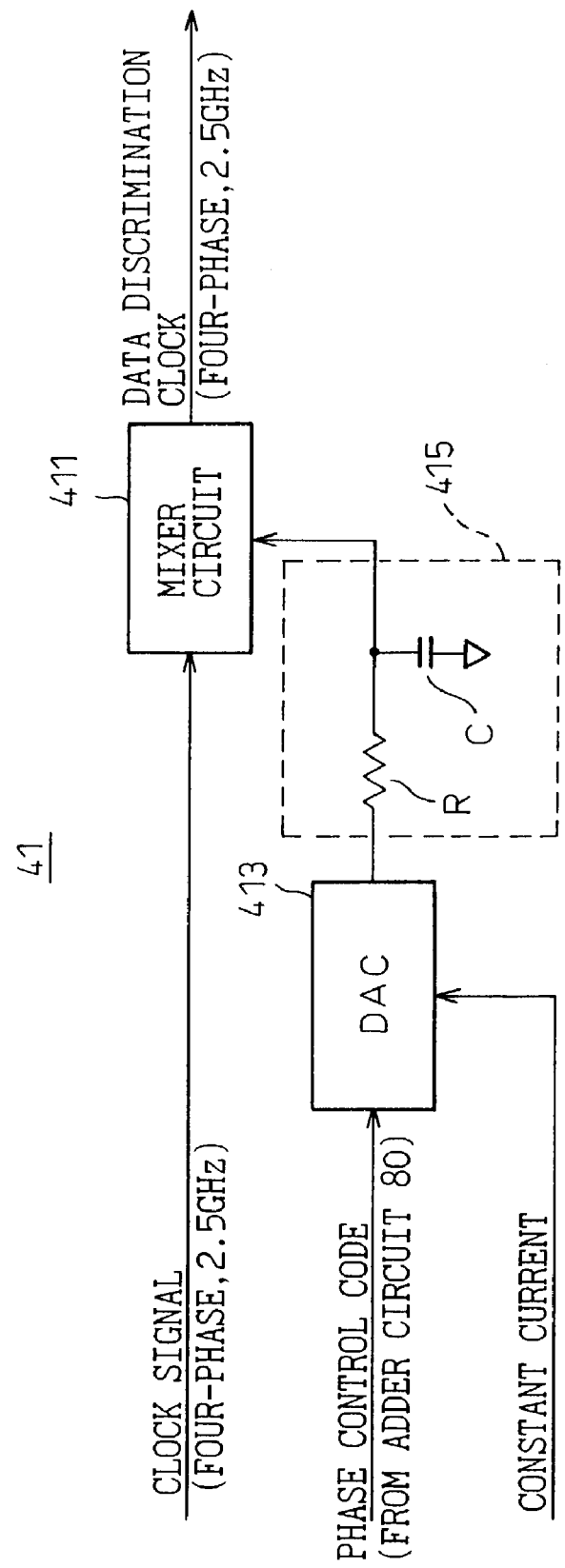
FIG. 24 is a block diagram showing one example of the data discrimination clock generating circuit in the data receiving circuit of FIG. 21.

FIG. 24 is a block diagram showing one example of the data discrimination clock generating circuit in the data receiving circuit of FIG. 21. As shown in FIG. 24, the 6-bit resolution data discrimination phase control code output from the adder circuit 80 is supplied to a DAC 413 in the data discrimination clock generating circuit 41 and, then, is supplied to a mixer circuit 411 via the integrator circuit 415 constructed from CR. The data discrimination phase control code is averaged by the time constant of the integrator circuit 415 constructed from CR, and the actually output phase has a resolution equivalent to 8 bits. Therefore, according to the data receiving circuit of this embodiment, the resolution of the digitally controlled clock generating circuit (data discrimination clock generating circuit 41) can be increased, and thus the quantizing error in the digital control can be reduced.

The data receiving circuit of the embodiment shown in FIG. 21 differs from the data receiving circuit of FIG. 20 by the inclusion of the variation generating circuit 70 and the adder circuit 80, provisions thus being made to convert the data discrimination phase control code output from the digital filter 6 into the 8-bit code.

Figure 25:
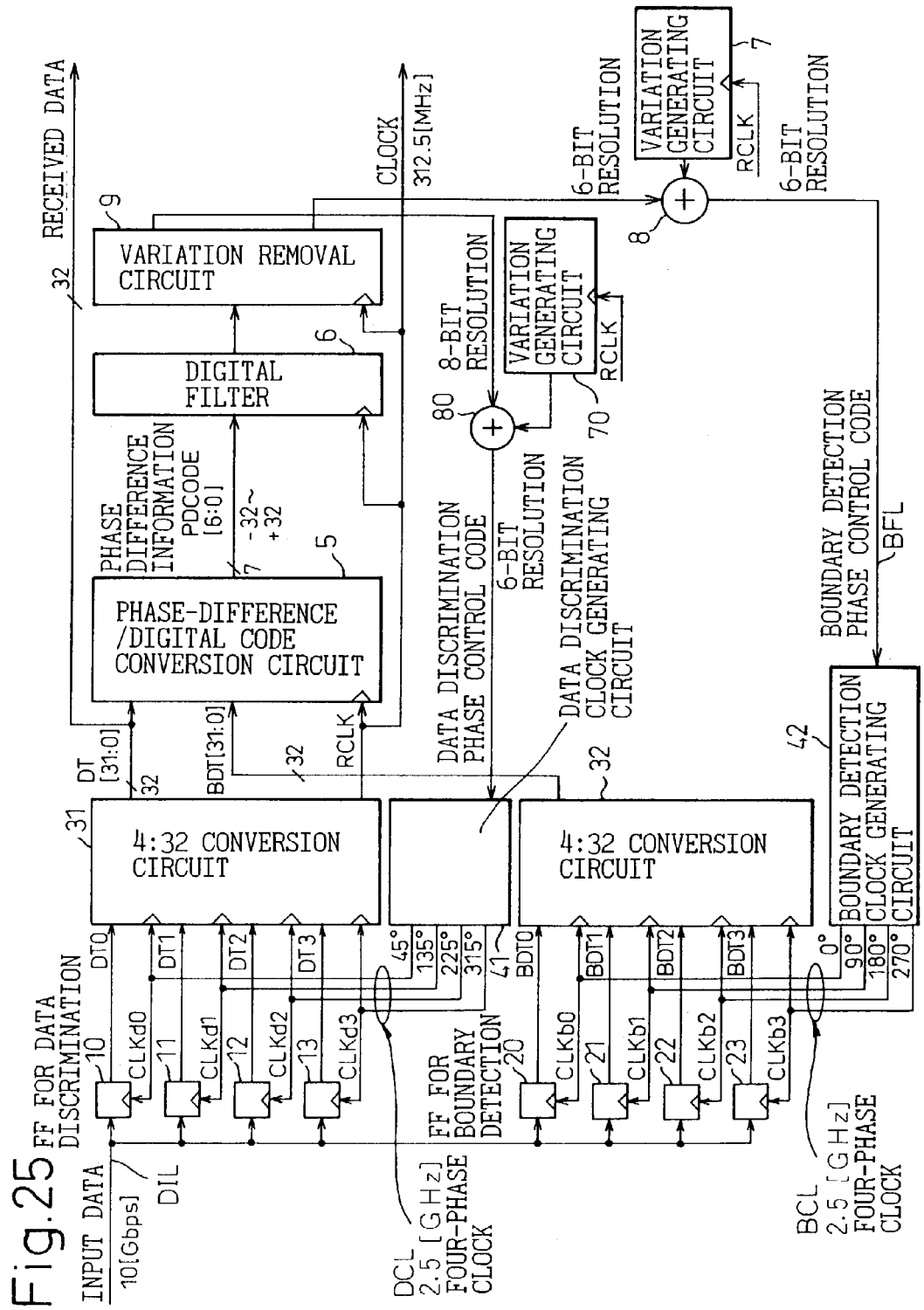
FIG. 25 is a block diagram showing yet another embodiment of the data receiving circuit according to the present invention.

FIG. 25 is a block diagram showing yet another embodiment of the data receiving circuit according to the present invention.

The data receiving circuit of the embodiment shown in FIG. 25 differs from the data receiving circuit of FIG. 13 by the inclusion of the variation generating circuit 70 and the adder circuit 80, provisions thus being made to convert the data discrimination phase control code output from the digital filter 6 into the 8-bit code. In this way, the data receiving circuit of the present invention can be constructed by applying either the first mode (see FIG. 11, etc.) or the second mode (see FIG. 12, etc.) of the invention, or by combining both modes appropriately.

As described in detail above, according to the data receiving circuit (clock recovery circuit) of the present invention, the amplitude of the limit cycle signal and the jitter dependence of the feedback loop characteristic can be reduced, thereby improving the predictability of the characteristics, while at the same time, minimizing the phase noise that occurs with the internal clock being affected by the phase modulation applied for linearization. Furthermore, according to the data receiving circuit (clock recovery circuit) of the present invention, the quantization noise of the clock can also be reduced by increasing the resolution of the phase control code generating circuit.

Before describing the data receiving circuit (clock recovery circuit) according to the second mode of the present invention, the prior art related to the second mode of the invention will be described below.

Figure 26A:
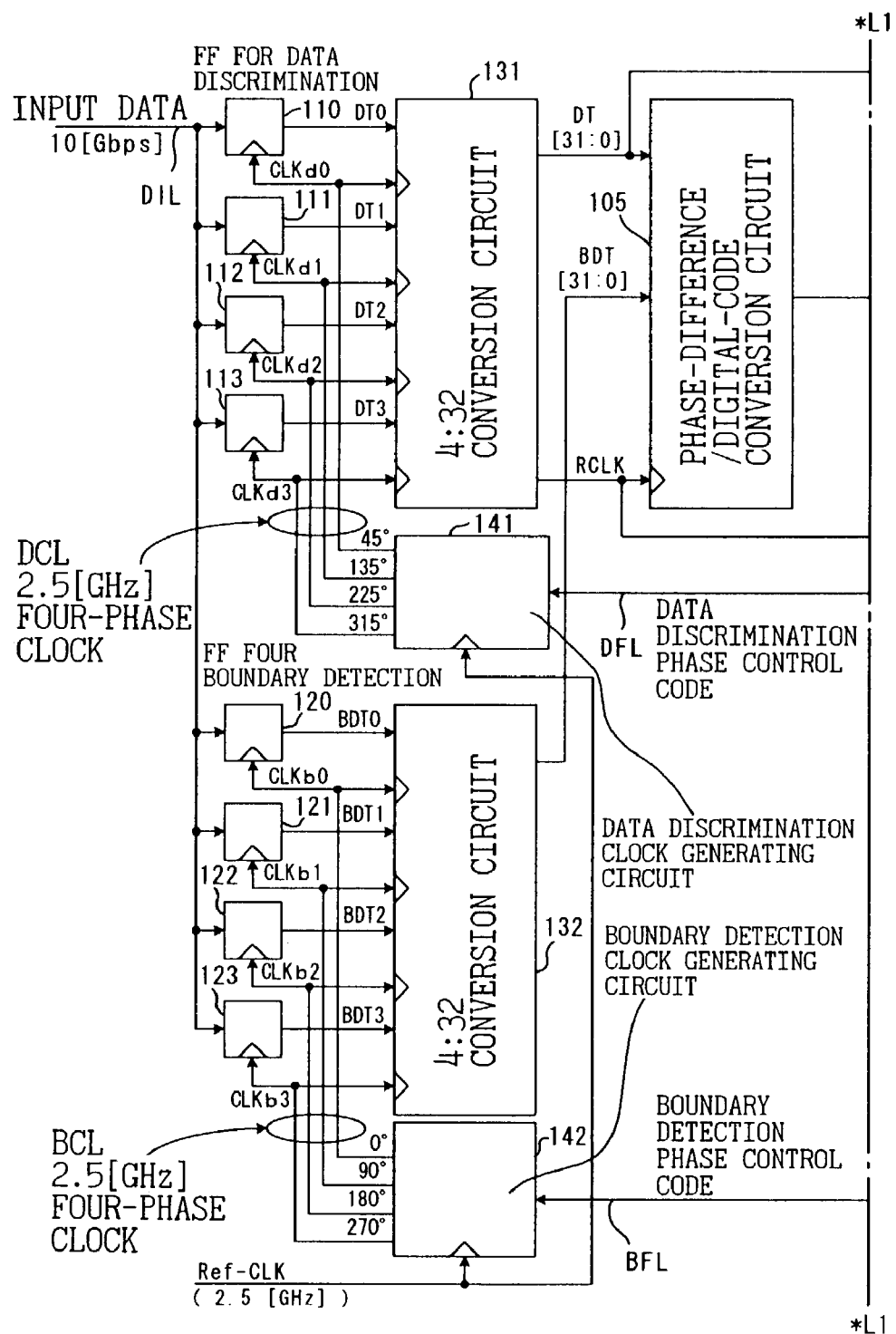
FIGS. 26A and 26B are block diagrams showing one example of a data receiving circuit according to the prior art.
Figure 26B:
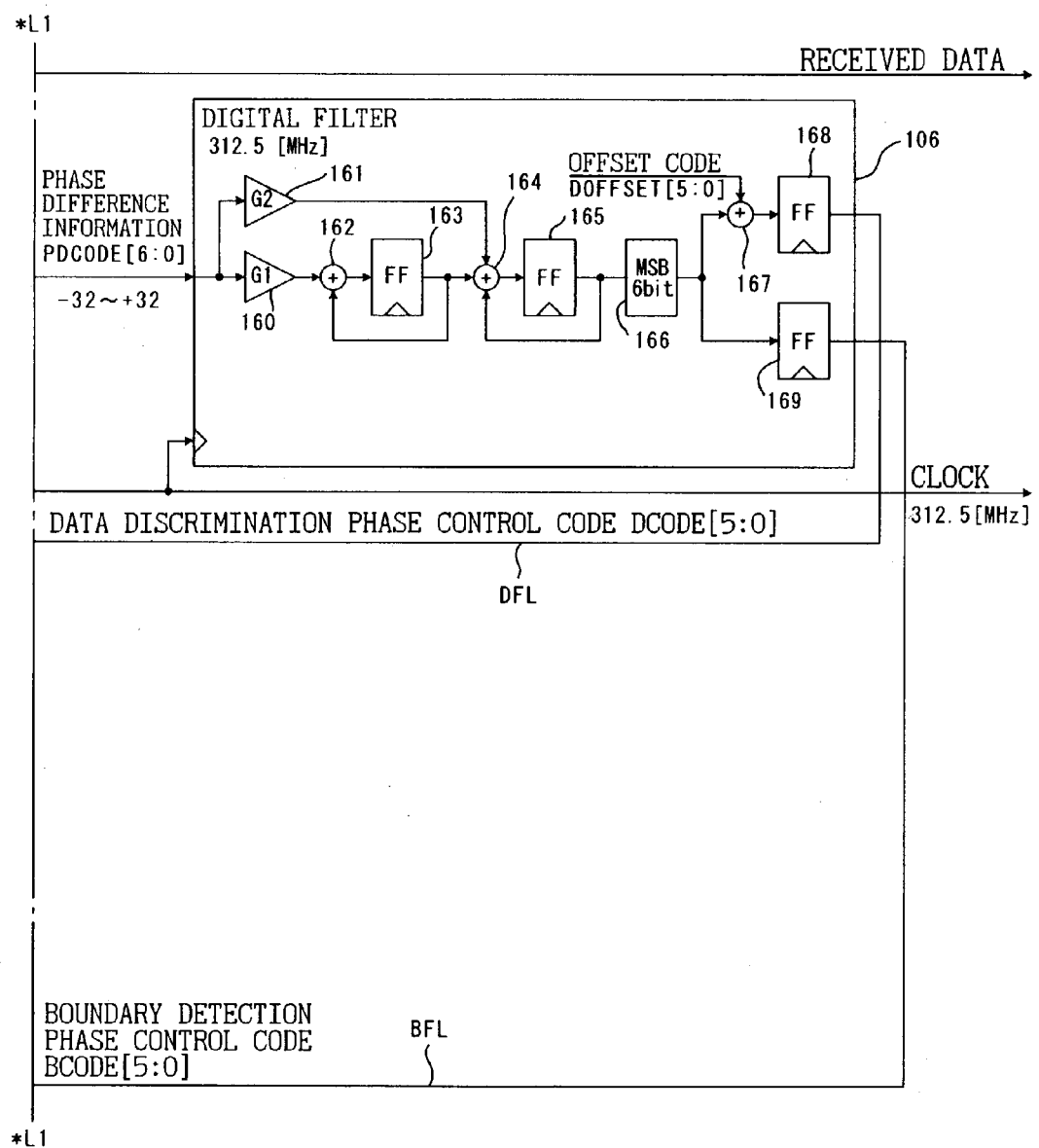
Figure 27:
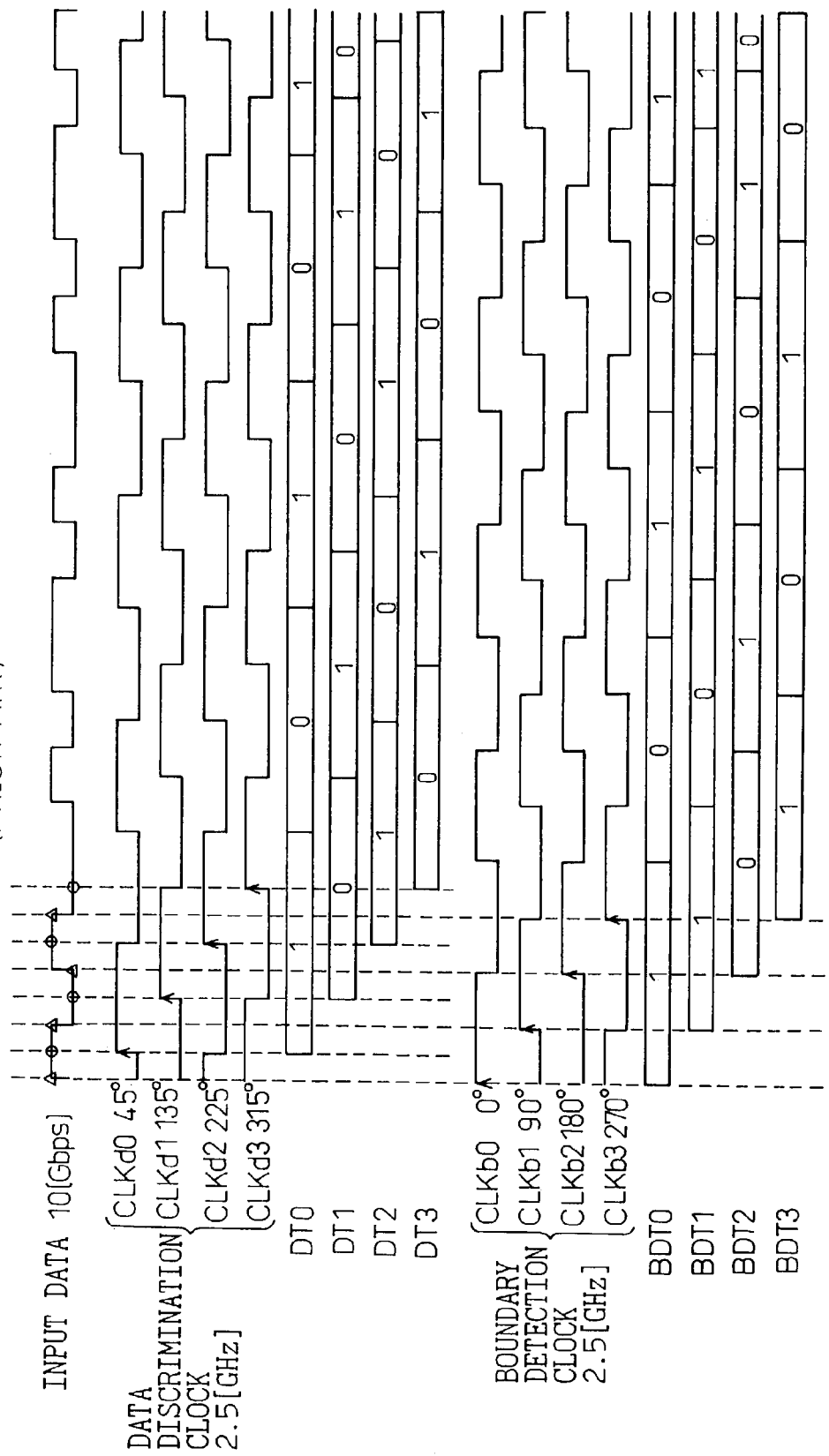
FIG. 27 is a diagram showing the timing of each signal in the data receiving circuit of FIGS. 26A and 26B.

FIGS. 26A and 26B are block diagrams showing one example of the prior art data receiving circuit, wherein the circuit is configured as a 4-way×2 type interleaving circuit using CDR. FIG. 27 is a diagram showing the timing of each signal in the data receiving circuit of FIGS. 26A and 26B.

In FIGS. 26A and 26B, reference numerals 110 to 113 are data discrimination units (flip-flops for data discrimination, forming a data discrimination circuit), 120 to 123 are boundary detection units (flip-flops for boundary detection, forming a boundary detection circuit), and 131 and 132 are data and boundary conversion circuits, respectively. Further, reference numeral 141 is a data discrimination clock generating circuit, 142 is a boundary detection clock generating circuit, 105 is a phase-difference/digital-code conversion circuit (PDC: Phase to Digital Converter), and 106 is a digital filter. On the other hand, reference character DIL is a data input line, DCL is a data discrimination clock line, BCL is a boundary detection clock line, and DFL and BFL are data and boundary feedback lines, respectively.

As shown in FIGS. 26A and 26B, in the prior art data receiving circuit, the data input line DIL which carries, for example, 10-Gbps data is connected to the inputs of the four data discrimination units 110 to 113 and four boundary detection units 120 to 123, which respectively latch the data by their corresponding 2.5-GHz clocks.

More specifically, as shown in FIGS. 26A, 26B, and 27, the data discrimination units 110 to 113 are supplied with four phase clocks CLKd0 to CLKd3, respectively, from the data discrimination clock generating circuit 141, the clocks being 2.5 GHz in frequency and differing in phase by 90° (for example, the phases are 45°, 135°, 225°, and 315°, respectively). The input data are latched with the phase timings of 45°, 135°, 225°, and 315°, respectively, and the received data DT0 to DT3 are supplied to the conversion circuit 131. The conversion circuit 131 converts the received data DT0 to DT3, each being one-bit data synchronized to the 2.5-GHz clock, into 32-bit data (DT [31:0]) synchronized to a 312.5 MHz clock, and supplies this received data (DT [31:0]) to the circuit (an internal circuit) at the next stage, as well as to the phase-difference/digital-code conversion circuit 105. Further, the conversion circuit 131 supplies the 312.5-MHz internal reference clock RCLK to the phase-difference/digital-code conversion circuit 105 and the digital filter 106.

Likewise, the boundary detection units 120 to 123 are supplied with four phase clocks CLKb0 to CLKb3, respectively, from the boundary detection clock generating circuit 142, the clocks being 2.5 GHz in frequency and differing in phase by 90° (for example, the phases are 0°, 90°, 180°, and 270°, respectively). Boundaries of the input data are detected with the phase timings of 0°, 90°, 180°, and 270°, respectively, and the boundary detection data BDT0 to BDT3 are supplied to the conversion circuit 132. The conversion circuit 132 converts the boundary detection data BDT0 to BDT3, each being one-bit data synchronized to the 2.5-GHz clock, into 32-bit data (BDT [31:0]) synchronized to a 312.5 MHz clock, and supplies the thus converted data to the phase-difference/digital-code conversion circuit 105. Here, the four phase clocks CLKd0 to CLKd3 output from the data discrimination clock generating circuit 141 have a phase difference of 45° with respect to the four phase clocks CLKb0 to CLKb3 output from the boundary detection clock generating circuit 142. The data discrimination clock generating circuit 141 and the boundary detection clock generating circuit 142 are supplied with a 2.5-GHz clock Ref-CLK.

The phase-difference/digital-code conversion circuit 105 compares the thus input received data DT [31:0] and boundary detection data BDT [31:0], and outputs 7-bit phase difference information (PDCODE [6:0, −32 to +32]) to the digital filter 106. The digital filter 106 feeds back a 6-bit resolution data discrimination phase control code (DCODE [5:0]) to the data discrimination clock generating circuit 141 via the feedback line DFL, and also feeds back a 6-bit resolution boundary detection phase control code to the boundary detection clock generating circuit 142 via the feedback line BFL. In FIG. 27, the data latch timings (rise timings) of the boundary detection clocks CLKb0 to CLKb3 are at the boundary positions of the input data; here, the diagram is developed by assuming that the boundary detection data BDT0 to BDT3 latched by the boundary detection units 120 to 123 are 1, 1, 0, 1, and so on.

The digital filter 106 comprises a buffer 160 which gives a gain G1 to the phase difference information PDCODE [6:0], a buffer 161 which gives a gain G2, adders 162, 164, and 167, flip-flops 163, 165, 168, and 169, and a filter 166 for extracting the high-order six bits. The adder 162 sums the outputs of the buffer 160 and the flip-flop 163, and feeds back the resulting sum to the flip-flop 163. The adder 164 sums the outputs of the buffer 161, the flip-flop 163, and the flip-flop 165, and feeds back the resulting sum to the flip-flop 165.

The filter 166 receives the output of the flip-flop 165 and supplies the high-order six bits to the adder 167 and the flip-flop 169. The adder 167 adds an offset code (DOFFSET [5:0]) to the output of the filter 166 and supplies the sum to the flip-flop 168. Then, the output of the flip-flop 168 is fed back as the 6-bit resolution data discrimination phase control code to the data discrimination clock generating circuit 141 via the feedback line DFL; on the other hand, the output of the flip-flop 169 is fed back as the 6-bit resolution boundary detection phase control code to the boundary detection clock generating circuit 142 via the feedback line BFL. Here, the flip-flops 163, 165, 168, and 169 are each controlled by the 312.5-MHz clock (312.5-MHz internal reference clock RCLK).

In the above-described bang-bang type phase comparator (data receiving circuit), the outputs of the data discrimination circuit and the boundary detection circuit (data discrimination units 110 to 113 and boundary detection units 120 to 123) are digital data. Accordingly, the feedback circuit for adjusting the internal clock phase based on the result of the phase comparison can be constructed using a digital circuit. In this case, if so-called phase interpolators are used as internal clock generating circuits (data discrimination clock generating circuit 141 and boundary detection clock generating circuit 142), the clock phase can be directly adjusted by a control code generated by the digital circuit. When a CDR feedback loop is constructed using a digital circuit and a phase interpolator, the advantage is that, because of its digital nature, not only can the characteristics be controlled easily, but also various functions can be added easily in accordance with system requirements. One such prior art data receiving circuit is described as the prior art, for example, in Japanese Unexamined Patent Application No. 2002-112347 (refer, for example, to Patent Document 1).

Figure 28:
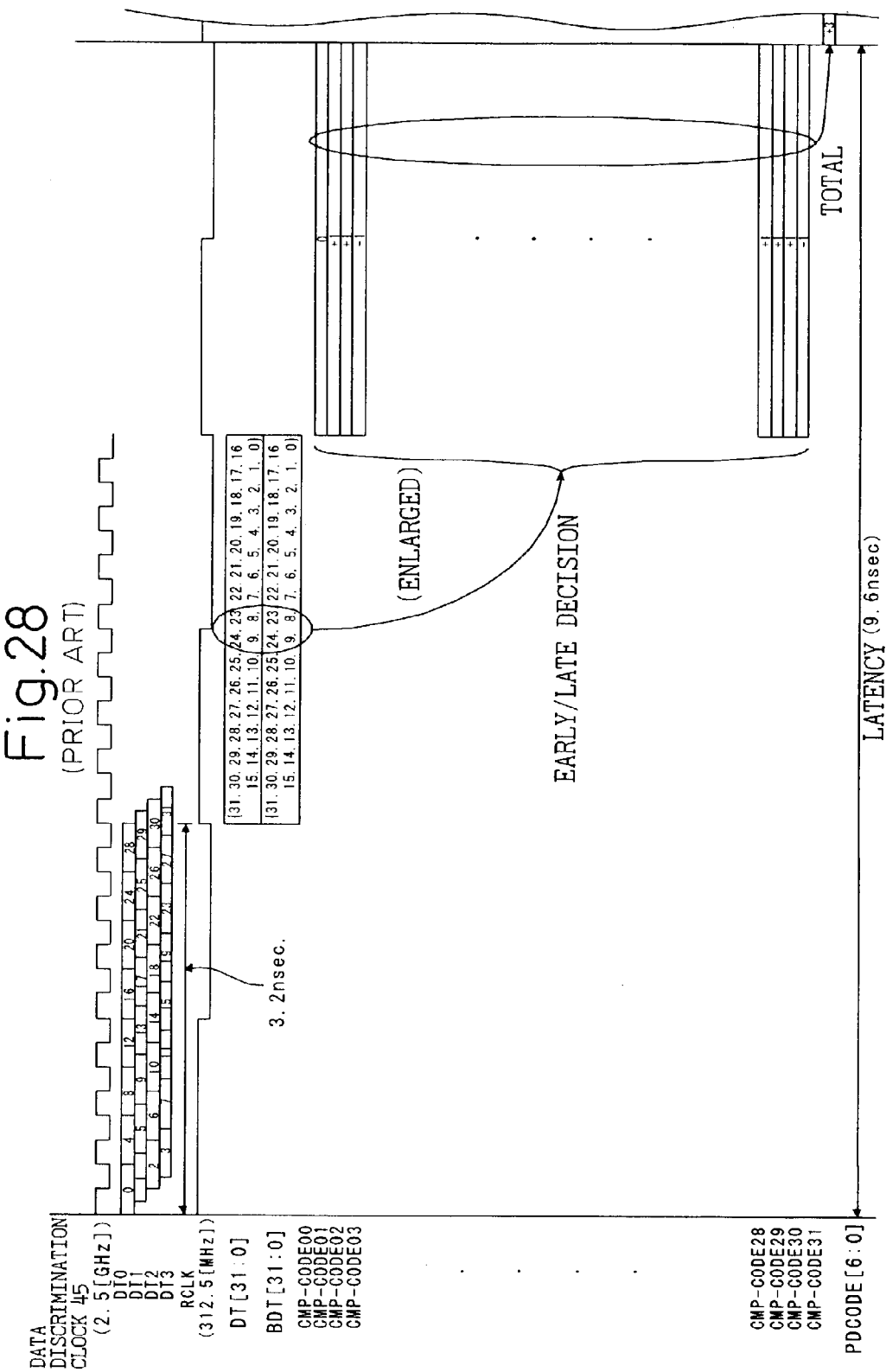
FIG. 28 is a diagram (part 1) for explaining latency in the data receiving circuit of FIGS. 26A and 26B.
Figure 29:
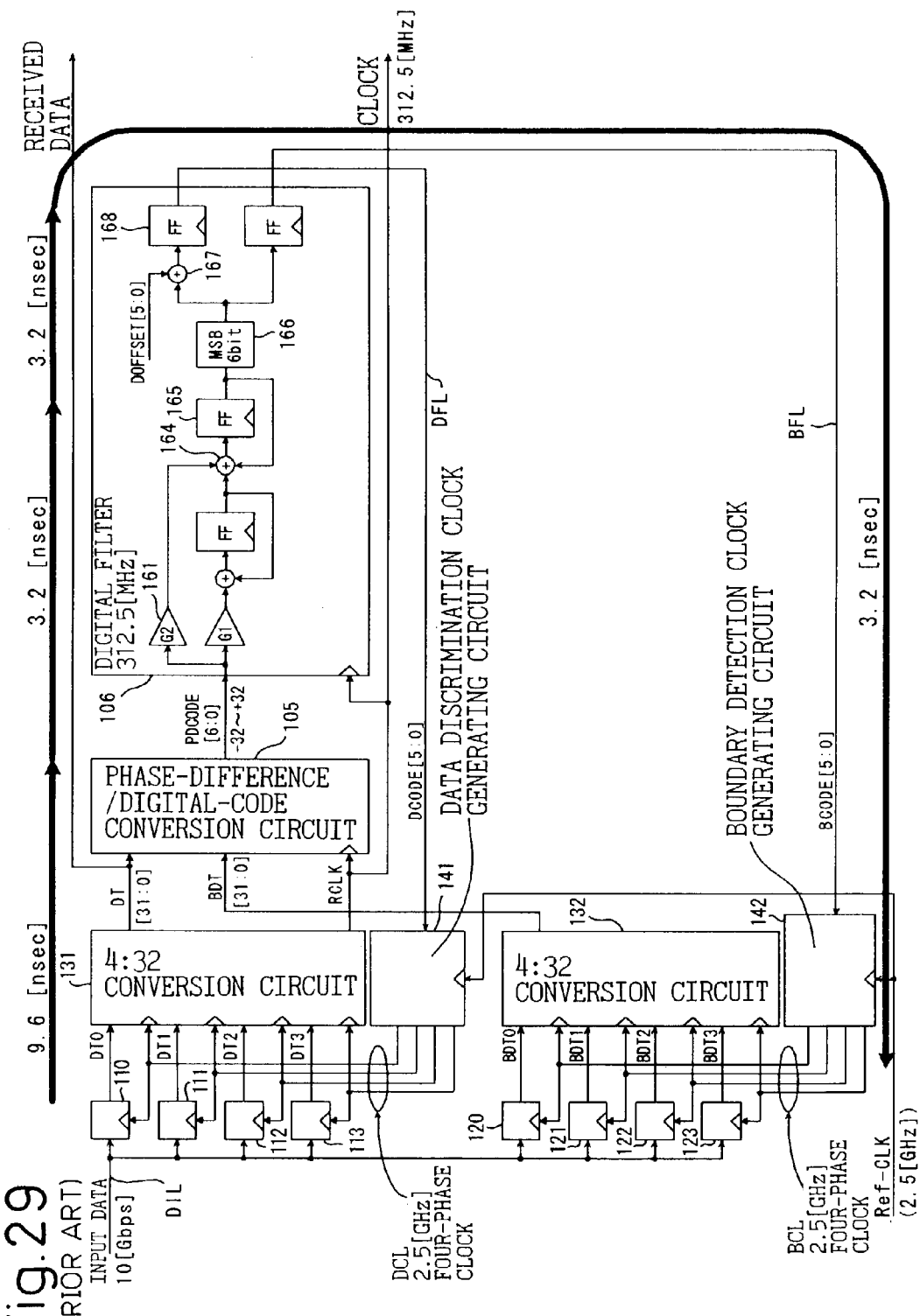
FIG. 29 is a diagram (part 2) for explaining latency in the data receiving circuit of FIGS. 26A and 26B.

FIGS. 28 and 29 are diagrams for explaining latency in the data receiving circuit of FIGS. 26A and 26B. Here, FIG. 28 shows the timing of each signal from the moment the data discrimination flip-flops 110 to 113 output the received data DT0 to DT3 to the moment the phase-difference/digital-code conversion circuit 105 generates the phase difference information PDCODE [6:0], while FIG. 29 shows the latency (signal delay) in the feedback loop for generating the data discrimination clock in the data receiving circuit of FIGS. 26A and 26B.

In FIG. 28, reference characters CMP-CODE00 to CMP-CODE31 are signals each indicating the result of the decision as to whether the timing is early or late; these signals are combined together and output as the phase difference information PDCODE [6:0] with a latency of 9.6 nsec (the time equal to three cycles of the 312.5-MHz internal reference clock RCLK).

In the digital filter 106, the feedback loop, starting from the buffer 161 which introduces the gain G2 and passing through the adder 164, flip-flop 165, filter 166, and flip-flop 169, determines the cutoff frequency. For simplicity of explanation, it is assumed that the latency (signal delay) of each element does not include interconnect propagation delays, etc.

That is, in the feedback loop shown in FIG. 29, not only the latency of 9.6 nsec from the moment the data discrimination units 110 to 113 output the received data DT0 to DT3 and the boundary detection units 120 to 123 output the boundary detection data BDT0 to BDT3 (i.e., the moment the received data DT0 to DT3 and the boundary detection data BDT0 to BDT3 are input to the conversion circuit 131) to the moment the phase-difference/digital-code conversion circuit 105 outputs the phase difference information PDCODE [6:0], but also the latency of 6.4 nsec from the moment the phase-difference/digital-code conversion circuit 105 outputs the phase difference information PDCODE [6:0] (i.e., the moment the phase difference information PDCODE [6:0] is input to the digital filter 106) to the moment the digital filter 106 outputs the boundary detection phase control code BCODE [5:0] and the latency of 3.2 nsec from the moment the digital filter 106 outputs the boundary detection phase control code BCODE [5:0] (i.e., the moment the boundary detection phase control code BCODE [5:0] is input to the boundary detection clock generating circuit 142) to the moment the boundary detection clock generating circuit 142 outputs the boundary detection clocks CLKb0 to CLKb3 (i.e., the moment the four phase clocks CLKb0 to CLKb3 are input to the boundary detection units 120 to 123) are added together to provide a total latency of 19.2 nsec which is the latency of the feedback loop that determines the cutoff frequency.

Here, a higher cutoff frequency means that the clock recovery loop can track up to a correspondingly higher frequency, and therefore, increasing the cutoff frequency is effective in increasing the input jitter tolerance.

[Patent Document 1]

Japanese Unexamined Patent Application No. 2002-112347

[Problems to be Solved by the Invention]

As described above, the clock recovery circuit (data receiving circuit) using the prior art digital circuit has the advantage that addition and changes of functions are easy, but the problem is that a feedback loop with a high cutoff frequency is difficult to construct. That is, the latency of the feedback system (the amount of delay through the feedback loop that determines the cutoff frequency of the loop) becomes as large as 19.2 nsec, for example.

More specifically, the clock frequency of the digital circuit is chosen to be about 100 MHz to 200 MHz, for example, by considering the ease of design, but if the data transfer rate is as high as several gigabits to several tens of gigabits per second, the delay equivalent to several clock cycles amounts to several hundred UIs (where 1 UI (Unit Interval) corresponds to 1 bit time). This amount of delay accounts for a significant percentage with respect to the reciprocal (for example, 2000 UIs to 3000 UIs) of the cutoff frequency required of the feedback circuit for clock recovery, and as a result, there arises the problem that the stability of the loop drops (the response of the feedback circuit becomes oscillatory).

This problem worsens as the data transfer rate increases, and the reality is that the data transfer rate has been increasing to meet system requirements, while the operating speed of logic circuits can be improved only slowly with advances in process technology and a drastic improvement cannot be expected; as a result, logic delays measured in UIs tend to increase further.

It is an object of the second mode of the present invention to provide a data receiving circuit (clock recovery circuit) which can achieve a high cutoff frequency while maintaining the stability of the loop by reducing the signal delay through the feedback loop that determines the cutoff frequency of the loop. It is another object of the second mode of the present invention to provide a data receiving circuit (clock recovery circuit) which is capable of stable operation even when the recovered clock is not stable during power on, etc. and for which a simulation can be performed easily.

Embodiments of the data receiving circuit (clock recovery circuit) according to the second mode of the present invention will be described in detail below with reference to the accompanying drawings.

Figure 30A:
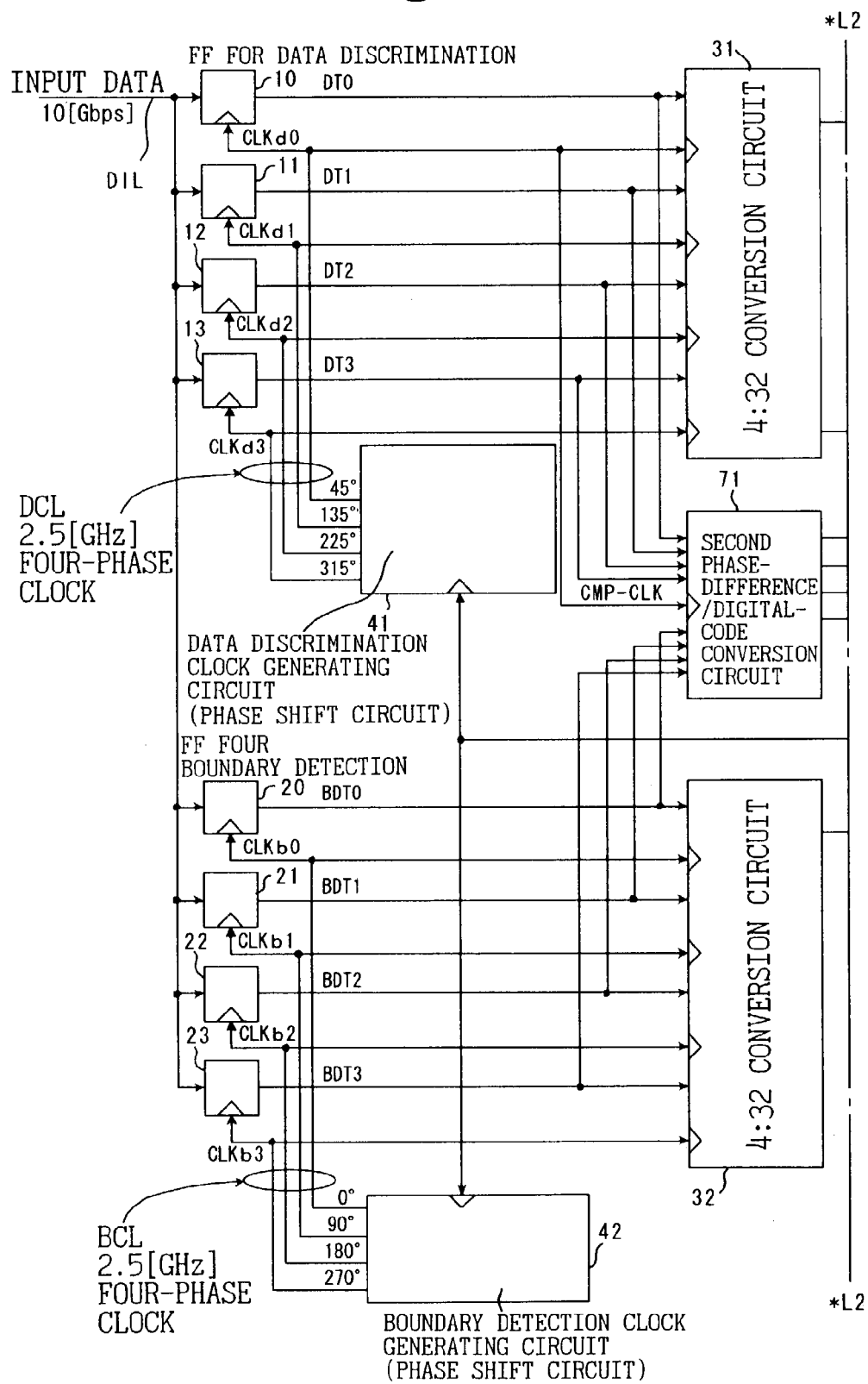
FIGS. 30A and 30B are block diagrams showing a first embodiment of the data receiving circuit according to the second mode of the present invention.
Figure 30B:
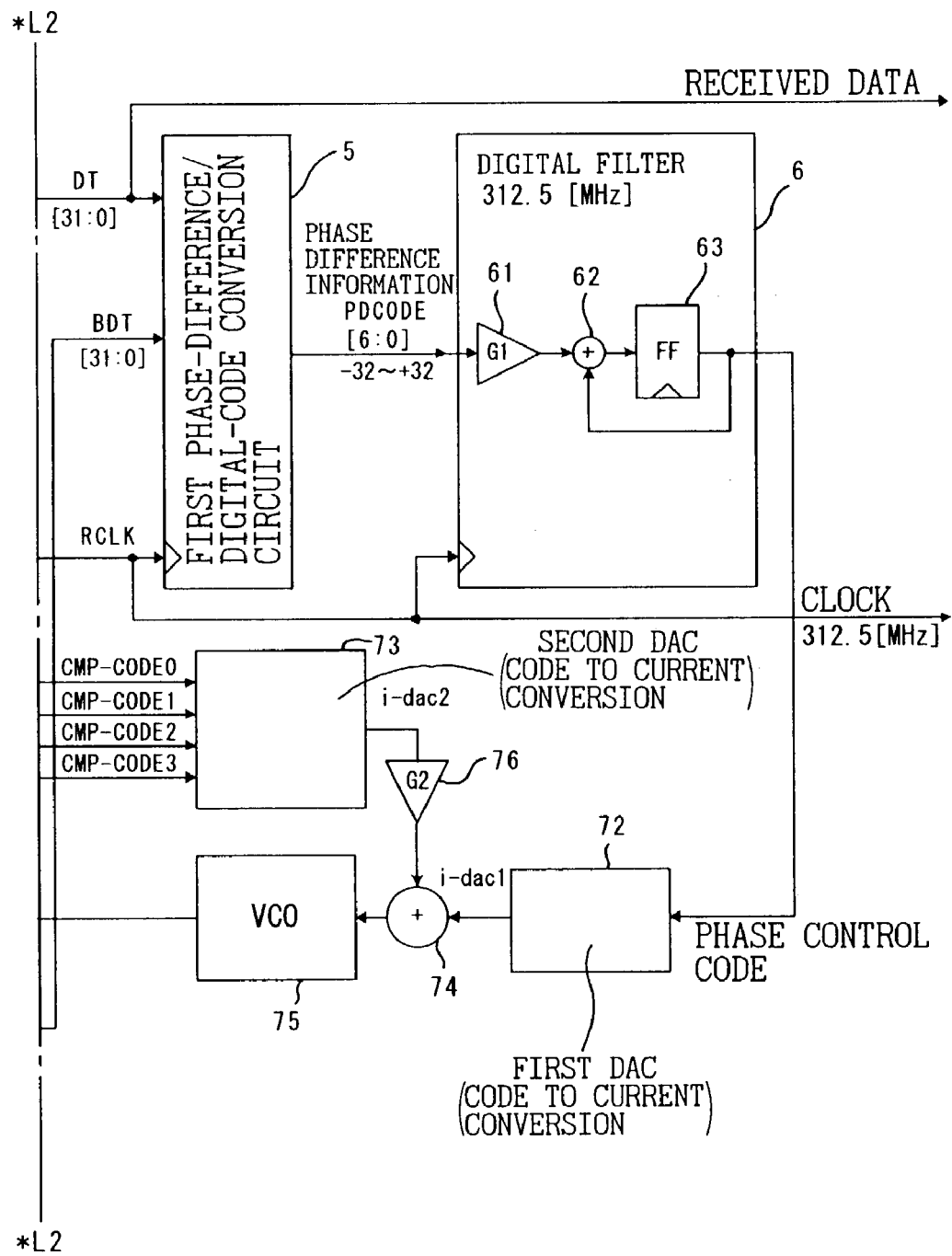

FIGS. 30A and 30B are block diagrams showing a first embodiment of the data receiving circuit according to the second mode of the present invention, wherein the circuit is configured as a 4-way×2 type interleaving circuit using CDR.

In FIGS. 30A and 30B, reference numerals 10 to 13 are data discrimination units (flip-flops for data discrimination, forming a data discrimination circuit), 20 to 23 are boundary detection units (flip-flops for boundary detection, forming a boundary detection circuit), 31 and 32 are data and boundary conversion circuits, respectively, 41 is a data discrimination clock generating circuit, 42 is a boundary detection clock generating circuit, 5 is a first phase-difference/digital-code conversion circuit, and 6 is a digital filter. Further, reference numeral 71 is a second phase-difference/digital-code conversion circuit, 72 is a first digital/analog converter (DAC), 73 is a second DAC, 74 is an adder, 75 is a voltage-controlled oscillator (VCO), and 76 is a buffer (current amplifier) which introduces a gain G2. On the other hand, reference character DIL is a data input line, DCL is a data discrimination clock line, and BCL is a boundary detection clock line.

As shown in FIGS. 30A and 30B, in the data receiving circuit of the first embodiment according to the second mode of the invention, the data input line DIL which carries, for example, 10-Gbps data is connected to the inputs of the four data discrimination units 10 to 13 and four boundary detection units 20 to 23, which respectively latch the data by their corresponding 2.5-GHz clocks.

More specifically, in the data receiving circuit of the first embodiment according to the second mode of the invention, as in the prior art data receiving circuit described with reference to FIGS. 26A, 26B, and 27, the data discrimination units 10 to 13 are supplied with four phase clocks CLKd0 to CLKd3, respectively, from the data discrimination clock generating circuit (phase shift circuit) 41, the clocks being 2.5 GHz in frequency and differing in phase by 90° (for example, the phases are 45°, 135°, 225°, and 315°, respectively). The input data are latched with the phase timings of 45°, 135°, 225°, and 315°, respectively, and the received data DT0 to DT3 are supplied to the second phase-difference/digital-code conversion circuit 71 as well as to the conversion circuit 31. Here, CLKd0 output from the data discrimination clock generating circuit 41 is supplied as a comparison clock CMP-CLK to the second phase-difference/digital-code conversion circuit 71.

The conversion circuit 31 converts the received data DT0 to DT3, each being one-bit data synchronized to the 2.5-GHz clock, into 32-bit data (DT [31:0]) synchronized to a 312.5 MHz clock, and supplies this received data (DT [31:0]) to the circuit (an internal circuit) at the next stage, as well as to the first phase-difference/digital-code conversion circuit 5. Further, the conversion circuit 31 supplies the 312.5-MHz internal reference clock RCLK to the first phase-difference/digital-code conversion circuit 5 and the digital filter 6.

Likewise, the boundary detection units 20 to 23 are supplied with four phase clocks CLKb0 to CLKb3, respectively, from the boundary detection clock generating circuit (phase shift circuit) 42, the clocks being 2.5 GHz in frequency and differing in phase by 90° (for example, the phases are 0°, 90°, 180°, and 270°, respectively). Boundaries of the input data are detected with the phase timings of 0°, 90°, 180°, and 270°, respectively, and the boundary detection data BDT0 to BDT3 are supplied to the second phase-difference/digital-code conversion circuit 71 as well as to the conversion circuit 32. The conversion circuit 32 converts the boundary detection data BDT0 to BDT3, each being one-bit data synchronized to the 2.5-GHz clock, into 32-bit data (BDT [31:0]) synchronized to a 312.5 MHz clock, and supplies the thus converted data to the first phase-difference/digital-code conversion circuit 5. Here, the four phase clocks CLKd0 to CLKd3 output from the data discrimination clock generating circuit 41 have a phase difference of 45° with respect to the four phase clocks CLKb0 to CLKb3 output from the boundary detection clock generating circuit 42.

The first phase-difference/digital-code conversion circuit 5 compares the thus input received data DT [31:0] and boundary detection data BDT [31:0], and outputs 7-bit phase difference information (PDCODE [6:0, −32 to +32] to the digital filter 6. The digital filter 6 comprises a buffer 61 which introduces a gain G1, an adder 62, and a flip-flop 63. More specifically, as is apparent from a comparison between FIGS. 30A, 30B and FIGS. 26A, 26B, the digital filter 6 in the data receiving circuit of the first embodiment according to the second mode of the invention is constructed using only the buffer 161, the adder 162, and the flip-flop 163 that form part of the digital filter 106 in the prior art data receiving circuit. Here, the flip-flop 63 is controlled by the 312.5-MHz clock (internal reference clock RCLK).

The output of the digital filter 6 is supplied to the first DAC 72, and a signal (i-dac1) produced in the first DAC 72 by converting the digital code into a current is input to the adder 74. The output (CMP-CODE0 to CMP-CODE3) of the second phase-difference/digital-code conversion circuit 71 is supplied to the second DAC 73, and a signal (i-dac2) in the second DAC 73 produced by converting the digital code into a current is input to the adder 74 via the buffer 76 that introduces the gain G2. The output of the adder 74 is supplied via the VCO 75 to the data discrimination clock generating circuit 41 and the boundary detection clock generating circuit 42 for feedback control of the data discrimination clocks CLKd0 to CLKd3 and the boundary detection clocks CLKb0 to CLKb3. Here, the VCO 75 converts the output (current) of the adder (current adder) 74 into a voltage, and outputs a signal whose frequency is proportional to the voltage value.

As described above, in the data receiving circuit of the first embodiment according to the second mode of the invention, the received data (input data), for example, at 10 Gbps is converted by the four data discrimination units 10 to 13 and boundary detection units 20 to 23 into 2.5-Gbps, 4-bit digital signals (the received data DT0 to DT3 and the boundary detection data BDT0 to BDT3), which are further converted by the respective conversion circuits 31 and 32 into 32-bit parallel digital data (the received data DT [31:0] and the boundary detection data BDT [31:0]). On the digital circuit side are provided the phase detection circuits (the first phase-difference/digital-code conversion circuit 5 and the second phase-difference/digital-code conversion circuit 71: Phase-to-Digital Converters (PDCs)) that perform phase comparisons based on the received data (DT0 to DT3 and DT [31:0]) and the boundary detection data (BDT0 to BDT3 and BDT [31:0]).

The output (PDCODE [6:0]) of the first phase-difference/digital-code conversion circuit 5 is first processed by the digital filter 6, and then converted by the first DAC 72 into a current for input to the adder 74. On the other hand, the output (CMP-CODE0 to CMP-CODE3) of the second phase-difference/digital-code conversion circuit 71 is converted by the second DAC 73 into a current which is input to the adder 74 via the buffer 76. Here, the processing that the digital filter 6 performs is essentially an integration; therefore, input values are added up in the register (flip-flop 63) through the adder 62. The open loop gain of this first feedback loop (data discrimination units 10 to 13 and boundary detection units 20 to 23→conversion circuits 31 and 32→first phase-difference/digital-code conversion circuit 5→digital filter 6→first DAC 72→adder 74→VCO 75→data discrimination clock generating circuit 41 and boundary detection clock generating circuit 42) is G1/S in an s-space approximate representation.

In the first embodiment (and subsequent embodiments) according to the second mode of the present invention, low latency is achieved by adding a second feedback loop in the control loop. To achieve low latency, in the second feedback loop, the outputs of the data discrimination units 10 to 13 and the outputs of the boundary detection units 20 to 23 are not passed through the respective conversion circuits 31 and 32, but are directly fed to the second phase-difference/digital-code conversion circuit 71 for phase comparison, and the resulting phase difference value is supplied to the second DAC 73 and input via the buffer 76 to the adder 74. In this second feedback loop (data discrimination units 10 to 13 and boundary detection units 20 to 23→second phase-difference/digital-code conversion circuit 71→second DAC 73→buffer 76→adder 74→VCO 75→data discrimination clock generating circuit 41 and boundary detection clock generating circuit 42), low latency can be achieved because the second phase-difference/digital-code conversion circuit 71 and the second DAC 73 are driven by the comparison clock CMP-CLK (data discrimination clock CLKd0: 2.5 GHz) which is faster, for example, than the operating clock RCLK (312.5 MHz) of the first phase-difference/digital-code conversion circuit 5 and the first DAC 72. The contribution of this low-latency loop (second feedback loop) is G2 and, considering that the summation is performed in the register, the total open loop gain is given by $$(G1/s+G2)/S=G1/S^2+G2/s$$

This coincides with the usual second-order phase feedback loop characteristic.

Here, the factor that determines the cutoff frequency of the loop is G2 (the cutoff frequency is given by $1/(2\Pi G2)$). Accordingly, stable operation can be achieved by reducing the latency of the loop that determines G2. On the other hand, in the loop containing G1, since the cutoff is performed at a lower frequency, stability is not affected even if its latency is large.

In this way, according to the data receiving circuit (clock recovery circuit) of the first embodiment according to the second mode of the present invention, since the amount of delay through the feedback loop (second feedback loop) that determines the cutoff frequency of the loop can be reduced as described above, a high cutoff frequency can be achieved while maintaining the stability of the loop. Furthermore, the data receiving circuit of the first embodiment according to the second mode of the invention can provide a high cutoff frequency, and can thus increase the input jitter tolerance by enabling the clock recovery loop to track up to a correspondingly higher frequency.

Figure 31:
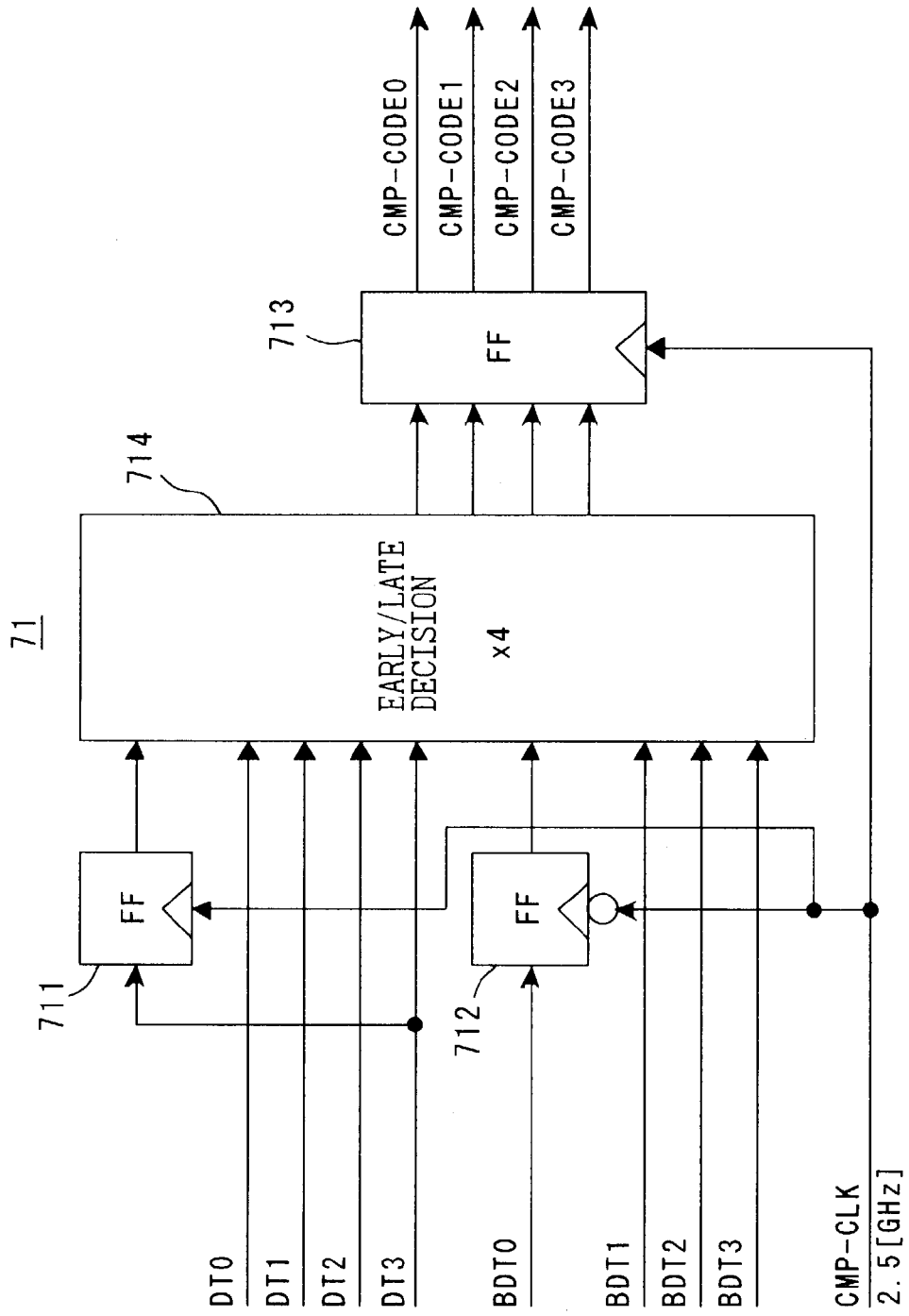
FIG. 31 is a block diagram showing one example of a second phase-difference/digital-code conversion circuit in the data receiving circuit of FIGS. 30A and 30B.

FIG. 31 is a block diagram showing one example of the second phase-difference/digital-code conversion circuit 71 in the data receiving circuit of FIGS. 30A and 30B.

As shown in FIG. 31, the second phase-difference/digital-code conversion circuit 71 comprises flip-flops 711, 712, and 713, and a timing decision circuit 714 which compares the received data DT0 to DT3 with the boundary detection data BDT0 to BDT3 and decides whether the timing is early or late. The flip-flops 711 and 713 are controlled by the comparison clock CMP-CLK (data discrimination clock CLKd0: positive logic), while the flip-flop 712 is controlled by the comparison clock CMP-CLK (negative logic). The flip-flop 713 supplies the signals CMP-CODE0 to CMP-CODE3, each indicating the result of the decision as to whether the phase is advanced or delayed (early/late decision), to the second DAC 73.

Figure 32A:
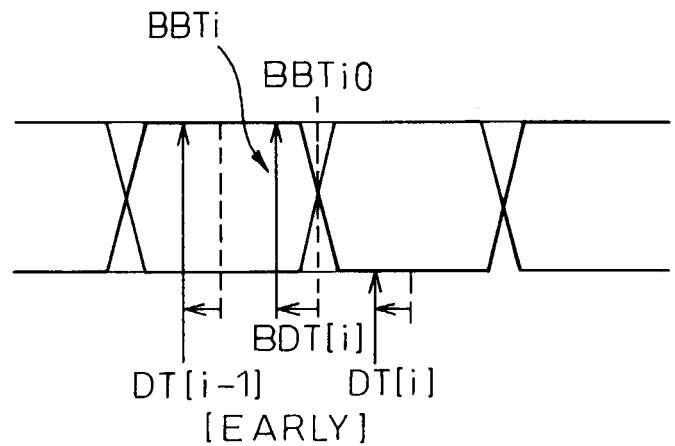
FIGS. 32A, 32B, and 32C are diagrams for explaining the timing for generating received data and boundary detection data to be input to the phase-difference/digital-code conversion circuit shown in FIG. 31.
Figure 32B:
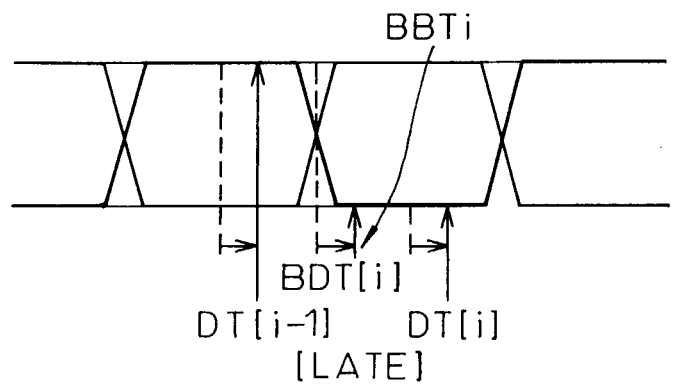
Figure 32C:
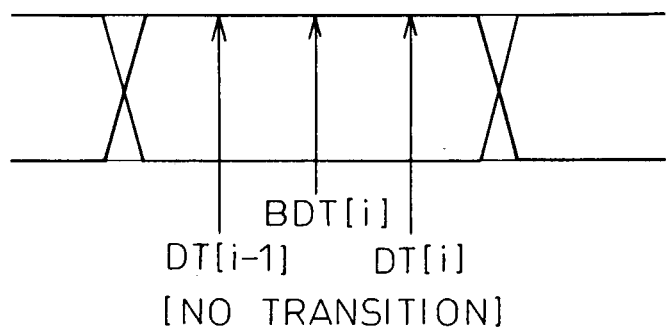

FIGS. 32A, 32B, and 32C are diagrams for explaining the timing for generating the received data DT0 to DT3 and the boundary detection data BDT0 to BDT3 to be input to the phase-difference/digital-code conversion circuit (second phase-difference/digital-code conversion circuit 71) shown in FIG. 31, and FIG. 33 is a diagram for explaining the phase difference information that the phase-difference/digital-code conversion circuit (71) shown in FIG. 31 outputs.

FIG. 32A shows the case [EARLY] where the latch timing (BBti) by the internal clock (comparison clock CMP-CLK (data discrimination clock CLKb0)) is early compared with the ideal latch timing (BBti0)) and FIG. 32B shows the case [LATE] where the latch timing by the internal clock is late compared with the ideal latch timing, while FIG. 32C shows the case [NO TRANSITION] where no transition (from a "0" to a "1" or from a "1" to a "0") appears between received data (DT [i−1]) at a given point in time and the next received data (DT [i]), that is, the same data appears in succession.

Figure 34:
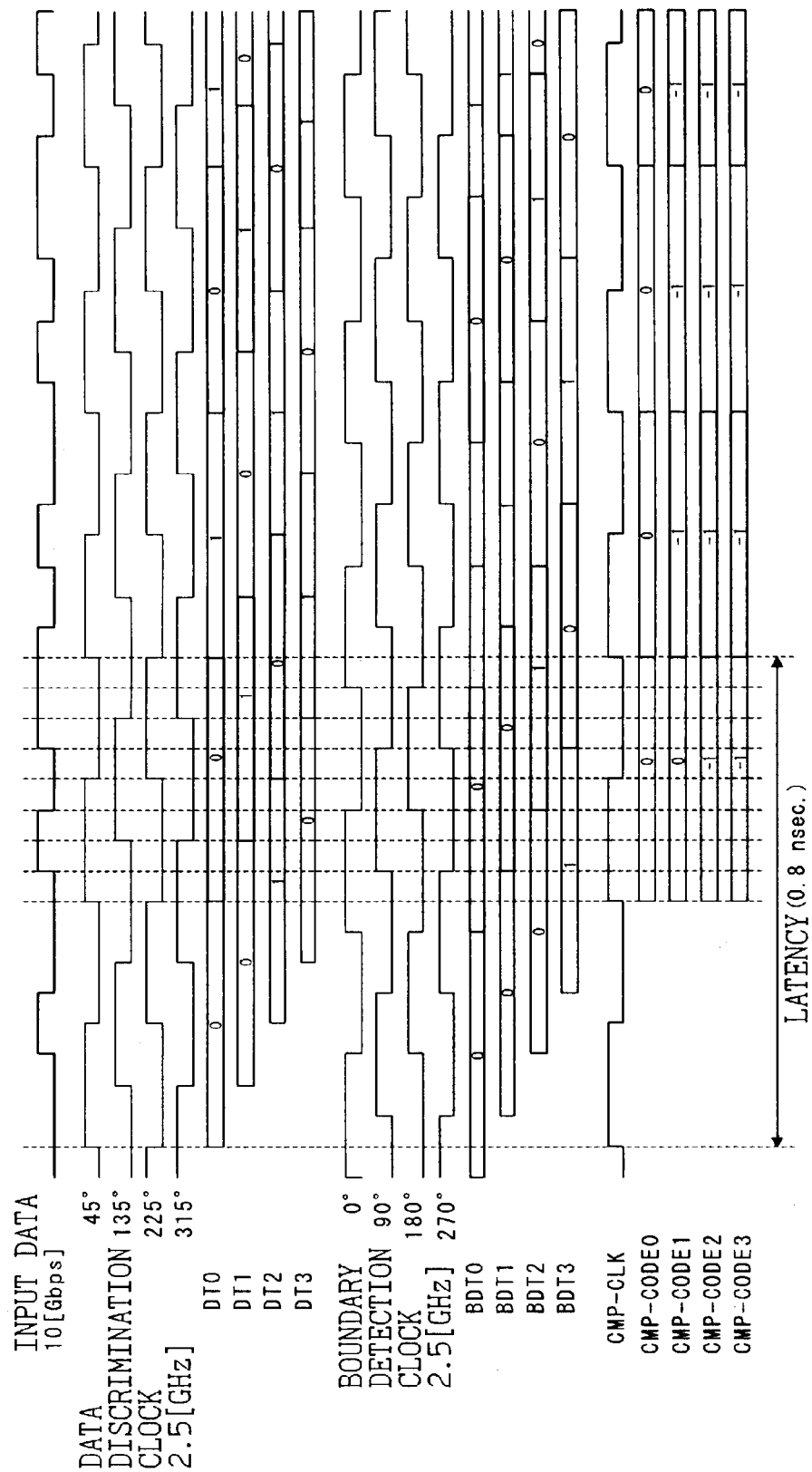
FIG. 34 is a diagram showing the timing of each signal in the phase-difference/digital-code conversion circuit shown in FIG. 31.

FIG. 34 is a diagram showing the timing of each signal in the phase-difference/digital-code conversion circuit shown in FIG. 31, that is, the timing of each signal from the moment the data discrimination flip-flops 10 to 13 output the received data DT0 to DT3 to the moment the second phase-difference/digital-code conversion circuit 71 output the codes CMP-CODE0 to CMP-CODE3.

As shown in FIGS. 32A to 34, when the received data DT [i−1] and DT [i] and the boundary detection data BDT [i] are [1, 0, 1] or [0, 1, 0] (FIG. 32A shows the case of [1, 0, 1]), the timing decision circuit 714 decides that the latch timing by the internal clock is early compared with the ideal latch timing, and outputs "1, 1" (that is, "−1": Delay the phase of the data discrimination clock) as the code CMP-CODEi [1:0] via the flip-flop 713. On the other hand, when the received data DT [i−1] and DT [i] and the boundary detection data BDT [i] are [1, 0, 0] or [0, 1, 1] (FIG. 32B shows the case of [1, 0, 0]), the timing decision circuit 714 decides that the latch timing by the internal clock is late compared with the ideal latch timing, and outputs "0, 1" (that is, "+1": Advance the phase of the data discrimination clock) as the code CMP-CODEi [1:0] via the flip-flop 713.

In other cases, that is, when the received data DT [i−1] and DT [i] and the boundary detection data BDT [i] are [0, 0, 0] or [1, 1, 1] (FIG. 32C shows the case of [1, 1, 1]), or when the boundary detection timing is at a boundary position, and the received data DT [i−1] and DT [i] and the boundary detection data BDT [i] are [0, 0, 1] or [1, 1, 0], then the timing decision circuit 174 outputs "0, 0" (that is, "0") as the code CMP-CODEi [1:0] via the flip-flop 713.

The timing decision circuit 714 performs the above processing on all the bits (DT [3:0] and BDT [3:0]), and supplies the code CMP-CODEk [1:0] for each bit k (where, k=0 to 3) to the second DAC 73. Then, as previously described, the second DAC 73 converts the code CMP-CODEk [1:0] for each bit k into a current, and supplies the current signal to the adder 74 via the buffer 76.

As shown in FIG. 34, there is a latency of 0.8 nsec between the moment the data discrimination units 10 to 13 output the received data DT0 to DT3 (i.e., the moment the received data DT0 to DT3 are input to the second phase-difference/digital-code conversion circuit 71) and the moment the second phase-difference/digital-code conversion circuit 71 outputs the codes CMP-CODE0 to CMP-CODE3.

As shown, the second phase-difference/digital-code conversion circuit 71 is a binary phase detector that outputs a code for advancing or delaying the phase ("1" or "−1") according to the outputs of the data discrimination units 10 to 13 when the data value makes a transition from a "0" to a "1" or from a "1" to a "0". When there is no data transition, the output is 0. The output (CMP-CODE0 to CMP-CODE3) of the second phase-difference/digital-code conversion circuit 71 is converted by the second DAC 73 into a current. Since the processing performed in this feedback loop (second feedback loop) is very simple, and does not involve serial/parallel conversions such as performed in the first feedback loop (the conversion circuits 31 and 32), the result can be obtained with a low signal delay (latency). On the other hand, the feedback for lower frequencies is implemented by the first feedback loop which includes the conversion circuits 31 and 32, the first phase-difference/digital-code conversion circuit 5, and the digital filter 6.

Figure 35:
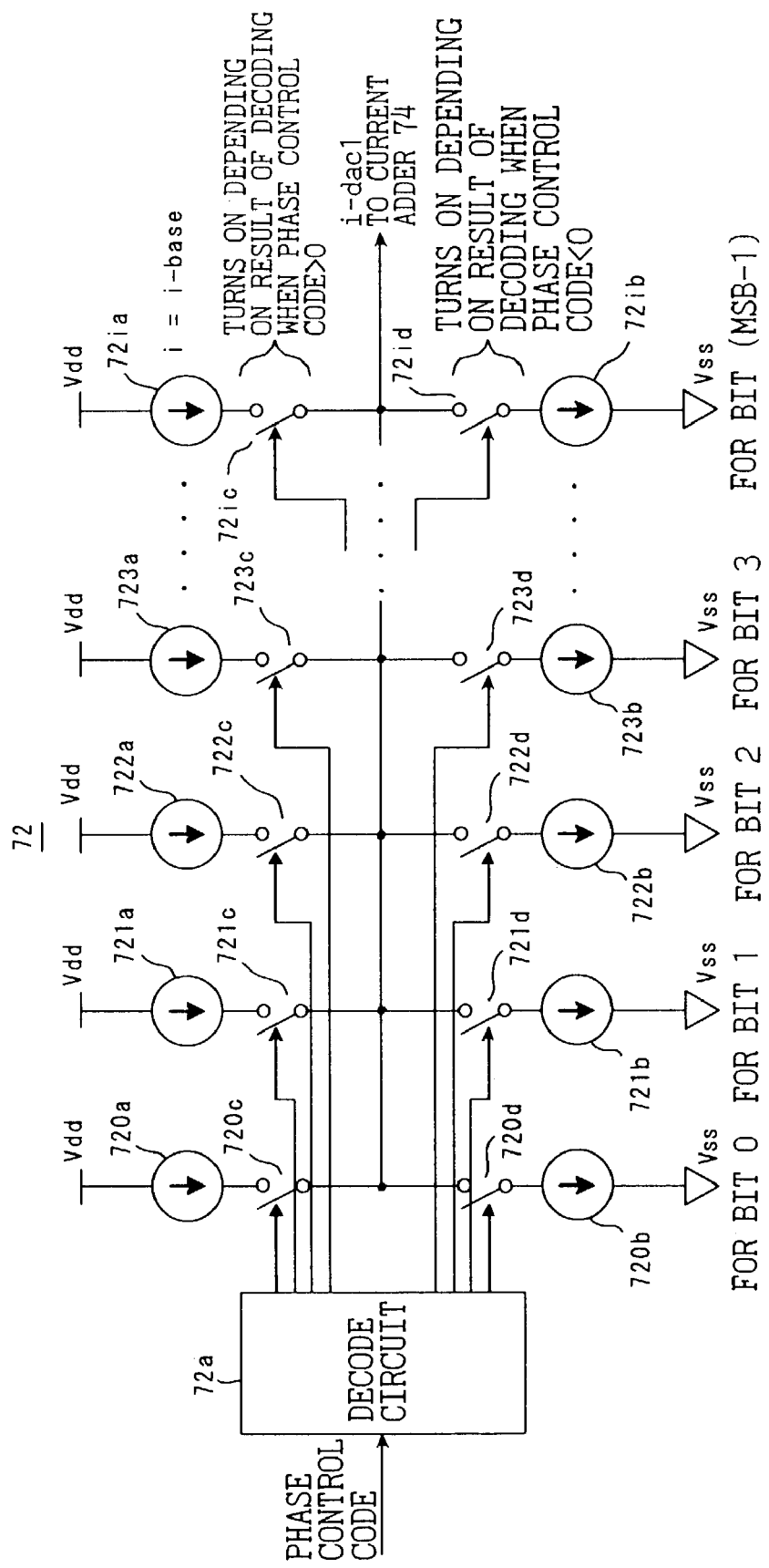
FIG. 35 is a block circuit diagram showing one example of a first digital/analog converter in the data receiving circuit of FIGS. 30A and 30B.
Figure 36:
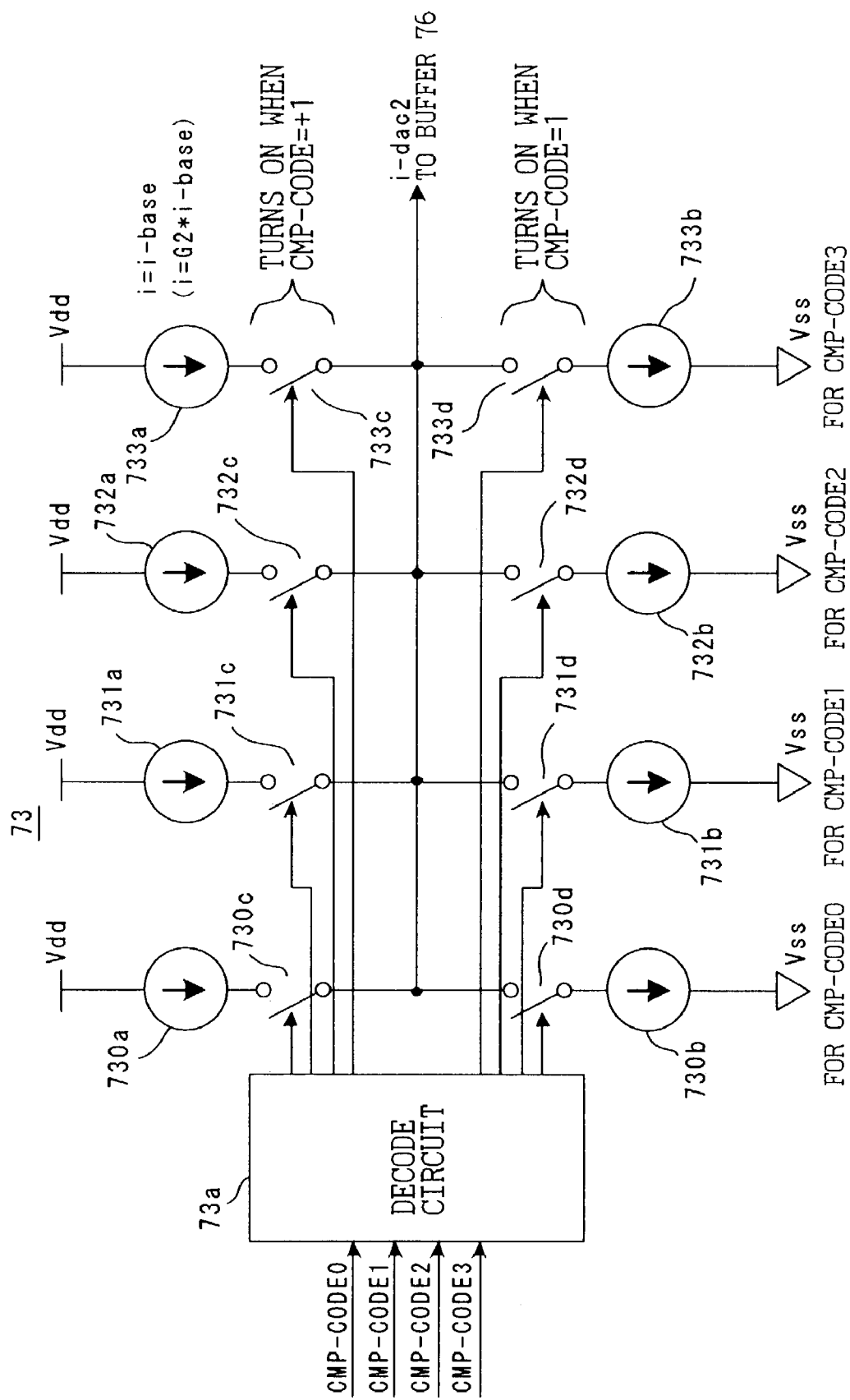
FIG. 36 is a block circuit diagram showing one example of a second digital/analog converter in the data receiving circuit of FIGS. 30A and 30B.

FIG. 35 is a block circuit diagram showing one example of the first digital/analog converter in the data receiving circuit of FIGS. 30A and 30B, and FIG. 36 is a block circuit diagram showing one example of the second digital/analog converter in the data receiving circuit of FIGS. 30A and 30B.

As is apparent from a comparison between FIGS. 35 and 36, the first DAC 72 and the second DAC 73 are similar in configuration, each comprising a decode circuit 72a or 73a, a plurality of current sources 720a to 72ia and 720b to 72ib, or 730a to 733a and 730b to 733b, and switch elements 720c to 72ic and 720d to 72id, or 730c to 733c and 730d to 733d, respectively. The decode circuits 72a and 73a each control the on/off operation of the switch elements 720c to 72ic and 720d to 72id, or 730c to 733c and 730d to 733d, respectively, thereby converting the digital code (the phase control code from the digital filter 6 or the result of the decision (CMP-CODE0 to CMP-CODE3) from the second phase-difference/digital-code conversion circuit 71) into a current, and supply the current value to the adder (current adder 74) directly or via the buffer 76.

Here, for example, if the size (gate width W) of the transistors forming the current sources 730a to 733a and the size of the transistors forming the current sources 730b to 733b in the second DAC 73 are chosen to have a prescribed relationship with respect to each other so as to directly introduce the gain G2, the buffer 76 can be eliminated. Further, the current sources 730a to 733a in the second DAC 73 may each be constructed, for example, from a plurality of transistors, with provisions made to adjust the gain G2 by adjusting the number of transistors to be used.

FIG. 37 is a diagram for explaining latency in the data receiving circuit of FIGS. 30A and 30B, that is, the latency (signal delay) in the feedback loop for generating the data discrimination clock in the data receiving circuit.

As shown in FIG. 37, in the feedback loop for generating the data discrimination clock, not only the latency of 0.8 nsec from the moment the data discrimination units 10 to 13 output the received data DT0 to DT3 (i.e., the moment the received data DT0 to DT3 are input to the second phase-difference/digital-code conversion circuit 71) to the moment the second phase-difference/digital-code conversion circuit 71 outputs the codes CMP-CODE0 to CMP-CODE3, but also the latency of about 4 nsec from the moment the second phase-difference/digital-code conversion circuit 71 outputs the codes CMP-CODE0 to CMP-CODE3 (i.e., the codes CMP-CODE0 to CMP-CODE3 are input to the second DAC 74) to the moment the data discrimination clock generating circuit 41 and the boundary detection clock generating circuit 42 output the data discrimination clocks CLKd0 to CLKd3 and the boundary detection clocks CLKb0 to CLKb3, respectively (i.e., the moment the data discrimination clocks CLKd0 to CLKd3 and the boundary detection clocks CLKb0 to CLKb3 are input to the data discrimination units 10 to 13 and the boundary detection units 20 to 23, respectively), including the latency from the moment the current i-dac2 output from the second DAC 73 is supplied via the buffer 76 to the adder 74 and added to the current i-dac1 output from the first DAC 72 to the moment the output of the VCO 75 responding to the output of the adder 74 is supplied to the data discrimination clock generating circuit 41 and the boundary detection clock generating circuit 42, is added to provide a total latency of 4.8 nsec which is the latency of the feedback loop that determines the cutoff frequency.

In this way, in the data receiving circuit (clock recovery circuit) of the first embodiment according to the second mode of the present invention, the latency can be reduced to 4.8 nsec which is sufficiently small compared, for example, with the latency of 19.2 nsec in the prior art data receiving circuit shown in FIGS. 26A and 26B. Accordingly, a high cutoff frequency can be achieved, and the input jitter tolerance can be increased by enabling the clock recovery loop to track up to a correspondingly higher frequency. Furthermore, the data receiving circuit of the first embodiment according to the second mode of the invention offers the advantage of obviating the need for an external component such as a capacitor, since the low-frequency side feedback (second feedback loop) can be implemented by a digital circuit.

Figure 38A:
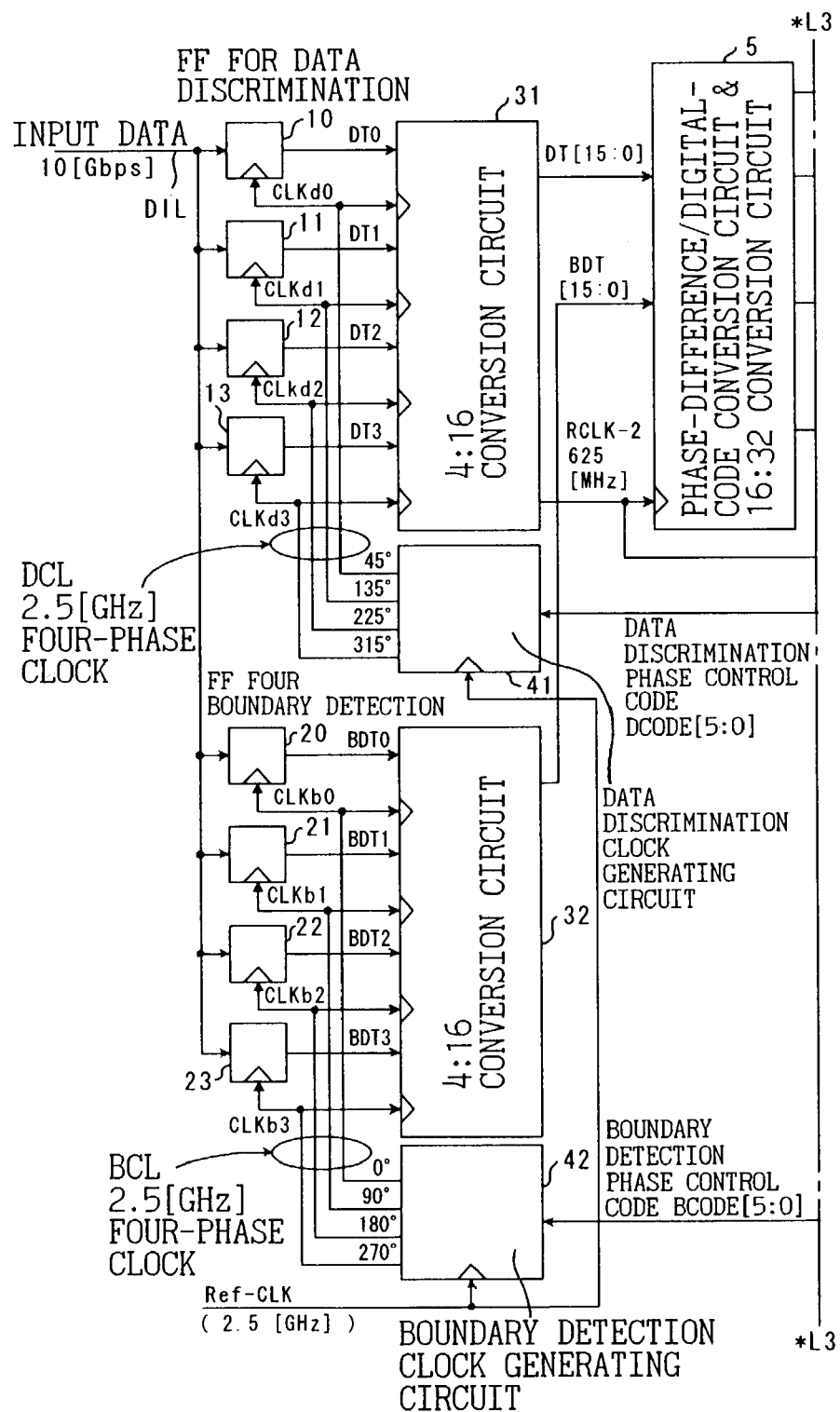
FIGS. 38A and 38B are block diagrams showing a second embodiment of the data receiving circuit according to the second mode of the present invention.
Figure 38B:
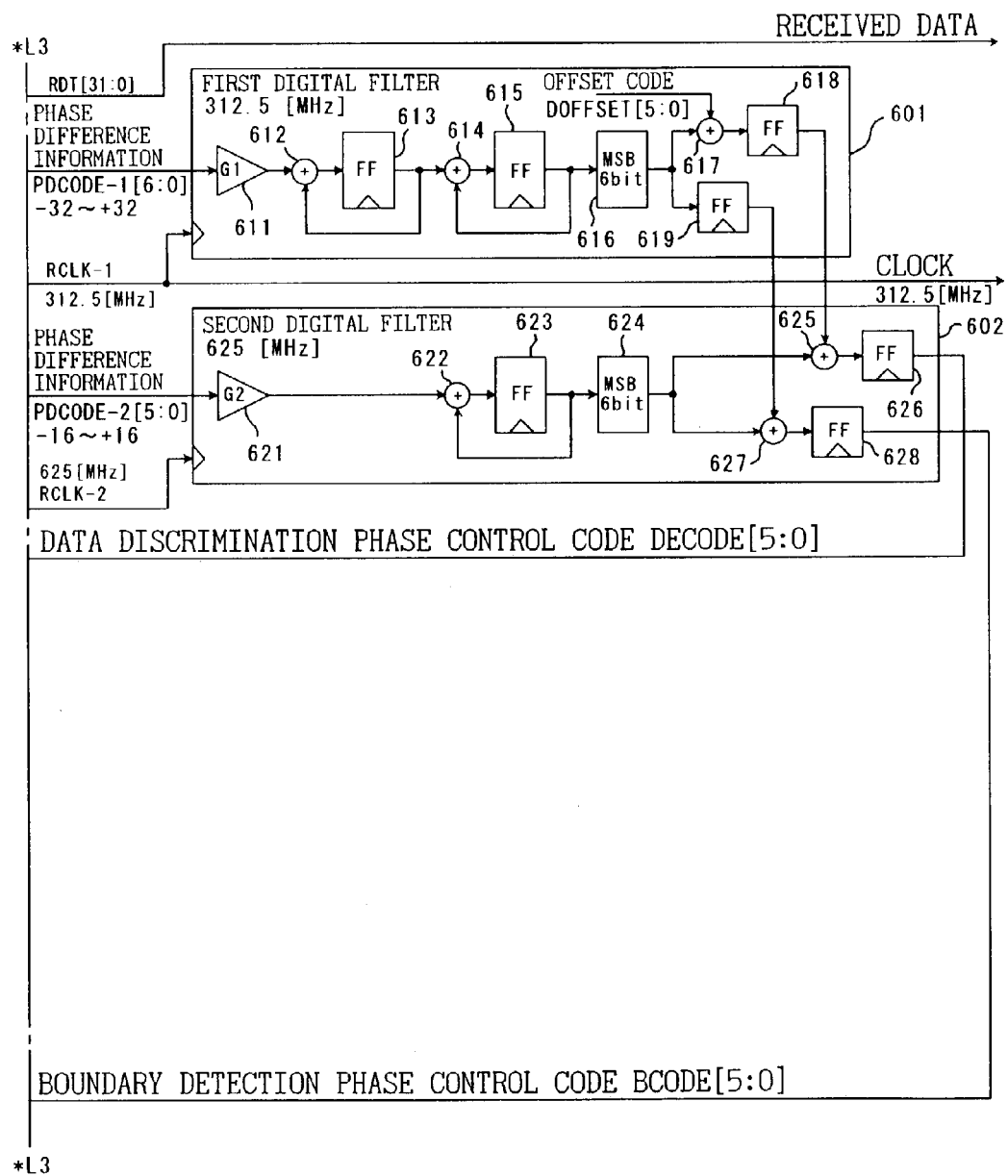

FIGS. 38A and 38B are block diagrams showing a second embodiment of the data receiving circuit according to the second mode of the present invention.

As is apparent from a comparison between FIGS. 38A, 38B and FIGS. 26A, 26B, the data receiving circuit of the second embodiment according to the second mode of the invention differs from the prior art configuration in that the digital filter 106 driven by the 312.5-MHz internal reference clock RCLK is replaced by two digital filters, i.e., the first digital filter 601 related to the first feedback loop (the low-frequency side feedback loop that provides the gain G1) and driven by a 312.5-MHz first internal reference clock RCLK-1, and the second digital filter 602 related to the second feedback loop (the high-frequency side feedback loop that provides the gain G2) and driven by a 625-MHz second internal reference clock RCLK-2.

The first digital filter 601 comprises a buffer 611 which provides gain G1 to the phase difference information PDCODE-1 [6:0] (−32 to +32), adders 612, 614, and 617, flip-flops 613, 615, 618, and 619, and a filter 616 for extracting the high-order six bits. The configuration of the first digital filter 601 is the same as that of the digital filter 106 in the prior art data receiving circuit shown in FIGS. 26A and 26B, except that the buffer 161 is eliminated. Here, the flip-flops 613, 615, 618, and 619 are each controlled by the 312.5-MHz first internal reference clock RCLK-1.

The second digital filter 602 comprises a buffer 621 which provides gain G2 to the phase difference information PDCODE-2 [5:0], adders 622, 625, and 627, flip-flops 623, 626, and 628, and a filter 624 for extracting the high-order six bits. In the second digital filter 602, the output of the flip-flop 618 in the first digital filter 601 is added in the adder 625 to the output of the filter 624, and the output of the adder 625 is fed back as the data discrimination phase control code DCODE [5:0] to the data discrimination clock generating circuit 41 via the flip-flop 626. Further, in the second digital filter 602, the output of the flip-flop 619 in the first digital filter 601 is added in the adder 627 to the output of the filter 624, and the output of the adder 627 is fed back as the boundary detection phase control code BCODE [5:0] to the boundary detection clock generating circuit 42 via the flip-flop 628. Here, the flip-flops 623, 626, and 628 are each controlled by the 625-MHz second internal reference clock RCLK-2.

In the data receiving circuit of the second embodiment according to the second mode of the invention, phase interpolators (data discrimination clock generating circuit 41 and boundary detection clock generating circuit 42) similar to those in the prior art of FIGS. 26A and 26B are used to adjust the clock phase, rather than using the VCO 75 as in the first embodiment according to the second mode of the invention. The phase interpolators (41 and 42) can generate a clock of any desired phase (timing) by taking a weighted sum, for example, between four phase clocks (reference clocks) spaced 90° apart in phase; further, since the weight is generated by a D/A converter, the phase can be controlled using a digital code (phase control code).

The data receiving circuit of the second embodiment according to the second mode of the invention is also characterized by the inclusion of two feedback loops and, in the first feedback loop, the output (phase difference information PDCODE-1 [6:0]) of the phase-difference/digital-code conversion circuit 5 is added up twice. That is, first the output is added up in the register (flip-flop 613) through the adder circuit (adder 612), and then, the output is added up in the register (flip-flop 615) through the adder circuit (adder 614). The open loop gain obtained from this portion can be expressed as G1/s2. Here, the count adder circuits and the registers are each constructed from a logic circuit that operates with the 312.5-MHz clock.

On the other hand, the feedback loop (second feedback loop) with a smaller signal delay operates with 625 MHz, and the register contents obtained in the first feedback loop are added in the adders 625 and 627 to the processing result of the output (phase difference information PDCODE-2 [5:0]) of the phase-difference/digital-code conversion circuit 5. The second digital filter 602 related to the second feedback loop can produce an output with a smaller signal delay (latency) since its operating frequency is higher than that of the first digital filter 601 related to the first feedback loop.

In addition to the advantage of achieving stable operation even at high frequencies, the data receiving circuit of the second embodiment according to the second mode of the invention offers the advantage of being free from noise accumulation resulting from the use of a VCO and also the advantage of being able to flexibly add functions because of its full digital control configuration.

FIG. 39 is a block diagram showing one example of the phase-difference/digital-code conversion circuit in the data receiving circuit of FIGS. 38A and 38B.

As shown in FIG. 39, the phase-difference/digital-code conversion circuit 5 comprises a timing decision circuit 50 which compares the received data DT [15:0] with the boundary detection data BDT [15:0] and decides whether the timing is early or late, flip-flops 51, 53, 55, 56, 57, and 59, a phase difference information output circuit 52 which adds up the timing decision results for 16 bits and outputs the sum as the phase difference information, an adder 54, and an inverter 58. The configuration shown in FIG. 39 illustrates one example of the phase-difference/digital-code conversion circuit 5, and it will be appreciated that various other circuit configurations are possible.

The phase-difference/digital-code conversion circuit 5 takes as inputs the received data DT [15:0], the boundary detection data BDT [15:0], and the second internal reference clock RCLK-2 (625 MHz), and outputs the phase difference information PDCODE-1 [6:0] (−32 to +32), the phase difference information PDCODE-2 [5:0], the first internal reference clock RCLK-1 (312.5 MHz), and the received data RDT [31:0].

Figure 41:
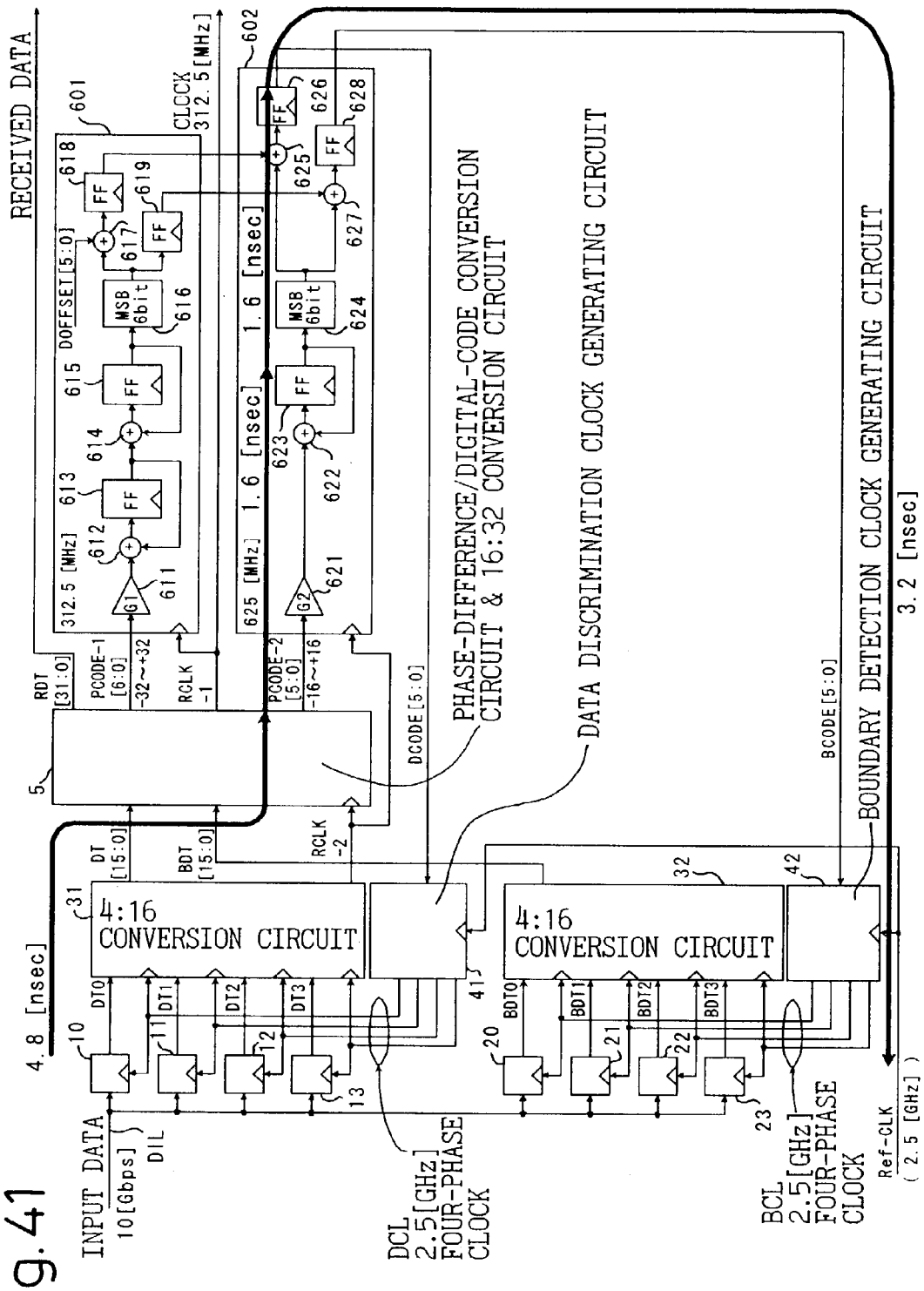
FIG. 41 is a diagram (part 2) for explaining latency in the data receiving circuit of FIGS. 38A and 38B.

FIGS. 40 and 41 are diagrams for explaining latency in the data receiving circuit of FIGS. 38A and 38B. Here, FIG. 40 shows the timing of each signal from the moment the data discrimination flip-flops 10 to 13 output the received data DT0 to DT3 to the moment the phase-difference/digital-code conversion circuit 5 generates the phase difference information PDCODE-2 [5:0], while FIG. 41 shows the latency in the feedback loop for generating the data discrimination clock in the data receiving circuit of FIGS. 38A and 38B.

In FIG. 40, reference characters CMP-CODE00 to CMP-CODE15 are signals each indicating the result of the decision as to whether the timing is early or late (the signal being the output signal of the flip-flop 51 in the phase-difference/digital-code conversion circuit 5 of FIG. 39); these signals are combined together and output as the phase difference information PDCODE-2 [5:0] with a latency of 4.8 nsec (the time equal to three cycles of the 625-MHz internal reference clock RCLK).

As shown in FIG. 41, in the second feedback loop, not only the latency of 4.8 nsec from the moment the data discrimination units 10 to 13 output the received data DT0 to DT3 and the boundary detection units 20 to 23 output the boundary detection data BDT0 to BDT3 (i.e., the moment the received data DT0 to DT3 and the boundary detection data BDT0 to BDT3 are input to the conversion circuit 31) to the moment the phase-difference/digital-code conversion circuit 5 outputs the phase difference information PDCODE-2 [5:0], but also the latency of 3.2 nsec from the moment the phase-difference/digital-code conversion circuit 5 outputs the phase difference information PDCODE-2 [5:0] (i.e., the moment the phase difference information PDCODE-2 [5:0] is input to the second digital filter 602) to the moment the second digital filter 602 outputs the boundary detection phase control code BCODE [5:0] and the latency of 3.2 nsec from the moment the second digital filter 602 outputs the boundary detection phase control code BCODE [5:0] (i.e., the moment the boundary detection phase control code BCODE [5:0] is input to the boundary detection clock generating circuit 42) to the moment the boundary detection clock generating circuit 42 outputs the boundary detection clocks CLKb0 to CLKb3 (i.e., the moment the four phase clocks CLKb0 to CLKb3 are input to the boundary detection units 20 to 23) are added together to provide a total latency of 11.2 nsec which is the latency of the feedback loop that determines the cutoff frequency. That is, the data receiving circuit of the second embodiment according to the second mode of the invention can reduce the latency significantly compared with the latency of 19.2 nsec in the previously described data receiving circuit of the prior art.

Figure 42A:
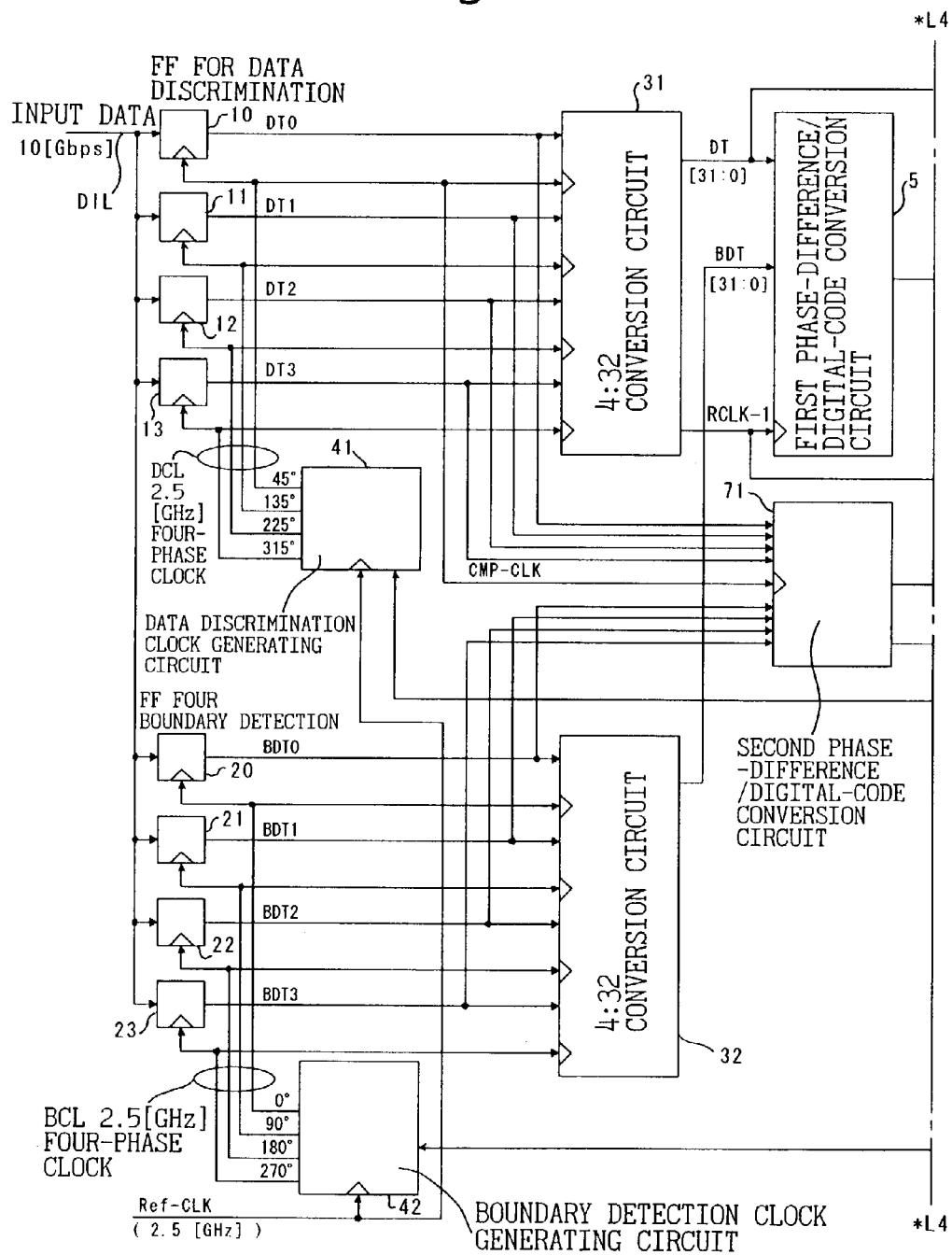
FIGS. 42A and 42B are block diagrams showing a third embodiment of the data receiving circuit according to the second mode of the present invention.
Figure 42B:
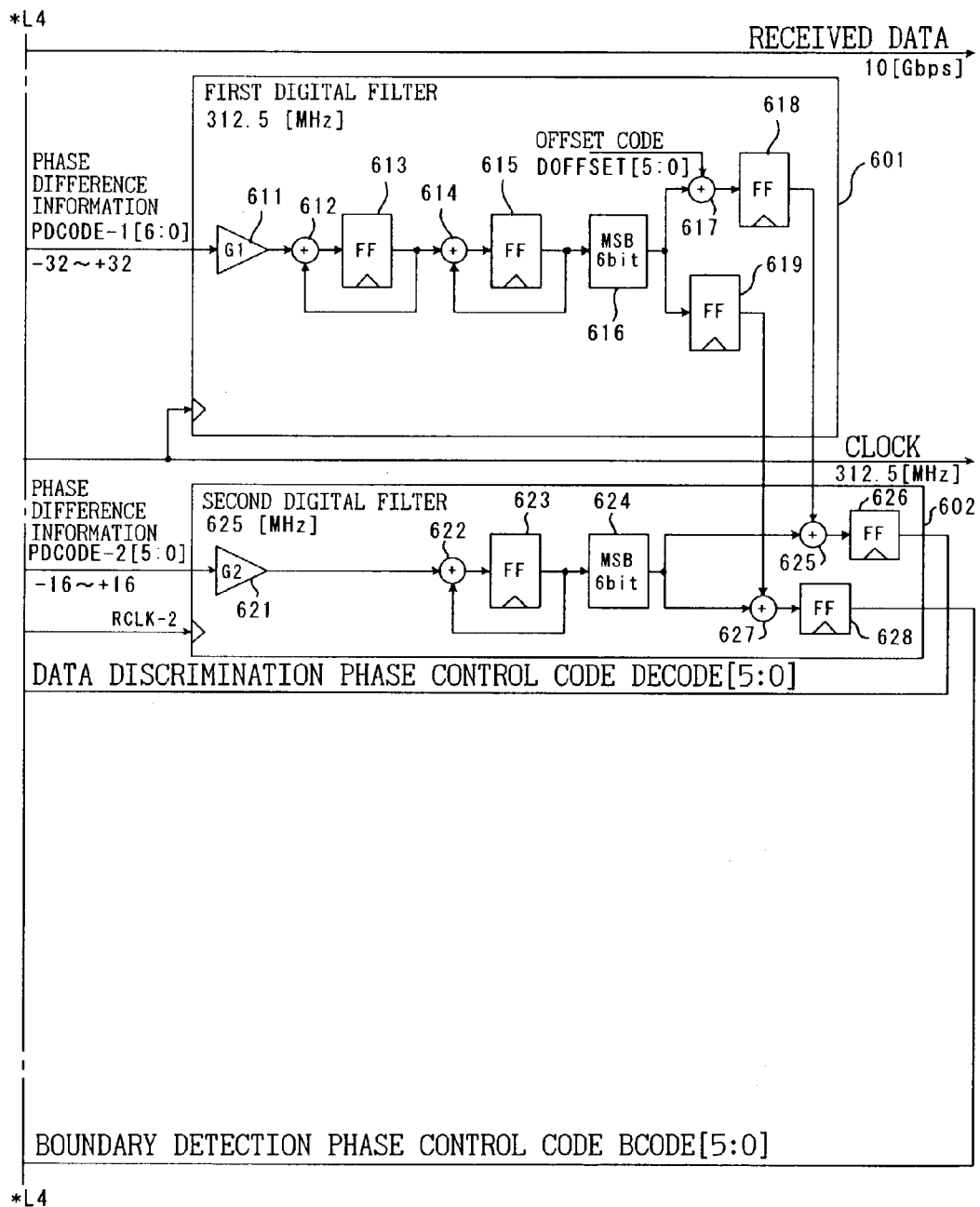

FIGS. 42A and 42B are block diagrams showing a third embodiment of the data receiving circuit according to the second mode of the present invention.

As is apparent from a comparison between FIGS. 42A, 42B and FIGS. 30A, 30B, 38A, and 38B, the data receiving circuit of the third embodiment according to the second mode of the invention is a combination of the data receiving circuit of the first embodiment according to the second mode of the invention and the data receiving circuit of the second embodiment according to the second mode. That is, as shown in FIGS. 42A and 42B, the data receiving circuit of the third embodiment according to the second mode of the invention is configured so that the output (here, PDCODE-2 [5:0]) of the second phase-difference/digital-code conversion circuit 71 in the data receiving circuit of the first embodiment shown in FIGS. 30A and 30B is supplied to the second digital filter 602 in the data receiving circuit of the second embodiment shown in FIGS. 38A and 38B. The output (PDCODE-1 [6:0]) of the first phase-difference/digital-code conversion circuit (phase-difference/digital-code conversion circuit) 5 is supplied to the first digital filter 601 which is the same as the one used in the data receiving circuit of the second embodiment.

In the first embodiment according to the second mode of the invention, the second phase-difference/digital-code conversion circuit 71 was configured to receive the data discrimination clocks CLKd0 to CLKd3, the boundary detection clocks CLKb0 to CLKb3, and the comparison clock CMP-CLK, and to output the signals CMP-CODE0 to CMP-CODE3 to the second DAC 73; by contrast, in the third embodiment according to the second mode of the invention, the second phase-difference/digital-code conversion circuit 71 is configured to receive the data discrimination clocks CLKd0 to CLKd3, the boundary detection clocks CLKb0 to CLKb3, and the comparison clock CMP-CLK, and to output the signal (phase difference information) PDCODE-2 [5:0] to the second digital filter 602.

Figure 43:
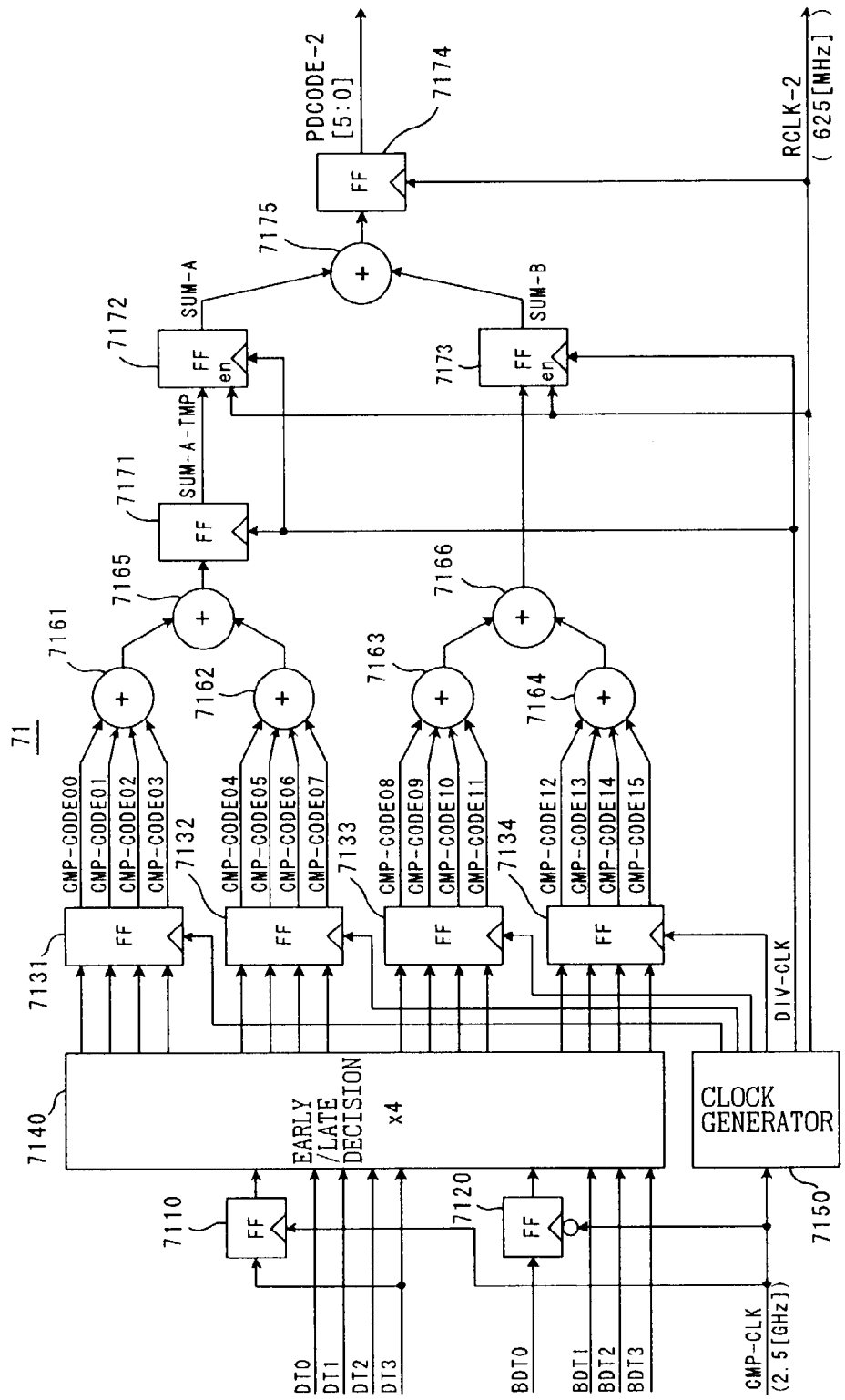
FIG. 43 is a block diagram showing one example of the second phase-difference/digital-code conversion circuit in the data receiving circuit of FIGS. 42A and 42B.

FIG. 43 is a block diagram showing one example of the second phase-difference/digital-code conversion circuit 71 in the data receiving circuit of FIGS. 42A and 42B.

As shown in FIG. 43, in the third embodiment according to the second mode of the invention, the second phase-difference/digital-code conversion circuit 71 comprises flip-flops 7110, 7120, 7131 to 7134, and 7171 to 7174, adders 7161 to 7166 and 7175, a clock generator 7150, and a timing decision circuit 7140. The timing decision circuit 7140 compares the received data DT0 to DT3, latched by the respective data discrimination clocks CLKd0 to CLKd3, with the data BDT0 to BDT3, latched by the respective boundary detection clocks CLKb0 to CLKb3, and decides whether the timing is early or late, and the result of the decision is latched into the respective flip-flops 7131 to 7134 by the clock generated by the clock generator 7150. Then, the outputs of the flip-flops 7131 to 7134 are processed by the adders 7161 to 7166 and 7175, the clock generator 7150, and the flip-flops 7171 to 7174, and the resulting phase difference information PDCODE-2 [5:0] is supplied to the second digital filter 602. The clock generator 7150 also generates the 625-MHz second internal reference clock RCLK-2 and supplies it to the second digital filter 602.

Figure 44:
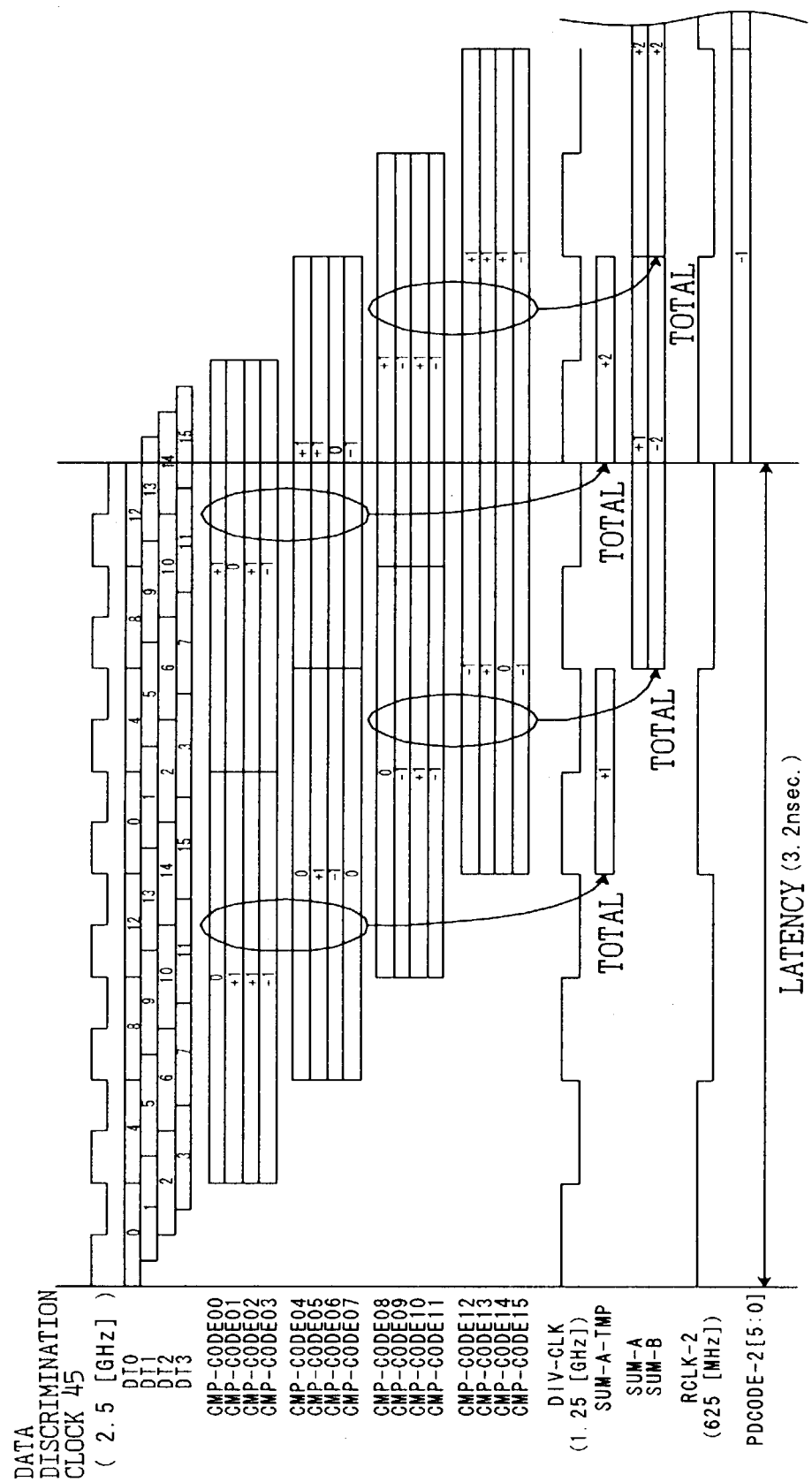
FIG. 44 is a diagram (part 1) for explaining latency in the data receiving circuit of FIGS. 42A and 42B.
Figure 45:
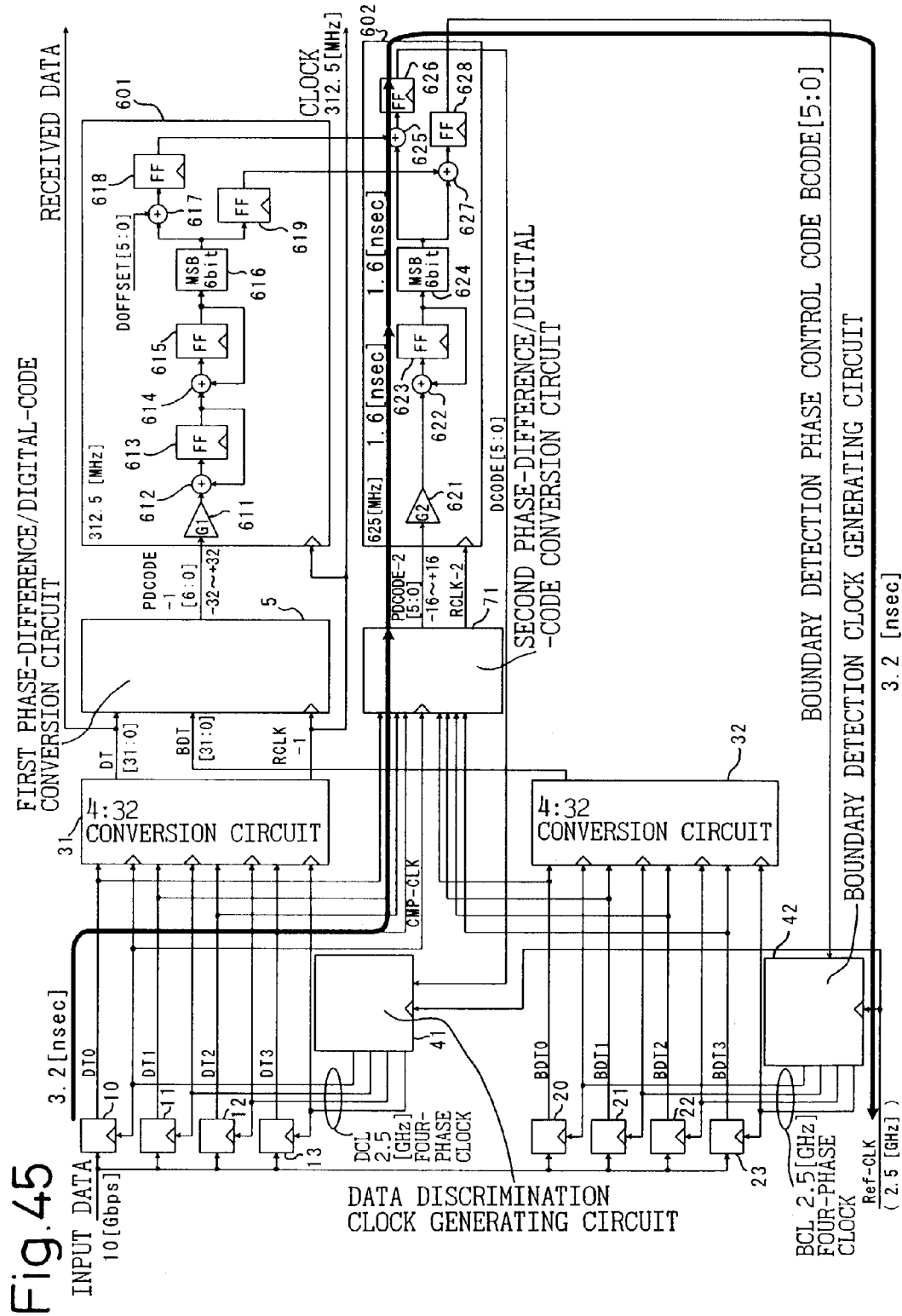
FIG. 45 is a diagram (part 2) for explaining latency in the data receiving circuit of FIGS. 42A and 42B.

FIGS. 44 and 45 are diagrams for explaining latency in the data receiving circuit of FIGS. 42A and 42B. Here, FIG. 44 shows the timing of each signal from the moment the data discrimination flip-flops 10 to 13 output the received data DT0 to DT3 to the moment the second phase-difference/digital-code conversion circuit 71 generates the phase difference information PDCODE-2 [5:0], while FIG. 45 shows the latency in the feedback loop in the data receiving circuit of FIGS. 42A and 42B.

In FIG. 44, reference characters CMP-CODE00 to CMP-CODE15 are signals each indicating the result of the decision as to whether the timing is early or late; these signals are combined together and output as the phase difference information PDCODE-2 [5:0] with a latency of 3.2 nsec (the time equal to two cycles of the 625-MHz internal reference clock RCLK).

As shown in FIG. 45, in the second feedback loop, not only the latency of 3.2 nsec from the moment the data discrimination units 10 to 13 output the received data DT0 to DT3 and the boundary detection units 20 to 23 output the boundary detection data BDT0 to BDT3 (i.e., the moment the received data DT0 to DT3 and the boundary detection data BDT0 to BDT3 are input to the second phase-difference/digital-code conversion circuit 71) to the moment the second phase-difference/digital-code conversion circuit 71 outputs the phase difference information PDCODE-2 [5:0], but also the latency of 3.2 nsec from the moment the second phase-difference/digital-code conversion circuit 71 outputs the phase difference information PDCODE-2 [5:0] (i.e., the moment the phase difference information PDCODE-2 [5:0] is input to the second digital filter 602) to the moment the second digital filter 602 outputs the boundary detection phase control code BCODE [5:0] and the latency of 3.2 nsec from the moment the second digital filter 602 outputs the boundary detection phase control code BCODE [5:0] (i.e., the moment the boundary detection phase control code BCODE [5:0] is input to the boundary detection clock generating circuit 42) to the moment the boundary detection clock generating circuit 42 outputs the boundary detection clocks CLKb0 to CLKb3 (i.e., the moment the four phase clocks CLKb0 to CLKb3 are input to the boundary detection units 20 to 23) are added together to provide a total latency of 9.6 nsec which is the latency of the feedback loop that determines the cutoff frequency. That is, the data receiving circuit of the third embodiment according to the second mode of the invention can reduce the latency significantly compared with the latency of 19.2 nsec in the previously described data receiving circuit of the prior art.

The data receiving circuit of the third embodiment according to the second mode of the invention includes the first and second feedback loops, wherein in the first feedback loop, the outputs of the data discrimination units 10 to 13 and the outputs of the boundary detection units 20 to 23 are converted by the conversion circuits 31 and 32 into parallel data, and then the parallel data are converted by the first phase-difference/digital-code conversion circuit 5 into the phase difference information PDCODE-1 [6:0] which is supplied to the first digital filter 601 operating at 312.5 MHz for feedback, while in the second feedback loop, the outputs of the data discrimination units 10 to 13 and the outputs of the boundary detection units 20 to 23 are converted by the second phase-difference/digital-code conversion circuit 71 into the phase difference information PDCODE-2 [5:0] and supplied to the second digital filter 602 operating at 625 MHz for feedback. The contribution of the first feedback loop to the open loop gain is G1/s by linear continuous time approximation, and this value is summed with the output of the second phase-difference/digital-code conversion circuit 71 and added up to produce the data discrimination phase control code DCODE [5:0] (the control code to the data discrimination clock generating circuit (phase interpolator) 41); if the gain of the second feedback loop is G2, the total open loop gain is $G1/S^2 + G2/s$.

In the data receiving circuit of the third embodiment according to the second mode of the invention, since the second feedback loop bypasses the conversion circuits 31 and 32 that perform parallel-to-serial conversions, the advantage is that the signal delay (latency) can be further reduced compared with the second embodiment, and hence, the stability at high frequencies further improves.

Figure 46A:
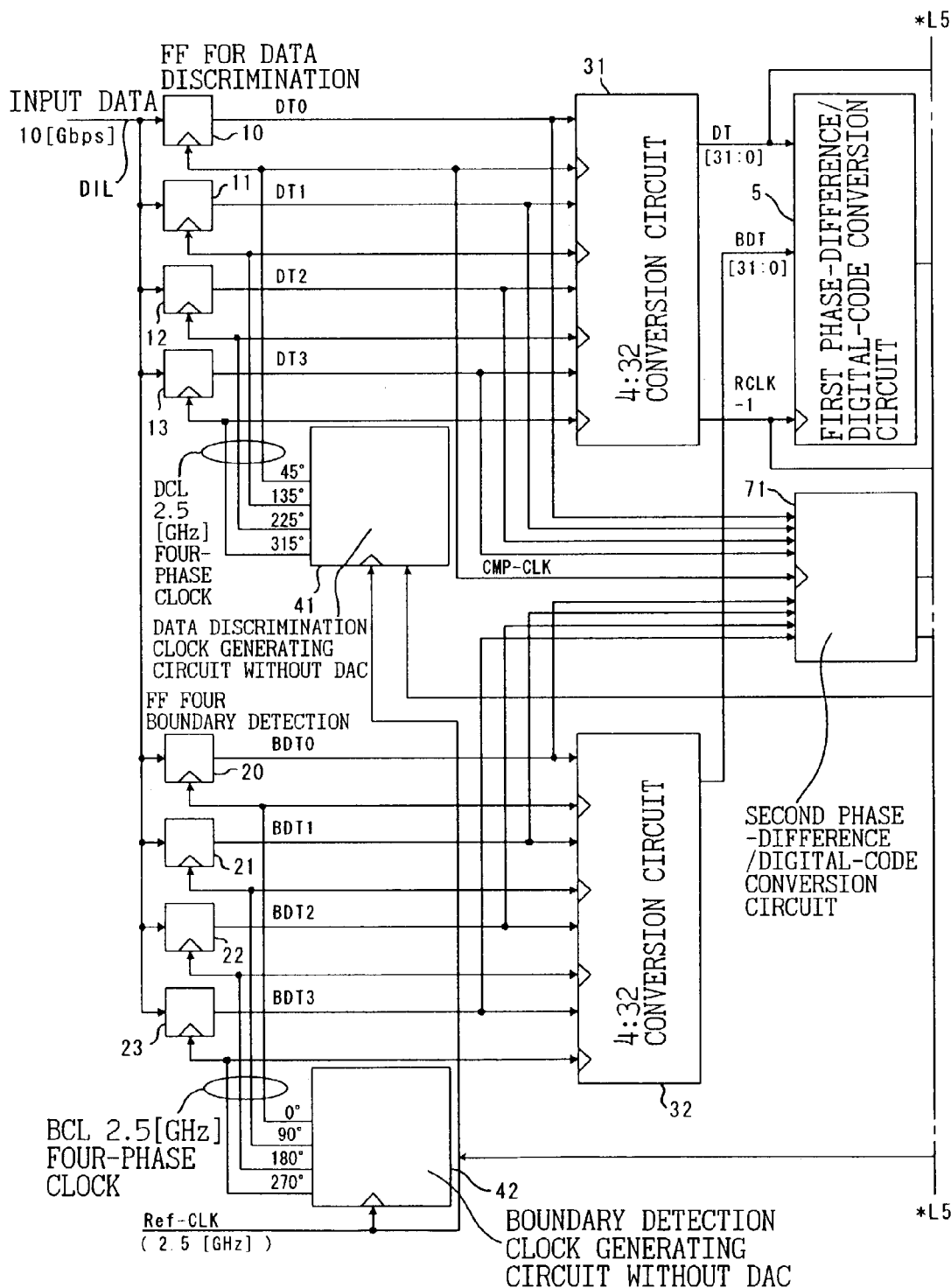
FIGS. 46A and 46B are block diagrams showing a fourth embodiment of the data receiving circuit according to the second mode of the present invention.
Figure 46B:
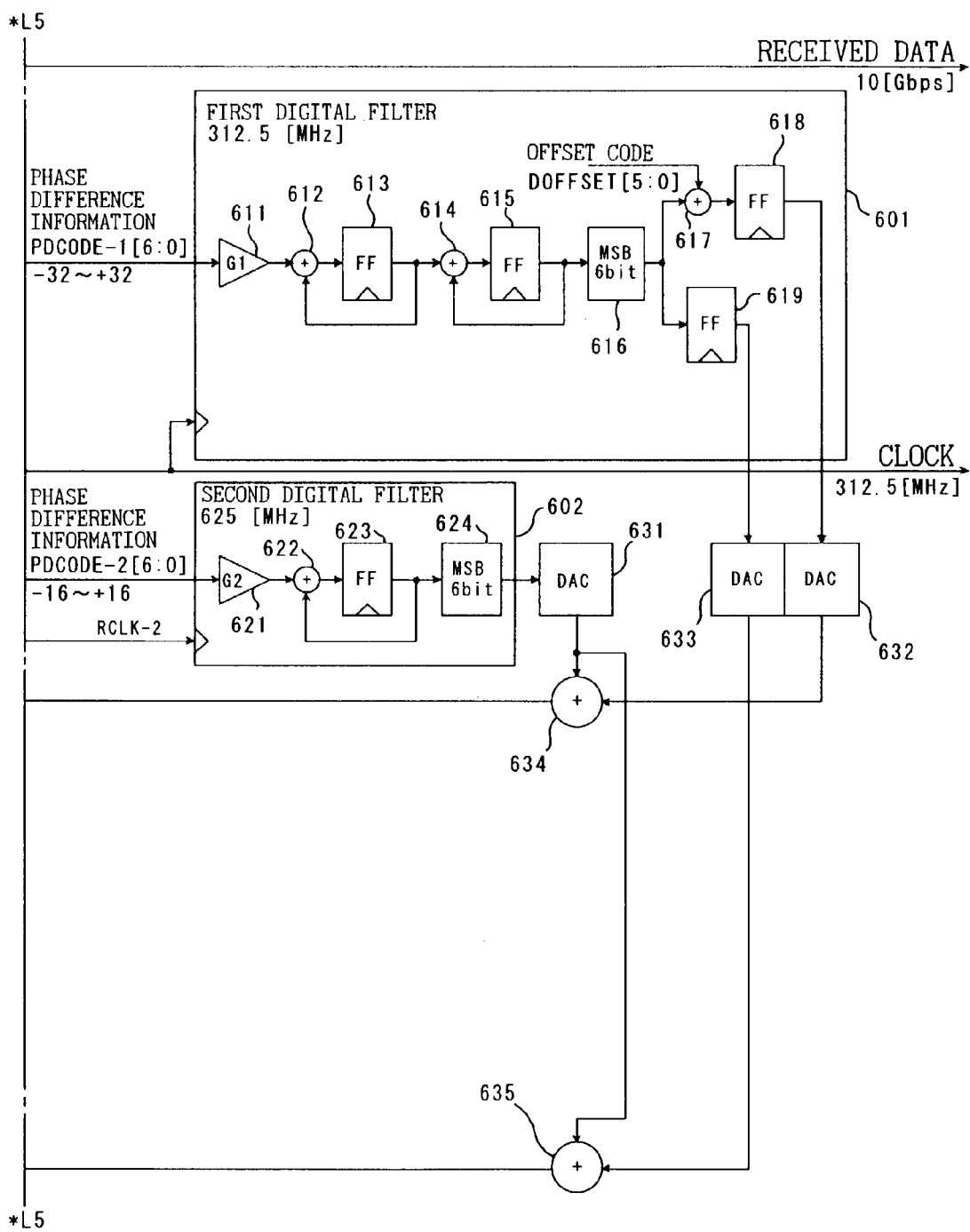

FIGS. 46A and 46B are block diagrams showing a fourth embodiment of the data receiving circuit according to the second mode of the present invention.

As is apparent from a comparison between FIGS. 46A, 46B and FIGS. 42A, 42B, the data receiving circuit of the fourth embodiment according to the second mode of the invention differs from the third embodiment according to the second mode of the invention in that the second digital filter 602 is constructed using the buffer 621, adder 622, flip-flop 623, and filter 624. The output of the flip-flop 618 in the first digital filter 601 is converted by a DAC 632 into an analog signal (current) and supplied to an adder (current adder) 634, while the output of the flip-flop 619 in the first digital filter 601 is converted by a DAC 633 into a current and supplied to an adder (current adder) 635. The output of the second digital filter 602 (the output of the filter 624) is converted by a DAC 631 into a current and supplied to the adders 634 and 635 where the current is summed with the outputs (currents) of the DAC 632 and DAC 633, respectively. Here, the data discrimination clock generating circuit 41 and the boundary detection clock generating circuit 42 do not contain any DACs, and the data discrimination clock generating circuit 41 and the boundary detection clock generating circuit 42 receive the output currents of the adders 634 and 635, respectively, and generate signals (data discrimination clocks CLKd0 to CLKd3 and boundary detection clocks CLKb0 to CLKb3) of the output phases responsive to the respective output currents.

In this way, in the data receiving circuit of the fourth embodiment according to the second mode of the invention, the control amounts obtained from the two feedback loops (the first and second feedback loops) are summed together as analog currents. This utilizes the fact that the weight for the weighted summing performed in each of the data discrimination clock generating circuit 141 and boundary detection clock generating circuit 142 shown in FIG. 26A is controlled using a current. That is, the outputs (currents) of the adders 634 and 635 provide weight controlling currents to the data discrimination clock generating circuit 41 and the boundary detection clock generating circuit 42, respectively.

FIG. 47 is a diagram for explaining latency in the data receiving circuit of FIGS. 46A and 46B.

As shown in FIG. 47, in the second feedback loop in the data receiving circuit of the fourth embodiment according to the second mode of the invention, the latency from the moment the data discrimination units 10 to 13 output the received data DT0 to DT3 and the boundary detection units 20 to 23 output the boundary detection data BDT0 to BDT3 (i.e., the moment the received data DT0 to DT3 and the boundary detection data BDT0 to BDT3 are input to the second phase-difference/digital-code conversion circuit 71) to the moment the second phase-difference/digital-code conversion circuit 71 outputs the phase difference information PDCODE-2 [5:0] is 3.2 nsec (the time equal to two cycles of the 625-MHz internal reference clock RCLK) which is the same as that in the data receiving circuit of the foregoing third embodiment according to the second mode of the invention; in addition to this latency of 3.6 nsec, the latency of 1.6 nsec from the moment the second phase-difference/digital-code conversion circuit 71 outputs the phase difference information PDCODE-2 [5:0] (i.e., the moment the phase difference information PDCODE-2 [5:0] is input to the buffer 621 in the second digital filter 602) to the moment the flip-flop 623 in the second digital filter 602 latches the signal (outputs the signal) and the latency of 3.2 nsec from the moment the flip-flop 623 in the second digital filter 602 outputs the signal to the filter 624 to the moment the boundary detection clock generating circuit 42 outputs the boundary detection clocks CLKb0 to CLKb3 (i.e., the moment the four phase clocks CLKb0 to CLKb3 are input to the boundary detection units 20 to 23) are added together to provide a total latency of 8 nsec which is the latency of the feedback loop that determines the cutoff frequency.

In this way, in the data receiving circuit of the fourth embodiment according to the second mode of the invention, since the summing of the control amounts from the two feedback loops (the first and second feedback loops) is accomplished by high-speed analog summing, a high-speed, low-latency feedback loop (the second feedback loop) can be constructed regardless of the number of bits of digital operation. As a result, a data receiving circuit (clock recovery circuit) capable of highly stable operation at high frequencies can be achieved with a smaller amount of circuitry.

In this way, according to the first to fourth embodiments of the second mode of the present invention, in the clock recovery circuit in a circuit for receiving high-speed signals, since the signal delay through the feedback loop (the second feedback loop) that determines the maximum speed with which the loop performs phase tracking can be reduced as described above, clock recovery capable of stable phase tracking up to high frequencies can be achieved; as a result, a data receiving circuit (clock recovery circuit) having a large receive timing margin can be provided.

Figure 48A:
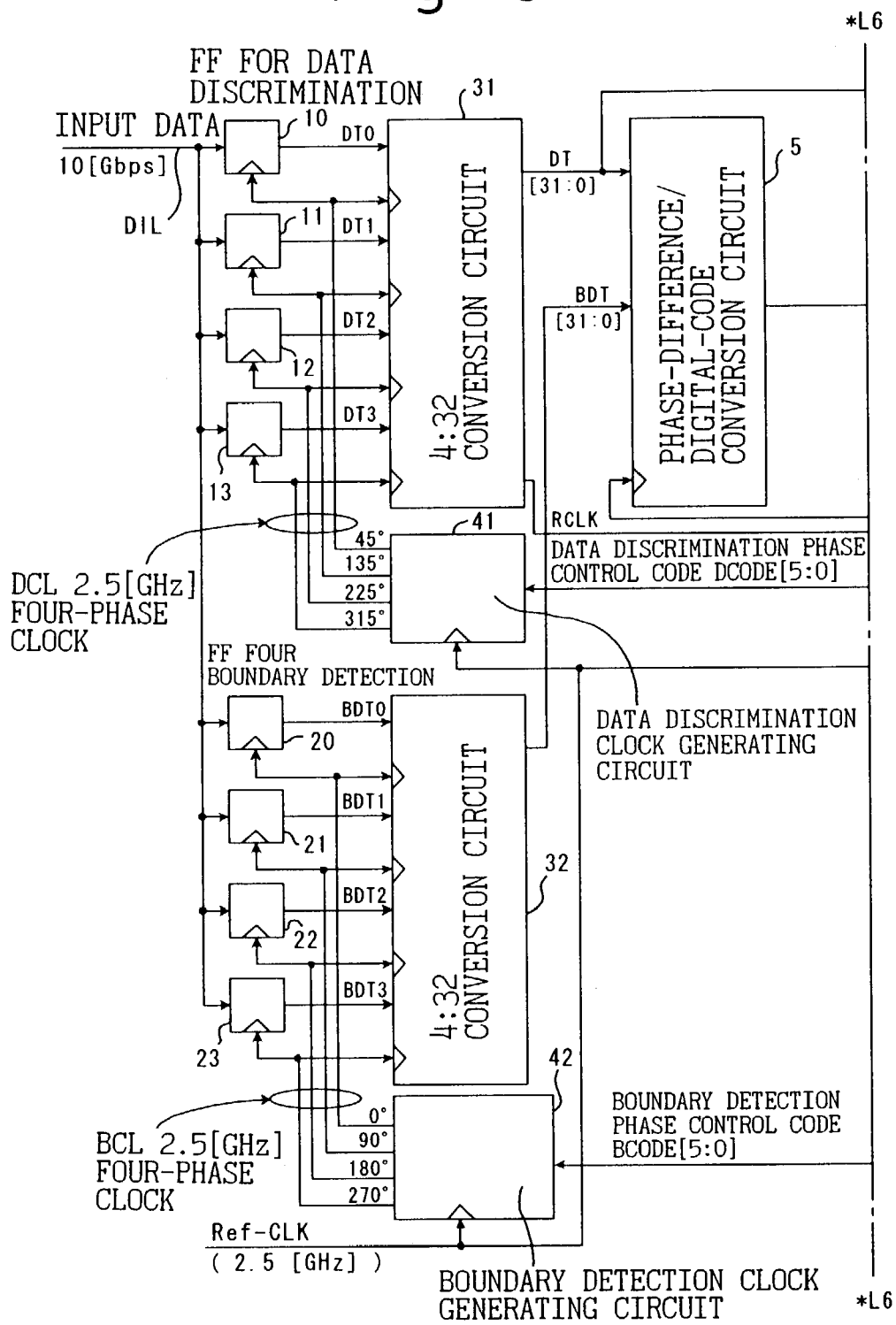
FIGS. 48A and 48B are block diagrams showing a fifth embodiment of the data receiving circuit according to the second mode of the present invention.
Figure 48B:
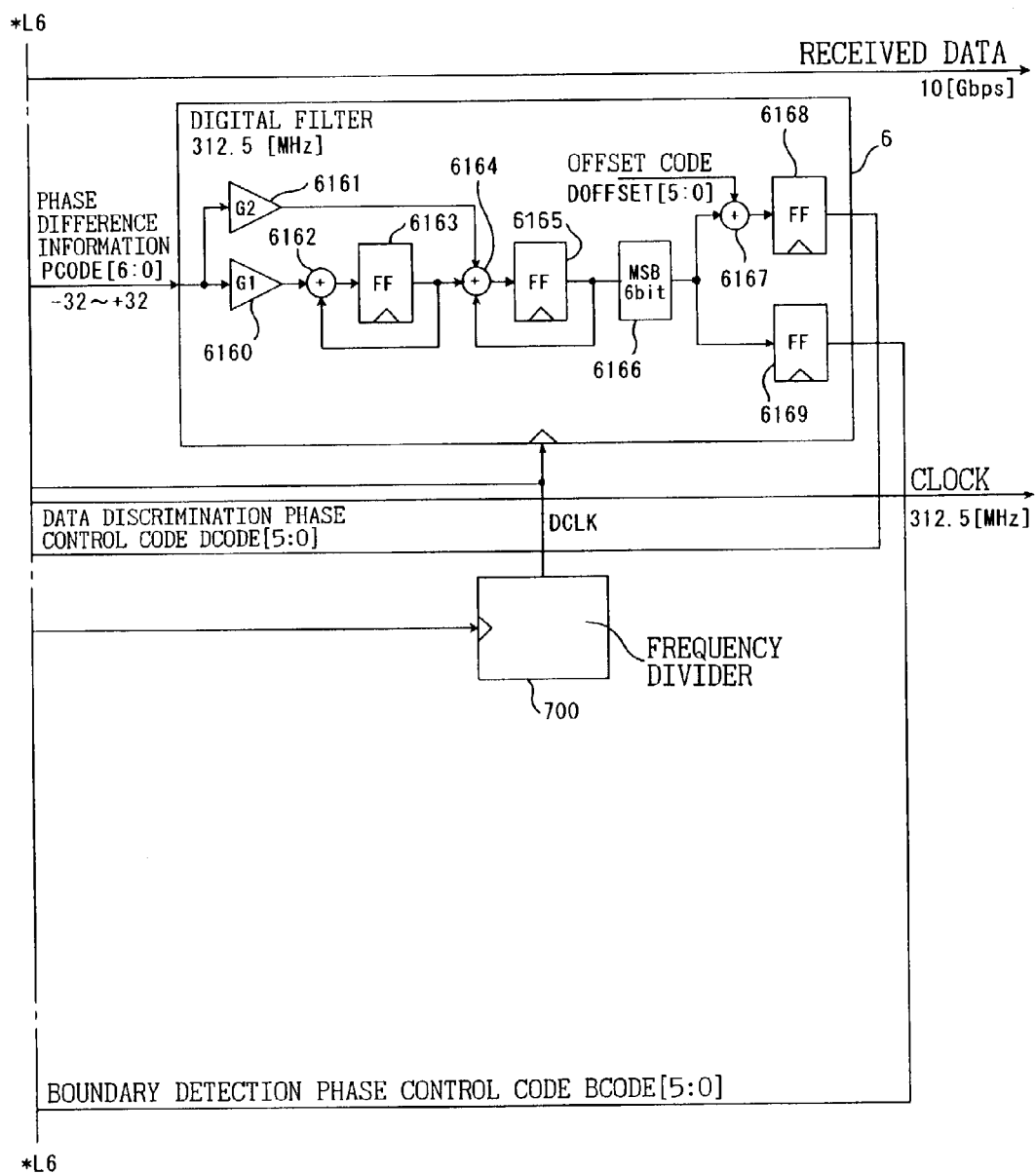

FIGS. 48A and 48B are block diagrams showing a fifth embodiment of the data receiving circuit according to the second mode of the present invention.

As is apparent from a comparison between FIGS. 48A, 48B and FIGS. 26A, 26B, the data receiving circuit of the fifth embodiment according to the second mode of the invention differs from the prior art data receiving circuit shown in FIGS. 26A and 26B in that, instead of the 312.5-MHz internal reference clock RCLK generated in the conversion circuit 131, the output of a frequency divider 700 that receives the 2.5-GHz clock Ref-CLK and divides it (by a factor of 8) is supplied as the clock to the digital filter 106 (6) and the phase-difference/digital-code conversion circuit 105 (5).

That is, in the data receiving circuit of the fifth embodiment according to the second mode of the invention, a clock (divided clock DCLK: fixed clock derived from the system reference clock) derived by dividing the reference clock (clock Ref-CLK) of the phase interpolator, not the recovered clock (internal reference clock RCLK) itself, is supplied to operate the phase-difference/digital-code conversion circuit 5 and the digital filter 6. Since this divided clock DCLK is slightly different in frequency from the recovered clock (internal reference clock RCLK), when the outputs of the data discrimination circuit (the data discrimination units 10 to 13) and the boundary detection circuit (the boundary detection units 20 to 23) are supplied to the digital circuit (digital filter 6), a data loss or duplication may occur once in a few hundred to tens of thousands of cycles. However, a certain degree of error does not present any problem, since the phase-difference/digital-code conversion circuit 5 and the digital filter 6 and only for generating the data discrimination phase control code DCODE [5:0] and the boundary detection phase control code BCODE [5:0], not for transferring data where errors are unacceptable (for example, the output DT [31:0] of the conversion circuit 31).

In this way, according to the fifth embodiment of the second mode of the present invention, since the digital filter 6 is operated with the fixed divided clock DCLK derived by dividing the reference clock, stable operation can be achieved even when the recovered clock (internal reference clock RCLK) is not stable during power on, etc. Another advantage is that simulation can be performed easily, for example, when designing the system, because the digital filter 6 can be operated with the fixed divided clock DCLK.

As described in detail above, according to the second mode of the present invention, a data receiving circuit (clock recovery circuit) can be provided which can achieve a high cutoff frequency while maintaining the stability of the loop by reducing the signal delay through the feedback loop that determines the cutoff frequency of the loop. Furthermore, according to the second mode of the present invention, a data receiving circuit (clock recovery circuit) can be provided which is capable of stable operation even when the recovered clock is not stable during power on, etc. and for which a simulation can be performed easily.

Many different embodiments of the present invention may be constructed without departing from the spirit and scope of the present invention, and it should be understood that the present invention is not limited to the specific embodiments described in this specification, except as defined in the appended claims.

What is claimed is:

1. A clock recovery circuit which includes a boundary detection circuit detecting a boundary in an input signal in accordance with a first signal, and which performs recovery of a clock by controlling the timing of said first signal in accordance with said detected boundary, comprising:
    a boundary detection timing varying circuit dynamically varying boundary detection timing in said boundary detection circuit by applying a variation to said first signal; and
    a variation reducing circuit reducing a phase variation occurring in the recovered clock in accordance with the dynamic variation of said boundary detection timing performed by said boundary detection timing varying circuit, wherein said boundary detection timing varying circuit comprises:
   a variation generating circuit generating said variation; and
   an adder circuit adding said variation generated by said variation generating circuit to said first signal,
        wherein said variation generating circuit generates a triangular wave-like variation changing by increasing or decreasing in staircase fashion over one period of said variation.

2. The clock recovery circuit as claimed in claim 1, wherein said variation generating circuit generates a variation over a wide phase range when in an unstable state, and generates a variation over a narrow phase range when in a stable state.

3. The clock recovery circuit as claimed in claim 1, wherein said variation generating circuit generates a variation of large gain when in an unstable state, and generates a variation of small gain when in a stable state.

4. The clock recovery circuit as claimed in claim 1, wherein said variation generating circuit generates a variation with increased per-step unit time when in an unstable state, and generates a variation with reduced per-step unit time when in a stable state.

5. The clock recovery circuit as claimed in claim 1, wherein said variation generating circuit generates a zigzag wave-like variation changing by increasing and decreasing a plurality of times within one period of said variation.

6. The clock recovery circuit as claimed in claim 5, wherein said variation generating circuit generates a variation over a wide phase range when in an unstable state, and generates a variation over a narrow phase range when in a stable state.

7. The clock recovery circuit as claimed in claim 5, wherein said variation generating circuit generates a variation of large gain when in an unstable state, and generates a variation of small gain when in a stable state.

8. The clock recovery circuit as claimed in claim 5, wherein said variation generating circuit generates a variation with increased per-step unit time when in an unstable state, and generates a variation with reduced per-step unit time when in a stable state.

9. The clock recovery circuit as claimed in claim 1, wherein said variation reducing circuit averages signals relevant to said recovered clock over one period or a plurality of periods of said variation being output from said variation generating circuit.

10. The clock recovery circuit as claimed in claim 9, wherein said variation reducing circuit is a notch filter, an FIR filter, or a moving average circuit.

11. The clock recovery circuit as claimed in claim 1, wherein said first signal includes a plurality of boundary detection clocks, said boundary detection circuit comprises a plurality of boundary detection units, and each of said boundary detection units detects a boundary in said input signal in accordance with each of said boundary detection clocks.

12. A clock recovery circuit which includes an internal clock generating circuit generating an internal clock by receiving a first phase control code of a first bit count, comprising:

a phase control code generating circuit generating a second phase control code of a second bit count which is larger than said first bit count; and an addition processing circuit adding a temporally varying prescribed variation pattern to said second phase control code, and thereby outputting a signal corresponding to said first bit count, wherein said internal clock generating circuit generates the internal clock whose phase is controlled with a resolution equivalent to a resolution of said second bit count;

wherein said addition processing circuit adds a periodic variation pattern of "0→1→2→3→0→ . . . " to an 8-bit resolution phase control code supplied from said phase control code generating circuit.

13. The clock recovery circuit as claimed in claim 12, wherein said addition processing circuit adds a periodic variation pattern of "0→3→1→2→0→ . . . " to an 8-bit resolution phase control code supplied from said phase control code generating circuit.

14. The clock recovery circuit as claimed in claim 12, wherein a plurality of data discrimination clocks are generated in accordance with said first phase control code, said internal clock generating circuit comprises a plurality of data discrimination units, and each of said data discrimination units discriminates data in accordance with each of said data discrimination clocks.

15. A clock recovery circuit which includes a boundary detection circuit detecting a boundary in an input signal in accordance with a first signal, and which performs recovery of a clock by controlling the timing of said first signal in accordance with said detected boundary, wherein:

said clock is recovered by using a plurality of feedback loops having different signal delays, and said plurality of feedback loops comprise:

a first feedback loop having a first signal delay; and a second feedback loop having a second signal delay smaller than said first signal delay, and wherein:

said clock is recovered by making a phase adjustment based on the sum of outputs of said first and second feedback loops, wherein said clock is a data discrimination clock to be supplied to a data discrimination circuit for discriminating data in said input signal, and wherein a circuit generating said first signal and a circuit generating said data discrimination clock are phase interpolators.

16. The clock recovery circuit as claimed in claim 15, wherein said first feedback loop comprises a conversion circuit which converts an output of said data discrimination circuit from serial format into parallel format for output as received data, and said second feedback loop bypasses said conversion circuit and thereby provides a shorter signal delay than said first feedback loop.

17. The clock recovery circuit as claimed in claim 15, wherein said first signal delay is larger than said second signal delay, and said second feedback loop has a higher cutoff frequency than said first feedback loop.

18. The clock recovery circuit as claimed in claim 15, wherein said first feedback loop includes a first buffer which provides a first gain coefficient, and said second feedback loop includes a second buffer which provides a second gain coefficient that is different from said first gain coefficient.

19. The clock recovery circuit as claimed in claim 18, wherein said first signal delay is larger than said second signal delay, and said first gain coefficient is smaller than said second gain coefficient.

20. The clock recovery circuit as claimed in claim 15, wherein the sum of the outputs of said first and second feedback loops is obtained by adding digital codes.

21. The clock recovery circuit as claimed in claim 15, wherein the sum of the outputs of said first and second feedback loops is obtained by adding analog signals.

22. The clock recovery circuit as claimed in claim 21, wherein the addition of said analog signals is the addition of electric currents.

\* \* \* \* \*